(12) United States Patent
Stowell et al.

(10) Patent No.: US 11,107,662 B2
(45) Date of Patent: Aug. 31, 2021

(54) REACTOR SYSTEM COUPLED TO AN ENERGY EMITTER CONTROL CIRCUIT

(71) Applicant: Lyten, Inc., Sunnyvale, CA (US)

(72) Inventors: Michael W. Stowell, Sunnyvale, CA (US); Tung Van Pham, San Jose, CA (US); Bryce H. Anzelmo, Mountain View, CA (US); Thomas Riso, Elizabeth, CO (US)

(73) Assignee: LytEn, Inc., San Jose, CA (US)

( * ) Notice: Subject to any disclaimer, the term of this patent is extended or adjusted under 35 U.S.C. 154(b) by 0 days.

(21) Appl. No.: 17/039,736

(22) Filed: Sep. 30, 2020

(65) Prior Publication Data

US 2021/0057191 A1   Feb. 25, 2021

Related U.S. Application Data

(63) Continuation-in-part of application No. 16/544,656, filed on Aug. 19, 2019, now Pat. No. 10,812,020, and a continuation-in-part of application No. 17/008,188, filed on Aug. 31, 2020.

(51) Int. Cl.
| | |
|---|---|
| *H01J 37/32* | (2006.01) |
| *C01B 32/205* | (2017.01) |
| *C01B 32/184* | (2017.01) |
| *B01J 19/12* | (2006.01) |

(52) U.S. Cl.
CPC ....... *H01J 37/32266* (2013.01); *B01J 19/126* (2013.01); *C01B 32/184* (2017.08); *C01B 32/205* (2017.08); *H01J 37/3277* (2013.01); *H01J 37/32201* (2013.01); *H01J 37/32229* (2013.01); *H01J 37/32743* (2013.01); *H01J 37/32788* (2013.01); *B01J 2219/0801* (2013.01); *B01J 2219/0875* (2013.01); *B01J 2219/0894* (2013.01); *B01J 2219/1206* (2013.01); *H01J 2237/33* (2013.01)

(58) Field of Classification Search
CPC ... H03B 9/10; H03K 3/57; H03K 3/78; H03K 17/082; H03C 5/04; H03L 5/02; H01J 37/32201; H01J 25/50
See application file for complete search history.

(56) References Cited

U.S. PATENT DOCUMENTS

| | | | |
|---|---|---|---|
| 5,307,079 A * | 4/1994 | Ross | H01Q 9/28 343/821 |
| 2016/0073453 A1* | 3/2016 | Hyde | H05B 6/645 219/745 |
| 2016/0233100 A1* | 8/2016 | Godet | H01L 21/0337 |

* cited by examiner

*Primary Examiner* — Don P Le
(74) *Attorney, Agent, or Firm* — Paradice & Li LLP

(57) ABSTRACT

A microwave energy source that generates a microwave energy is disclosed. The microwave energy source has an on-state and an off-state. A control circuit is coupled to the microwave energy source and includes an output to generate a control signal that adjusts a pulse frequency of the microwave energy. A voltage generator applies a non-zero voltage to the microwave energy source during the off-state. A frequency and a duty cycle of the non-zero voltage is based on a frequency and a duty cycle of the control signal. A waveguide is coupled to the microwave energy source. The waveguide has a supply gas inlet that receives a supply gas, a reaction zone that generates a plasma, a process inlet that injects a raw material into the reaction zone, and an outlet that outputs a powder based on a mixture of the supply gas and the raw material within the plasma.

24 Claims, 31 Drawing Sheets

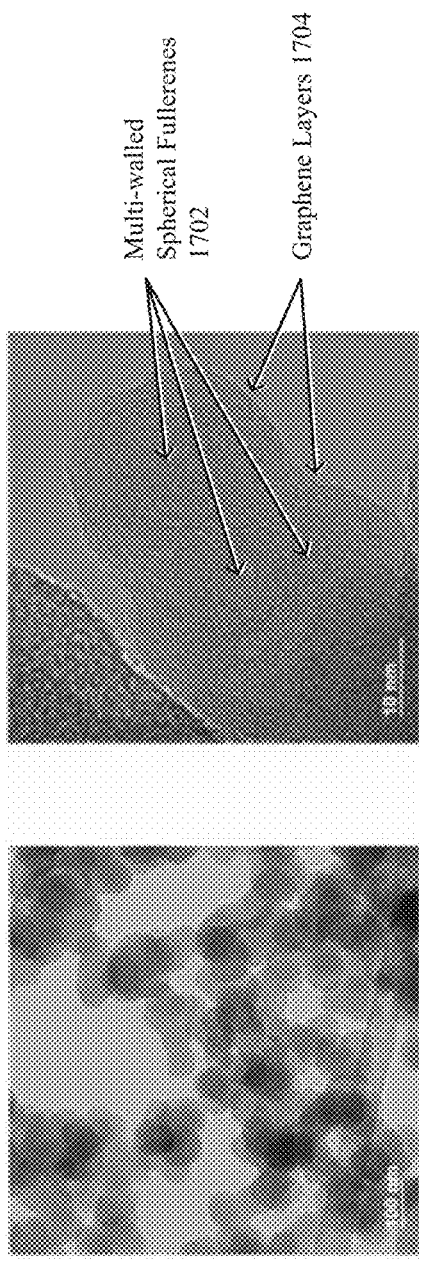
*Figure 17A*
*Figure 17B*
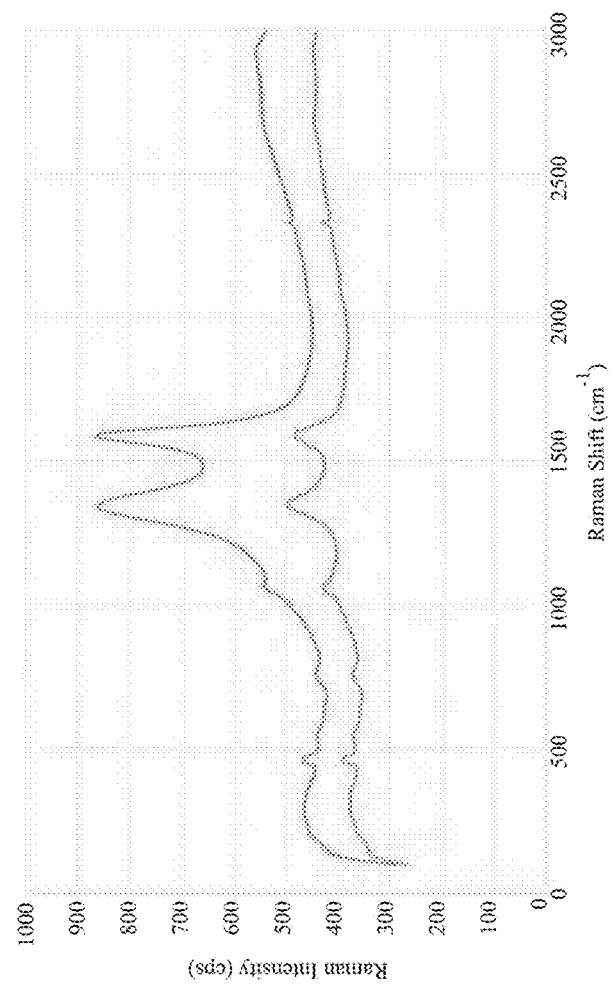
*Figure 17C*

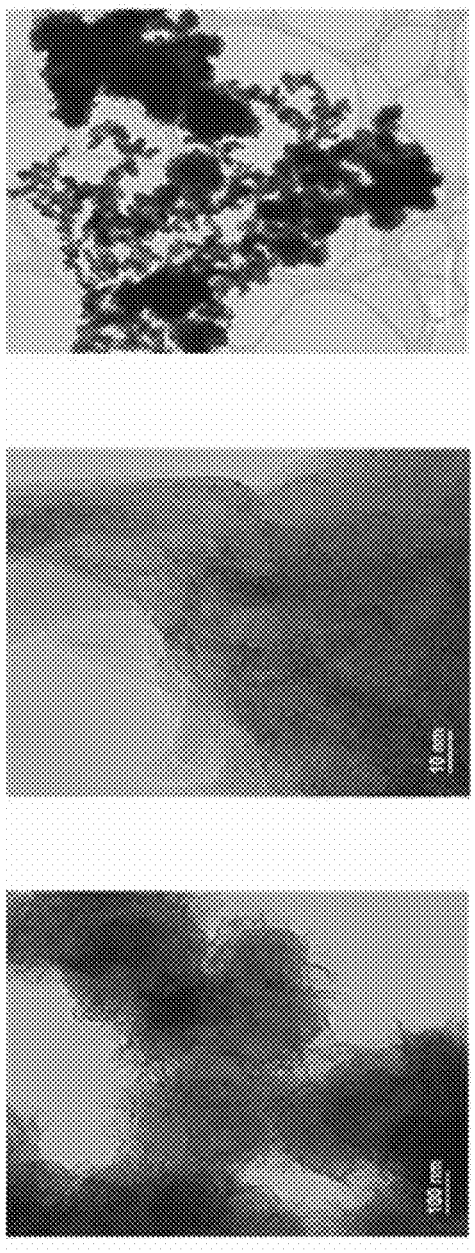
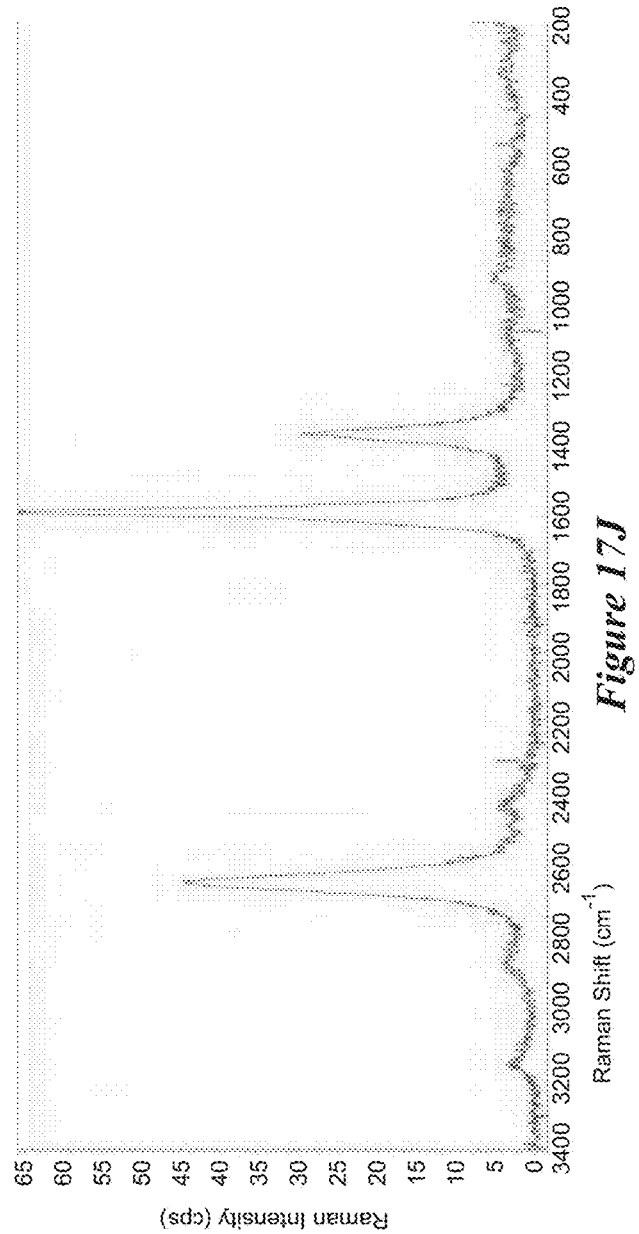
*Figure 17G*
*Figure 17H*
*Figure 17I*
*Figure 17J*

REACTOR SYSTEM COUPLED TO AN ENERGY EMITTER CONTROL CIRCUIT

CROSS-REFERENCE TO RELATED APPLICATIONS

This application is a continuation-in-part of and claims priority to U.S. patent application Ser. No. 16/544,656 entitled "ENERGY EMITTER CONTROL CIRCUIT" filed on Aug. 19, 2019 and to U.S. patent application Ser. No. 17/008,188 entitled "TEMPERATURE-CONTROLLED CHEMICAL PROCESSING REACTOR" filed on Aug. 31, 2020, both of which are assigned to the assignee hereof. The disclosures of both prior Applications are considered part of and are incorporated by reference in this patent Application in their respective entireties.

TECHNICAL FIELD

This disclosure relates generally to a reactor for producing carbon particles, and, more particularly, to a reactor coupled to a circuit configured to propagate microwave energy at a defined pulse frequency or duty cycle into the reactor for outputting the carbon particles.

DESCRIPTION OF RELATED ART

Microwave emission devices such as magnetrons or klystrons, for example, can be configured to out electromagnetic (EM) radiation in the form of microwave energy. To carefully control output power levels of output microwave energy, integrated circuits can be coupled to such microwave emission devices to control the microwave energy source to output microwave energy in discrete pulses having various frequencies and duty cycles. Such a circuit can be designed for a specific range of pulsing frequency, duty cycle, shape, and output power level; however, challenges encountered in traditional microwave emission device and reactor design and effectively limit overall operating range. Observed rise and fall times of pulsing signals can be examples limitations observed, given that a relatively slow rise or fall time can possibly negatively impact a rate at which a signal can be switched. And power that a circuit can deliver to a magnetron can also affect the output power level of the magnetron. Careful control and consideration of optimization of circuit design and integration with various reactor design can offer benefits regarding reactor product output.

SUMMARY

The systems, methods, and devices of this disclosure each have several innovative aspects, no single one of which is solely responsible for the desirable attributes disclosed herein.

One innovative aspect of the subject matter described in this disclosure can be implemented in a reactor system including a microwave energy source configured to generate a microwave energy. The microwave energy source has an on-state and an off-state. A control circuit is coupled to the microwave energy source and including an output to generate a control signal configured to at least partially adjust a pulse frequency of the microwave energy. A voltage generator is configured to apply a non-zero voltage to the microwave energy source during the off-state, wherein a frequency and a duty cycle of the non-zero voltage is based on a frequency and a duty cycle of the control signal. A field-enhancing waveguide (FEWG) is coupled to the microwave energy source and including a field-enhancing zone having a cross-sectional area that decreases along a length of the FEWG. The field-enhancing zone includes a supply gas inlet configured to receive a supply gas, a reaction zone configured to generate a plasma in response to excitation of the supply gas by the microwave energy, a process inlet configured to inject a raw material into the reaction zone, and an outlet configured to output a carbon-containing powder based on a mixture of the supply gas and portions of the raw material within the plasma.

In some implementations, the reactor system can include a collector configured to collect the carbon-containing powder. The field-enhancing zone can be configured to concentrate the microwave energy. The reaction zone can be configured to self-ignite the plasma in response to excitation of the supply gas by the concentrated microwave energy. One or more of a physical property or a chemical property of the carbon-containing powder can be based at least in part on the pulse frequency. In some aspects, the non-zero voltage can have a rise time within a range of between approximately 20 nanoseconds and 50 nanoseconds and the non-zero voltage can have a fall time within a range of between approximately 20 nanoseconds and about 50 nanoseconds.

In some implementations, the pulse frequency of the microwave energy can be further based at least in part on the non-zero voltage. The control circuit can also include a filament configured to adjust a dissociation of the supply gas. A power level of the microwave energy can be based at least in part on the non-zero voltage. The microwave energy source includes any one or more of a magnetron, a klystron, or a traveling wave tube amplifier (TWTA). The control circuit can include a pulsing switch including a first bi-polar active switch and a second bi-polar active switch coupled in series between a voltage supply and ground potential. In some aspects, the supply gas can include a hydrocarbon. The carbon-containing powder can include any one or more of carbonaceous particles, colloidal dispersions, or a plurality of solid particles.

In some implementations, the reactor system can include a gas/solid separator configured to separate gas-phase materials and solid-phase materials from the carbon-containing powder. The FEWG can be configured to generate one or more condition measurements of the microwave energy source. The carbon-containing powder can include a plurality of graphene platelets. The FEWG can be configured to fuse the plurality of graphene platelets to each other at substantially orthogonal angles. The FEWG is configured to adjust a length of the plasma generated within the FEWG by selectively flowing the supply gas into the reaction zone. The reaction zone can be configured to contain the mixture at a pressure of approximately 1 atm. In some aspects, the reactor system can include a temperature control unit configured to control a temperature within the FEWG.

Another innovative aspect of the subject matter described in this disclosure can be implemented as a method, which can include generating a microwave energy from a microwave energy source, generating a control signal configured to adjust a pulse frequency of the microwave energy control the microwave energy source, applying a non-zero voltage to the microwave energy source during an off-state of the microwave energy source, the non-zero voltage configured to adjust a frequency and a duty cycle of the control signal, generating a plasma in response to excitation of a supply gas by the microwave energy, injecting a raw material into the plasma, forming a mixture based on a combination of the supply gas and portions of the raw material within the plasma, and outputting a carbon-containing powder based on an excitation of the mixture by the microwave energy. In some aspects, the method can include pulsing the non-zero voltage, the pulsed non-zero voltage having a rise time between approximately 20 nanoseconds and 50 nanoseconds.

Another innovative aspect of the subject matter described in this disclosure can be implemented as a method, which can include controlling a temperature and a pressure of any one or more of a hydrocarbon species and a raw material, generating a microwave energy by a microwave energy source, which includes an output to generate a control signal, igniting a plasma by exciting the hydrocarbon species by the propagated microwave energy, cracking the hydrocarbon species within the plasma into a plurality of smaller carbon-containing species based on the propagated microwave energy, and producing the carbon-containing powder based on a mixture of the plurality of smaller carbon-containing species and the raw material. In some aspects, the method can include conducting one or more post-processing operations on any one or more of the smaller carbon-containing species.

Details of one or more implementations of the subject matter described in this disclosure are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1A:
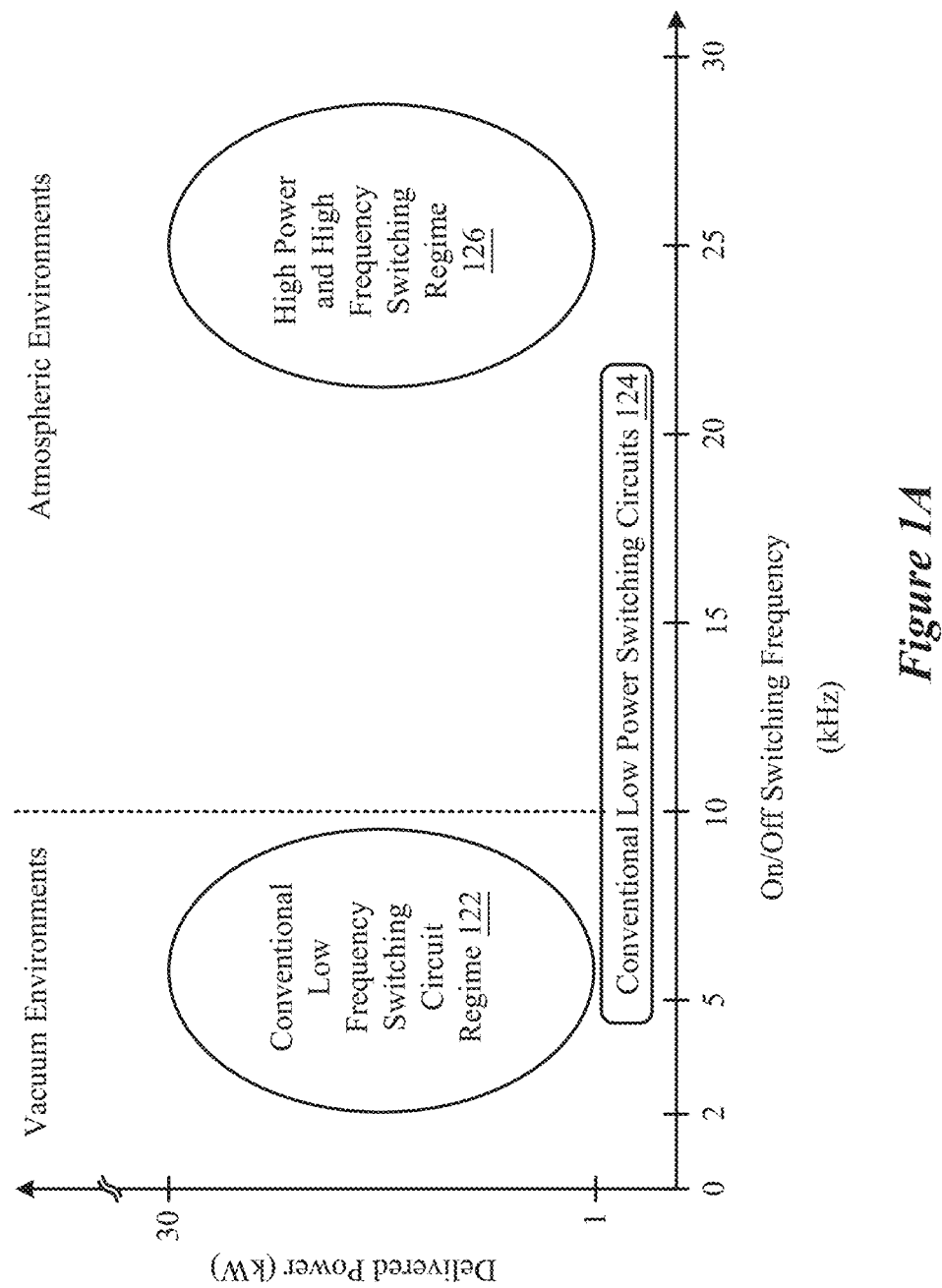
FIG. 1A depicts various domains where control circuit (such as filament) power can be switched over ranges of delivered power and/or ranges of switching frequencies, according to some implementations.

Reference now will be made to implementations of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Embodiments of the present systems and methods can be used for controlling, such as with a circuit, a microwave energy source to provide pulsed microwave energy for generating carbon-inclusive particles from raw materials using microwave plasma chemical processing techniques disclosed herein. In some implementations, the raw materials can be gases, liquids, or colloidal dispersions. In some other implementations, the raw materials can be or include any one or more of carbonaceous particles, colloidal dispersions, or a plurality of solid particles. In some aspects, the raw materials can be processed into separated components in a reaction zone of a waveguide. In some implementations, the waveguide can be a field-enhancing waveguide that not only allows relatively large quantities of raw materials to be processed, but also serves as a reaction chamber within which a plasma (also referred to as a plasma environment) can be created or generated in response to excitation of the supply gas by the microwave energy.

This is in contrast to conventional systems that may not provide pulsed microwave energy controlled by a circuit and/or use a quartz chamber separate and distinct from the waveguide to concentrate the pulsed microwave energy to excite a mixture of the carbon-containing supply gas and raw materials within the plasma environment. In conventional systems, particulate build-up on the quartz chamber walls can impede the penetration of microwave energy through the quartz chamber walls, thereby reducing the efficiency with which such conventional systems can process raw materials. More specifically, a circuit can be coupled to a microwave energy source, where the circuit can generate a pulsed voltage output, which can control a microwave energy source. For example, the pulsed voltage output can cause the microwave energy source to generate a pulsed microwave energy, which can be propagated along a tapered waveguide where it is concentrated proportionate to the degree of tapering. The waveguide also serves as a reaction chamber where input carbon-containing supply gases (such as methane, $CH_4$) can be combined with additional raw materials, such as silicon or other metals, and excited upon exposure to the concentrated and pulsed microwave energy, which also causes some of the supply gas to ignite and generate a plasma. A mixture of the supply gases and the raw materials are excited by the concentrated and pulsed microwave energy within the plasma environment. As a result, the efficiency with which reactor systems disclosed herein can process the mixture of supply gas and raw materials within the plasma to output a carbon-containing powder, is enhanced. Moreover, the waveguide itself is not necessarily susceptible to particulate build-up on interior-facing surfaces of its chamber walls, which is just one example of the advantages realized by various aspects of the subject matter disclosed herein.

As used herein, the term "field-enhancing waveguide" (FEWG) refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The second cross-sectional area of the FEWG extends along a reaction length that forms the reaction zone of the FEWG. There is a field-enhancing zone between the first cross-sectional area and the second cross-sectional area of a FEWG. In some aspects, the field-enhancing zone can change cross-sectional area in a continuous manner (such as linearly or non-linearly) or an abrupt manner (such as through one or more discrete steps). In some aspects, the pressure within the FEWGs are from 0.1 atm to 10 atm, or from 0.5 atm to 10 atm, or from 0.9 atm to 10 atm, or greater than 0.1 atm, or greater than 0.5 atm, or greater than 0.9 atm.

The microwave plasma chemical processing reactors of the present disclosure can include or can be associated with one or more supply gas inlets into which a supply gas is flowed and one or more process inlets into which the input material is flowed. The supply gas and process inlets are located in or upstream of the reaction zone, and the supply gas is used to generate a plasma in the reaction zone. The supply gas flows can be from 1 slm (standard liters per minute) to 1000 slm, or from 2 slm to 1000 slm, or from 5 slm to 1000 slm, or greater than 1 slm, or greater than 2 slm, or greater than 5 slm. The process material is a gas, and the flow rates are from 1 slm (standard liters per minute) to 1000 slm, or from 2 slm to 1000 slm, or from 5 slm to 1000 slm, or greater than 1 slm, or greater than 2 slm, or greater than 5 slm. The process material is a liquid, or a colloidal dispersion and the flow rates are from less than 1% to greater than 100% of the supply gas flow.

The microwave plasma chemical processing reactors of the present disclosure can have a single microwave energy generator, which is a source of microwave energy coupled to one or more than one FEWG. Disclosed reactors can have more than one microwave energy generator, coupled to more than one FEWG. The microwave energy is continuous wave or pulsed. The microwave energy generator power is from 1 kW to 100 kW. Disclosed reactors can have more than one reaction zone, which are connected together and have one or more than one outlet from which to collect the separated components. Disclosed reactors can contain multiple FEWGs with different geometries including manifold arrangements, and network arrangements. These geometries will be described more fully herein.

Disclosed reactors of the present disclosure have reaction zones with walls, and the supply gas and process inlets provide the supply gas (for creating the microwave plasma) and input material to the reaction zone through the walls. There can be a plurality of supply gas and process inlets that provide the supply gas and input material to the reaction zone through the walls in controlled mass fractions. Providing the supply gas and input material to the reaction zone through the walls in controlled mass fractions can mitigate the deposition of the separated components on the reaction zone walls.

Microwave plasma chemical processing of hydrocarbon gases can use various techniques including pulsing of the microwave energy to control the energy of the plasma. The ability to control the energy of the plasma enables the selection of one or more reaction pathways in conversion of the hydrocarbon gases into specific separated components. Pulsed microwave energy can be used to control the energy of the plasma because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high gas flows and high pressures.

Microwave plasma chemical processing systems using pulsed microwave energy have been developed that control the energy of the plasma and have very high cracking efficiency, in excess of 90%. These conventional systems, however, use low flow rates, below 1 standard liter per minute (slm), and small gas volumes within the plasma, with a consequence that the production rate is low, and the production cost is high. These conventional systems cannot increase the gas flow rate and the gas volume within the plasma while using high frequency microwave pulsing (such as above roughly 100 Hz) because the plasma cannot ignite fast enough to keep up with the pulses when a large volume and high flow of gas is used.

Energy Emitter Control Circuit

Microwave producing magnetrons provide utility across various applications. Generally, a magnetron generates a tuned microwave signal by guiding electrons that emitted from a filament upon excitation from a direct current. The electrons are guided using a magnetic "B"-field that causes the emitted electrons to swirl over cavities in a magnetron ring. As the electrons swirl over the openings in the cavities, a microwave signal can be emitted. The frequency of the microwave signal can be tuned over a range by varying the shape and size as well as positioning and the orientation of cavities within the magnetron.

As such, emitted microwave signal can be tuned (such as tuned for a power level, tuned for frequency, or tuned for signal shape) to accommodate applications in many different fields. For example, an emitted microwave signal tuned to the resonant frequency of a water molecule can be used to heat water that is in food placed into a microwave oven. In a microwave oven application, the energy in the microwave signal is used for heating foods or beverages, and the power dissipated by heating the water is in the range of a few hundred watts. Controlled heating of foods is accomplished by pulsing the microwave energy of the microwave signal. This pulsing facilitates slow and even heating (such as without drying out or burning the food) by, for example: (1) for a first controlled duration, turning on the direct current to the magnetron so as to apply energy to the food; then (2) for a second controlled duration, turning off the direct current to the magnetron to allow the food to absorb (such as distribute) the energy through molecular vibration and rotation, thus transferring heat into the food being heated.

Microwave magnetrons are used in many other applications, some of which demand higher power and higher turn-on/turn-off rates. In some cases, these other applications demand very high power and very high turn-on/turn-off rates. When using a microwave magnetron to apply energy to a sample of a material to be annealed, the magnetron power needed to heat up the sample in a reasonable amount of time (such as a few minutes or less) can be much higher (such as in the range of thousands of watts) than for heating food, and the turn-on/turn-off rate is much faster (such as in the 10 KHz to 25 KHz range).

In an example, when microwave magnetrons are used to generate plasma in a microwave plasma reactor, the energy needed to dissociate a process gas into ions is even higher (such as in the range of tens of thousands of watts) than for annealing materials, and the turn-on/turn-off rate needed to control the electron temperature is even faster (such as in the 25 KHz to 100 KHz range), depending on various factors. Generating a stable plasma plume of dissociated constituents of a process gas is very sensitive to the turn-on/turn-off rate and duty cycle. Moreover, generating a stable plasma plume in a process gas reactor is further complicated by the need to perform the dissociation in atmospheric (such as low cost) environments.

Unfortunately, power supplies that can deliver tens of thousands of watts of power do not quickly switch from "on" to "off" (or "off" to "on"). This inability to quickly switch from a high power "on" state to a low or zero power "off" limits the ability to finely tune or control the microwave signal. In turn, the inability to control the microwave signal limits the ability to control annealing and/or limits the ability to control the dynamics of dissociation of the process gas. What is needed are techniques for controlling high power current to a filament such that that the high power and high frequency switching capability that is needed for controlling annealing processes and/or for controlling the dynamics of dissociation of the process gas can be achieved. Note that although embodiments of electronic control circuits shall be described for use with microwave energy sources, the electronic circuits may be used with other frequencies, such as magnetron tubes of any frequency.

FIG. 1A presents various regimes where filament power is switched on and off over wide ranges of power and where filament power is switched over wide ranges of switching frequencies. The abscissa of the graph covers a switching frequency range from about 2 KHz to about 30 KHz. The ordinate of the graph covers a range from a few watts to over 30 KWatts. Further, a vacuum environment regime and an atmospheric environment regime are superimposed respectively onto the left side and the right side of the graph. Determining the regime for carrying out processes (such as choosing either the vacuum environment or the atmospheric environment) is based on the specific process or application. For example, the vacuum environment may be preferred for gas dissociation, for materials annealing, for materials deposition, for etching and for various functionalization purposes, whereas for generating a plasma or plasma radical, or for pyrolyzing, or for sintering, of for annealing, the atmospheric regime may be preferred.

As can be seen, the conventional low frequency switching circuit regime 122 extends only to about 10 KHz, and only in the vacuum regime. Also, as can be seen, the shown conventional low power switching circuits 124 extends only to about 20 KHz, whereas the high power and high frequency switching regime 126 covers a switching range from about 20 KHz and above. As indicated hereinabove, what is needed is a way to control a high power current to a filament such that that the high power and high frequency switching capability used for controlling annealing and/or for controlling the dynamics of dissociation of the process gas can be achieved.

A microwave signal generation apparatus generally includes a magnetron or klystron, or traveling wave guide, or another microwave energy source. Electronic circuits control delivery of electrical power (such as direct current) to the microwave signal generation apparatus. Such electronic circuitry can be configured into two components: (1) a component to control high voltage electric power, and (2) a component to control pulsed delivery of electric power to a filament.

Figure 1B:
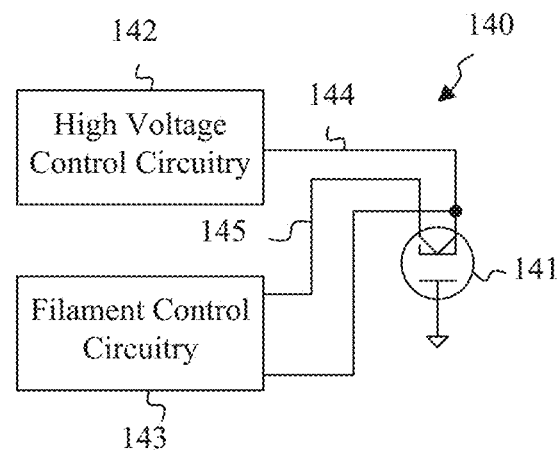
FIG. 1B shows a simplified schematic diagram of an example circuit (such as a microwave emitter control circuit), according to some implementations.

As shown in FIG. 1B, a microwave emitter control circuit 140, in accordance with some embodiments, includes a magnetron or klystron, traveling wave guide, or other microwave energy source 141, high voltage control circuitry 142, and a filament control circuit 143, among other potential circuit components not shown for simplicity. The microwave emitter control circuit 140 is a relatively low-cost, low-complexity design that enables relatively fast rise and fall times for pulsing the microwave energy source 141 with a relatively broad range for the output power level. Furthermore, the microwave emitter control circuit 140 provides fine control of pulsing frequency as well as pulsing duty cycle for the pulsed microwave radiation generated by microwave energy source. The high voltage control circuitry 142 generally includes high voltage power electronics for generating a high voltage (a high voltage generator) and a pulsing switch (as described below with reference to FIG. 5) for generating a pulsed high voltage output 144 from the generated high voltage. The filament control circuit 143 generally includes a filament isolation transformer and an optional filament controller (as described below with reference to FIG. 5) for generating a filament current at 145. The pulsed high voltage output 144 is applied to high voltage components of the microwave energy source 141, and the filament current at 145 is applied to a filament of the microwave energy source 141; thereby causing the microwave energy source 141 to generate or emit microwave radiation (such as at about 915 MHz, or at or about 2.45 GHz or at or about 5.8 GHz). Additionally, the pulsing nature of the pulsed high voltage output 144 pulses or switches the microwave energy source 141 on and off, or between a high power level and a low power level; thereby causing the microwave energy source 141 to intermittently generate or emit the microwave radiation as it is pulsed on and off.

The on/off pulsing of the microwave energy source 141 (and thus of the emitted microwave radiation) is done at an operating power level, pulsing frequency, and pulsing duty cycle that generally depend on the particular application of the microwave emitter control circuit 140. Additionally, the on/off pulsing of the microwave energy source 141 (and thus of the emitted microwave radiation) is done with relatively fast rise and fall times that enable a relatively wide variety of combinations of different ranges for the operating power level, pulsing frequency, and pulsing duty cycle, which thus enable the use of the microwave emitter control circuit 140 in a variety of different applications (such as for generating a plasma or plasma radical, or for pyrolyzing, sintering, or annealing and/or the like) and/or that pertain to various types of materials. The rise and fall times can be slowed, tuned, or adjusted for specific applications with a rise time adjustment network circuit at the output of the high voltage control circuitry 142, as described below with respect to FIG. 6.

In general, the microwave emitter control circuit 140 enables a microwave radiation power level of about 100 watts to 250 kilowatts or from 250 kilowatts to about 500 kilowatts, or from about 500 kilowatts to 1 megawatt, a pulsing frequency of about 5 Hz to 100 kHz, and a pulsing duty cycle of about 5%-100%. More specific operating parameters generally depend on the particular application in which the microwave emitter control circuit 140 is being used. A non-limiting list of such applications may include pyrolizing, cracking or converting of various types of gases or molecules, annealing of various types of materials, sintering of various types of materials, formation of nano-diamonds, formation of carbon nano-onions, and plasma-based material synthesis, etc. The specific operating parameters also generally depend on the type of magnetron, klystron, traveling wave guide, or other microwave generating or other microwave energy source that the microwave emitter control circuit 140 controls.

Figure 2:
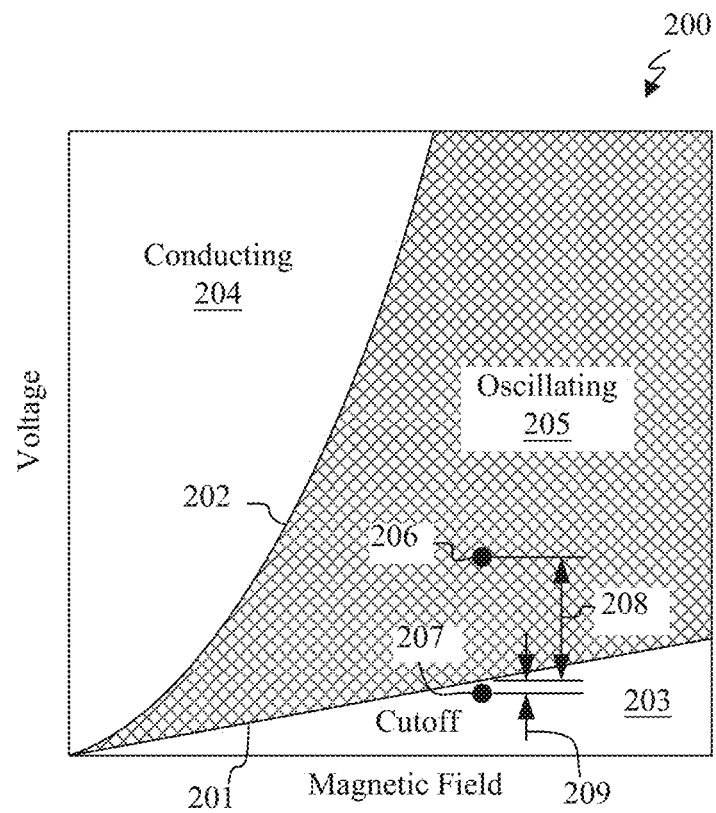
FIG. 2 shows a simplified graph of operating voltage compared against a magnetic field generated by a magnetron, according to some implementations.

FIG. 2 shows a generalized characteristic graph 200 of the operating voltage versus magnetic field and its correspondence to electron cloud behavior for a typical magnetron. The characteristic graph 200 may illustrate how the microwave emitter control circuit 140 of FIG. 1B is capable of achieving the operating parameter ranges mentioned above. A lower line represents a "Hartree curve" 201, and an upper line represents a "Hull cutoff curve" 202. These characteristic curves 201 and 202 have different values for different magnetrons, so absolute values for units are not shown. However, an operating mode of any given magnetron broadly depends on the general position of the magnetron's operating voltage and magnetic field relative to the characteristic curves 201 and 202. For example, below the Hartree curve 201, the magnetron is generally in the cutoff region 203, wherein the magnetron is neither conducting nor oscillating, so it is not generating microwave radiation in the cutoff region 203. Above or to the left of the Hull cutoff curve 202, the magnetron is generally in the conducting region or mode 204, wherein current is flowing through the magnetron, but it is not oscillating, so it is not generating microwave radiation in this region 204. Between the Hartree curve 201 and the Hull cutoff curve 202, the magnetron is generally in the oscillating region 205, wherein the magnetron has current flow and is oscillating, so it is generating microwave radiation in this oscillating region 205, which is also referred to as the Hartree region. At different operating locations or points within the oscillating region 205, the magnetron generally operates with different power outputs and/or different efficiencies. For example, at an operating point within the oscillating region 205, but close to the Hartree curve 201, the magnetron is oscillating, but barely generating any microwave radiation. Further into the middle of the oscillating region 205, on the other hand, the magnetron generally produces appreciable levels of microwave radiation, depending on the overall operating power level.

The microwave emitter control circuit 140 of FIG. 1B operates in a manner such that the on/off cycling or pulsing of the microwave energy source 141 causes the microwave energy source 141 to cycle between "on" and "off" operating points 206 and 207, during an on-time and an off-time, respectively. The "on" point 206 is well above the Hartree curve 201 and substantially within the oscillating region 205, as generally indicated by dimension 208 relative to the Hartree curve 201, such that the microwave energy source 141 is oscillating and producing microwave radiation at a significant power level with a relatively high efficiency. The "off" point 207, of the other hand, is only slightly below the Hartree curve 201 and barely within the cutoff region 203 at a nonzero voltage level, as generally indicated by dimension 209 relative to the Hartree curve 201, such that the microwave energy source 141 is not oscillating or producing microwave radiation.

However, power to the microwave energy source 141 is not fully turned off at the "off" point 207 due to the nonzero voltage level at which the operating voltage is held, even though the microwave energy source 141 output power is off at this point. Instead, some nonzero level of power or voltage is still applied to the microwave energy source 141 at the "off" point 207 during the off-time. That is, when the pulsed microwave radiation is off, methods include holding the microwave energy source at a nonzero voltage level below an oscillating region.

Maintaining this low level of power or voltage during the off-time allows for the magnetron to be rapidly returned to full-on operating power, such as at "on" point 206 within a very short time period (such as with a rise time of about 20 to about 50 nanoseconds). This concept of maintaining or holding the microwave energy source 141 only slightly outside and below the oscillating region 205 (such as slightly below the Hartree curve 201 or slightly within the cutoff region 203) is referred to herein as "simmering," wherein the microwave energy source 141 "simmers" at a power or voltage level just outside an "on" condition and from which it can be transitioned to a full-on level very rapidly. This technique can be used in some embodiments for pulse shaping of the pulsed microwave radiation. For example, the pulse shape could be triangular, trapezoidal, or smoothed out versions of triangular, trapezoidal, or square pulses. The pulse shape can be controlled to a fine degree by the microwave emitter control circuit 140. For example, the pulse shape can be based on a set of desired properties of a plasma plume, which desired properties are in turn based on accommodation for a particular application (such as for pyrolizing, sintering, annealing, etc.).

Maintaining the simmer power level of a microwave energy source during the off-time is distinguished from processes or systems that turn power to a microwave energy source completely off, since the time and power required to transition to an "on" point is considerably less when the microwave energy source can start from the simmer power level compared to when it has to start from the lower completely-off point. The ability to quickly transition from a simmering point to an "on" point enables high frequency pulsing of the microwave energy source. Additionally, this simmering technique is distinguished from processes or systems that keep a microwave energy source within the oscillating region 205. Furthermore, the faster rise times that are possible when using the herein-discussed simmering technique and the faster fall times that are possible when using the herein-discussed quenching technique help prevent arcs or instabilities from occurring in the plasma.

Figure 3:
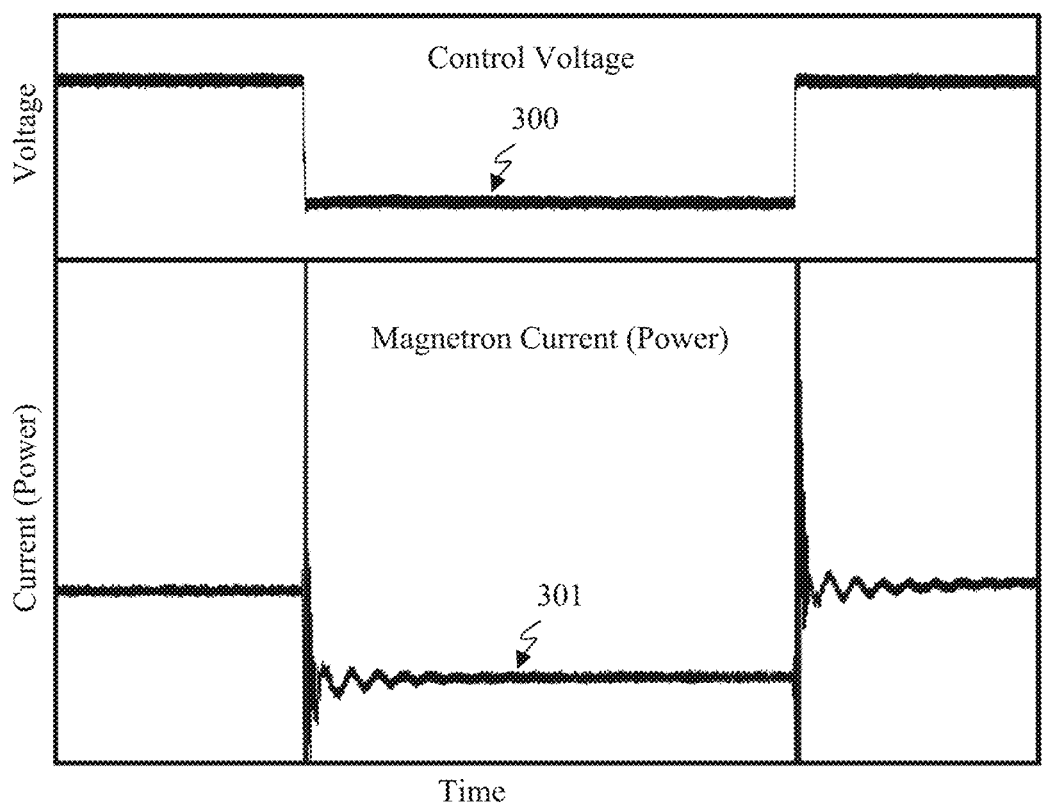
FIG. 3 shows a simplified graph of test results for the example microwave emitter control circuit shown in FIG. 1B, according to some implementations.

FIG. 3 illustrates test results for an example of the microwave emitter control circuit 140. A control signal trace 300 shows the operation of a relatively high pulsed control voltage applied to a microwave energy source, and a second trace 301 shows the performance of the resulting output current or power of the microwave energy source. The rise and fall times at the transitions for the control signal trace 300 are about 40 nanoseconds. The rapid response of the output current or power trace 301 shows large initial spikes at the rise/fall transitions, but they are insignificant at the time intervals involved, and the rise/fall times of the output current or power trace 301 are of a similar order as those of the control signal trace 300 (such as about 100 nanoseconds or less).

Figure 4:
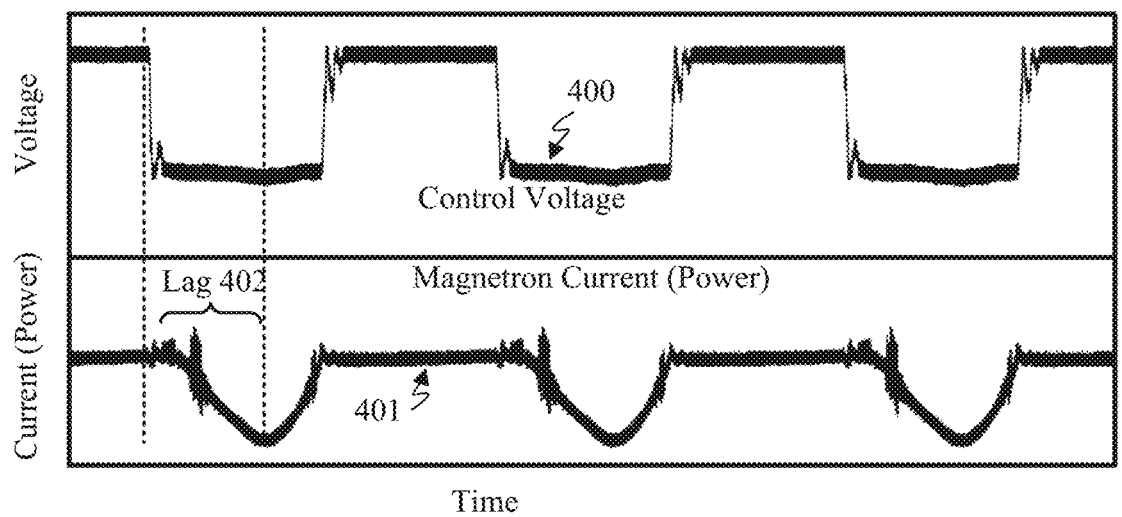
FIG. 4 shows a simplified graph of test results for a prior art microwave emitter control circuit, according to some implementations.

FIG. 4 illustrates test results for an example prior art microwave emitter control circuit. A trace 400 shows the operation of a relatively high pulsed control voltage applied to a magnetron, and a second trace 401 shows the performance of the resulting output current or power of the magnetron. The rise and fall times for the control voltage trace 400 are about 4 milliseconds.

The traces 300 and 301 provided in FIG. 3 are shown at a much finer horizontal resolution than are the traces 400 and 401 of FIG. 4, but at about the same vertical resolution. If the traces 300 and 301 of FIG. 3 were presented at the horizontal resolution of FIG. 4, then the initial rise/fall transition spikes in the output current or power trace 301 of the microwave energy source would not have been visible. Instead, the output current or power trace 301 would have appeared as a near perfect square wave, such as with no apparent rise/fall time, spikes, or ringing. By comparison, however, the prior art output current or power trace 401 shows a substantial response lag 402 and readily apparent ringing. Additionally, the prior art control voltage trace 400 exhibits noticeable ringing. In contrast, the control signal trace 300 for the microwave energy source of the present embodiments has almost no visible ringing, even at the much finer horizontal resolution of FIG. 3.

Figure 5:
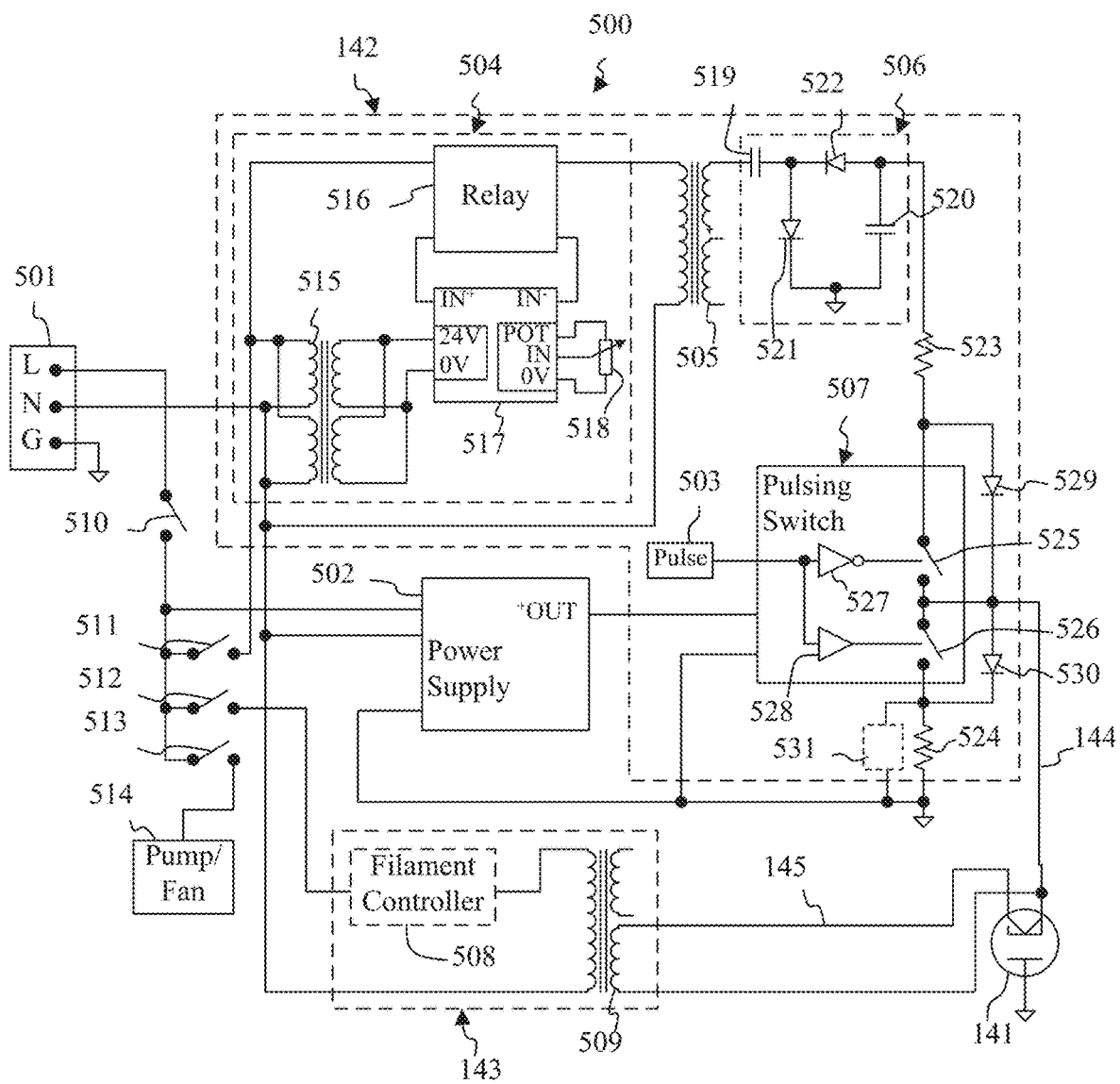
FIG. 5 shows a diagram for the example circuit shown in FIG. 1B, according to some implementations

FIG. 5 shows an example schematic diagram 500 that may be one example of the microwave emitter control circuit 140 of FIG. 1B, in accordance with some embodiments. The microwave emitter control circuit 500 is shown including the microwave energy source 141, the high voltage control circuitry 142, the filament control circuit 143, a voltage input 501, a power supply circuit 502, and pulse generator 503, among other potential circuit components that are either described below or are not shown in this schematic for simplicity. The high voltage control circuitry 142 generally includes a high voltage controller 504, a high voltage power supply (HVPS) transformer 505, a voltage doubler 506, and a pulsing switch 507, among other potential circuit components that are either described below or are not shown for simplicity. The filament control circuit 143 generally includes an optional filament controller 508 and a filament isolation transformer 509, among other potential circuit components not shown for simplicity. Other embodiments may include other components or arrangements of components to achieve similar results in the operation of the microwave energy source 141 (such as a microprocessor can be used in place of the high voltage controller 504 to control a waveform provided to the pulsing switch 507).

The microwave emitter control circuit 500 receives an appropriate input AC voltage (such as 120 Volts AC) at the voltage input 501 through a voltage line L, a neutral N, and a ground G (such as a ground potential). A main control switch 510 connects to the voltage line L to control turning on and off the input AC voltage to the microwave emitter control circuit 500. The main control switch 510 provides the input AC voltage from the voltage line L to the power supply circuit 502. The main control switch 510 provides the input AC voltage from the voltage line L and through additional control switches (such as a high voltage control switch 511, a filament control switch 512, a pump/fan control switch 513). When the control switches 510, 511, 512 and 513 are closed, an AC voltage from the voltage line L is supplied to the high voltage controller 504, to the filament control circuit 143, and to a cooling pump or fan 514. The neutral potential N is applied directly to the high voltage controller 504, to the HVPS transformer 505, to the power supply circuit 502, and to the filament control circuit 143.

The high voltage controller 504 generally includes a transformer 515, a relay 516, a relay controller 517, and a potentiometer 518, among other potential circuit components not shown for simplicity. The high voltage controller 504 generally controls the voltage provided to the HVPS transformer 505. To generate the voltage for the HVPS transformer 505, the relay 516 (such as a solid state zero crossing relay) receives the input AC voltage through the high voltage control switch 511 and, under control of the relay controller 517, reduces or chops the input AC voltage to some percentage of the original waveform (such as 5%-10% of a sine wave), to form a reduced or chopped up sinusoidal AC voltage. The reduced waveform may be as low as 0% and as high as 100% of the original waveform, but in some embodiments, the actual duty cycle range generally depends on properties of the HVPS transformer 505 and the voltage at which the microwave energy source 141 operates. A setting of the potentiometer 518 determines the percentage of the original waveform of the input AC voltage that passes through the relay 516. The transformer 515 receives the input AC voltage and the neutral N to generate a voltage (such as 24 Volts) to power the relay controller 517.

The HVPS transformer 505 (such as a step-up transformer) receives the neutral N and the chopped up AC voltage. With this voltage, the HVPS transformer 505 generates an intermediate high voltage (such as from about zero Volts to about 10,000 Volts). The level of the intermediate high voltage is based on the percentage of the original sine wave of the input AC voltage that passes the relay 516, which is adjusted by setting the potentiometer 518. The waveform of the intermediate high voltage is averaged out by the HVPS transformer 505.

The voltage doubler 506 generally includes capacitor 519, capacitor 520 as well as diode 521 and diode 522 connected to each other and to ground as shown. The voltage doubler 506 receives the intermediate high voltage generated by the HVPS transformer 505 and doubles it to form a high voltage (such as of about 3-15 kilovolts, depending on the output power requirements for the microwave energy source 141). The high voltage is passed through a high side resistor 523 to a high side input, or high voltage connection point, of the pulsing switch 507 to be provided to the microwave energy source 141 with each pulse.

The power supply circuit 502 is any appropriate AC-DC power converter that receives the input AC voltage, the neutral N, and the ground. The power supply circuit 502 generates a DC drive voltage (+out). A pulse generator 503 provides a signal to the pulsing switch 507.

The pulse generator 503 is any appropriate internal or external function generator capable of generating a changeable pulse control signal. The pulse control signal is at the desired frequency and duty cycle mentioned above to produce microwave power at a pulsing frequency, duty cycle, shape, and output power level that is appropriate for the particular application. In some embodiments, the pulse generator 503 is controlled by a computer, an analog input, manually, or other appropriate control technique in order to set the frequency and duty cycle of the pulse control signal.

The pulsing switch 507 is connected to the power supply circuit 502 to receive the DC drive voltage (+out) and connected to the pulse generator 503 to receive the pulse control signal. The pulsing switch 507 is also connected to the high side resistor 523 to receive the high voltage provided by the voltage doubler 506 and is further connected through a low side resistor 524 to a path to ground. The pulsing switch 507 is any appropriate switching device and may include vacuum relays, power MOSFETs, IGBTs or other switch components. For example, the series HTS-GSM switching modules available from Behlke Power Electronics GmbH of Kronberg, Germany, or other appropriate push-pull circuit, may be used for the pulsing switch 507.

The pulsing switch 507 generally includes high side bi-polar active switch 525 and low side bi-polar active switch 526 and corresponding switch drivers (such as switch driver 527 and switch driver 528). In some embodiments, the bi-polar active switches are relatively sensitive semiconductor or vacuum tube switches with relatively consistent hysteresis for switchpoints. In some embodiments, both the bi-polar active switch 525 and the bi-polar active switch 526 are connected in series between the high voltage connection and the ground connection (such as high voltage conductor and ground conductor). The pulsed high voltage output 144 is produced from a node between the bi-polar active switches, such that bi-polar active switch 525 provides a positive power supply to the microwave energy source 141, whereas the bi-polar active switch 526 quickly shunts the power back out to a lower level.

The DC drive voltage (+out) powers the switch drivers 527 and 528. The switch drivers 527 and 528 drive the bi-polar active switches 525 and 526, respectively. The bi-polar active switches 525 and 526 are turned on and off according to the frequency and duty cycle of the pulse control signal received from the pulse generator 503. The high side switch driver 527 generates an inverted drive signal compared to that of the low side switch driver 528, so that the bi-polar active switches 525 and 526 are activated and deactivated in a complementary manner. Diode 529 (connected from the high side high voltage input to a pulsed high voltage output of the pulsing switch 507) and diode 530 (connected from the pulsed high voltage output to the low side, or ground, connection through the resistor 524) provide electrical protection for the pulsing switch 507.

When the bi-polar active switch 525 is closed, the bi-polar active switch 526 is opened, and the high voltage is rapidly applied at the pulsed high voltage output (such as the pulsed high voltage output 144) to the microwave energy source 141 as described above to cause the microwave energy source 141 to start oscillating and producing the microwave radiation. The direct application of the high voltage to the microwave energy source 141 causes the rapid rise response (such as a range of about 20-50 nanoseconds, or a value of about 40 nanoseconds) in the current or power output of the microwave energy source 141 described above with respect to FIG. 3. Setting the potentiometer 518 adjusts the current or power output level due to the corresponding adjustment in the high voltage level.

When the bi-polar active switch 526 is closed, the bi-polar active switch 525 is opened, and the pulsed high voltage output of the pulsing switch 507 is connected to the ground connection through the resistor 524 directly to ground. In this manner, the output voltage is rapidly shunted off to a low voltage level (determined by the resistor 524 and a reactive component 531). This rapid shunting of the output voltage and its corresponding fast quenching effect on the circulating electron cloud is referred to herein as the "quenching technique." In some embodiments, the aforementioned "quenching technique" is implemented using reactive component 531, which introduces a capacitive sink (such as a charge sink) and/or an inductive load across the resistor 524. Alternatively, in some embodiments, the reactive component 531 is placed directly across the output of the bi-polar active switches 525 and 526. In some embodiments, a relatively small power supply component is used in addition to, or in place of the reactive component 531 to hold the voltage at the node between the bi-polar active switches 525 and 526 at a simmer level.

The microwave energy source 141 still has latent power at this point in the form of a circulating electron cloud inside it as it is producing microwaves. This latent power is shunted to a low level to rapidly quench the circulating electron cloud, thereby causing the rapid fall response (such as a range of about 20-50 nanoseconds, or a value of about 40 nanoseconds) in the current or power output of the microwave energy source 141 described above with respect to FIG. 3. A pulsed high voltage is thus produced at the pulsed high voltage output 144 as the bi-polar active switches 525 and 526 are repeatedly pulsed on and off to alternatingly connect the pulsed high voltage output back and forth between the high voltage connection and a relatively lower voltage level. That is, the pulsed voltage output is shunted to the ground through the second bi-polar active switch, the pulsed voltage output being capable of collapsing a circulating electron cloud in cavities of the magnetron ring, which will consequently shut down the generation of microwave energy. The pulsed high voltage has a frequency and duty cycle based on the frequency and duty cycle of the pulse control signal received from the pulse generator 503.

The filament isolation transformer 509 provides power to the filament of the microwave energy source 141. For embodiments without the filament controller 508, the filament isolation transformer 509 is driven directly by the input AC voltage received from the voltage input 501. The output current or power level of the microwave energy source 141, as described above, is dependent on, or controlled by, the high voltage (and the pulsing frequency and pulsing duty cycle thereof) received through the pulsing switch 507 and the filament current. In this case without the filament controller 508, therefore, the output current or power level of the microwave energy source 141 is controlled by only the high voltage received through the pulsing switch 507, since the filament current is constant. For implementations with the filament controller 508, the AC voltage applied to the filament isolation transformer 509 can be adjusted or controlled by the filament controller 508. In this case, the filament controller 508 controls the amount of current or voltage to the filament of the microwave energy source 141, thereby providing an additional, relatively coarse, control for the output current or power level of the microwave energy source 141. Control of the filament current may shift the location of the "on" point 206 in FIG. 2.

An electronic circuit includes a high voltage generator that produces a high voltage, a pulse generator that produces a pulse control signal having a frequency and a duty cycle, and a pulsing switch. The electronic circuit may be used with an energy source that generates energy of various frequencies, such as a microwave energy source. In the implementation regarding microwave energy, the electronic circuit serves as a microwave emitter control circuit for the microwave energy source where the microwave energy source generates pulsed microwave radiation when receiving a pulsed high voltage, and where a power level of the pulsed microwave radiation depends on a voltage level, a frequency, and a duty cycle of the pulsed high voltage. The pulsing switch can have a first bi-polar active switch, a second bi-polar active switch, a high voltage connection, a ground connection, a pulse input, and a pulsed voltage output. The first bi-polar active switch and the second bi-polar active switch are connected in series between the high voltage connection and the ground connection. The high voltage connection is connected to the high voltage generator to receive the high voltage. The ground connection is connected to a ground potential. The pulsed voltage output is connected between the first bi-polar active switch and the second bi-polar active switch. The pulse input is connected to the pulse generator to receive the pulse control signal. The pulsed high voltage is produced at the pulsed voltage output when the first bi-polar active switch and the second bi-polar active switch are repeatedly pulsed on and off to alternatingly connect the pulsed voltage output back and forth between the high voltage connection and the ground connection. The frequency and the duty cycle of the pulsed high voltage is based on the frequency and the duty cycle of the pulse control signal.

A microwave emitter control circuit includes a microwave energy source, a high voltage generator that produces a high voltage, a pulse generator that produces a pulse control signal having a frequency and a duty cycle, and a pulsing switch. The microwave energy source generates pulsed microwave radiation when receiving a pulsed high voltage, where a power level of the pulsed microwave radiation depends on a voltage level, a frequency, and a duty cycle of the pulsed high voltage. The pulsing switch has a first bi-polar active switch, a second bi-polar active switch, a high voltage connection, a ground connection, a pulse input, and a pulsed voltage output. The first bi-polar active switch and the second bi-polar active switch are connected in series between the high voltage connection and the ground connection. The high voltage connection is connected to the high voltage generator to receive the high voltage. The ground connection is connected to a ground potential. The pulsed voltage output is connected between the first bi-polar active switch and the second bi-polar active switch. The pulse input is connected to the pulse generator to receive the pulse control signal. The pulsed high voltage is produced at the pulsed voltage output with rise and fall times of 20-50 nanoseconds when the first bi-polar active switch and the second bi-polar active switch are repeatedly pulsed on and off to alternatingly connect the pulsed voltage output back and forth between the high voltage connection and the ground connection. The frequency and the duty cycle of the pulsed high voltage is based on the frequency and the duty cycle of the pulse control signal. When the pulsed microwave radiation is pulsed off, the microwave energy source is held at a nonzero voltage level below an oscillating region. The pulsed voltage output is shunted to the ground potential through the second bi-polar active switch, the pulsed voltage output being capable of collapsing a circulating electron cloud.

An apparatus comprises an electronic circuit configured to generate a high voltage having a voltage level and generate a pulse control signal having a frequency and a duty cycle. The electronic circuit is also configured to generate, by a pulsing switch, a pulsed high voltage from the high voltage and the pulse control signal, the pulsed high voltage having the voltage level, the frequency and the duty cycle, the pulsing switch having a first bi-polar active switch, a second bi-polar active switch, a high voltage connection, a ground connection, a pulse input, and a pulsed voltage output, wherein the first bi-polar active switch and the second bi-polar active switch are connected in series between the high voltage connection and the ground connection, the high voltage connection receives the high voltage, the ground connection is connected to a ground potential, the pulsed voltage output is connected between the first bi-polar active switch and the second bi-polar active switch, the pulse input receives the pulse control signal, and the pulsed high voltage is produced at the pulsed voltage output when the first bi-polar active switch and the second bi-polar active switch are repeatedly pulsed on and off to alternatingly connect the pulsed voltage output back and forth between the high voltage connection and the ground connection. The electronic circuit is also configured to generate a pulsed microwave radiation having a power level that depends on the voltage level, the frequency, and the duty cycle.

An apparatus includes an energy source, a high voltage generator that produces a high voltage on a high voltage connection, a pulse generator that produces a pulse control signal having a pulse control frequency and a pulse control duty cycle, and a pulsing switch. The energy source may be, for example, a microwave energy source. The energy source generates pulsed radiation (such as microwave radiation) when receiving a pulsed high voltage, where a power level of the pulsed radiation depends on a voltage level, a frequency, and a duty cycle of the pulsed high voltage. The pulsing switch has a first bi-polar active switch, a second bi-polar active switch, a high voltage connection, a ground connection, a pulse input, and a pulsed voltage output. When a voltage at the high voltage connection transitions from a higher voltage to a lower voltage, the power level of the pulsed microwave radiation transitions from a higher power level to a lower power level (such as from a first power level to a second power level that is lower than the first power level) within a range of about 20 nanoseconds to about 50 nanoseconds.

Figure 6:
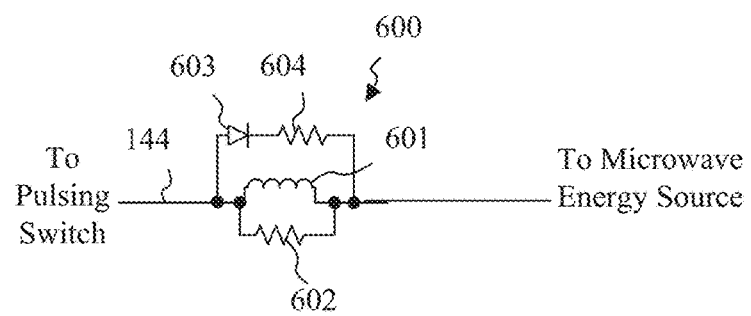
FIG. 6 shows a diagram of a rise time adjustment network circuit suitable for incorporation and/or use with the example circuits shown in FIGS. 1B and 5, according to some implementations.

FIG. 6 shows an optional rise time adjustment network 600 for tuning the rise and fall times of the pulsed high voltage output 144 for applications of the microwave emitter control circuit 140 that has, for example, a reactor or chemistry that requires some extra rise time. The rise time adjustment network 600 generally includes a parallel arrangement of an inductor 601, a resistor 602, and a series diode/resistor (603/604) that can slow the rise and fall times of the pulsed high voltage output 144. The rise time adjustment network 600, thus, can be placed between the pulsing switch 507 and the microwave energy source to put a more controllable slope in the transitions of the square wave of the control signal trace 300, so as to smooth out, or reduce, the spikes or ringing, and to put a curve in the transitions of the output current or power trace 301 shown in FIG. 3. In this manner, rise time adjustment network 600 smooths out the ringing or provides a controlled rise time in the output current or power trace 301 to smooth out, or otherwise shape the overall waveform.

Figure 7A:
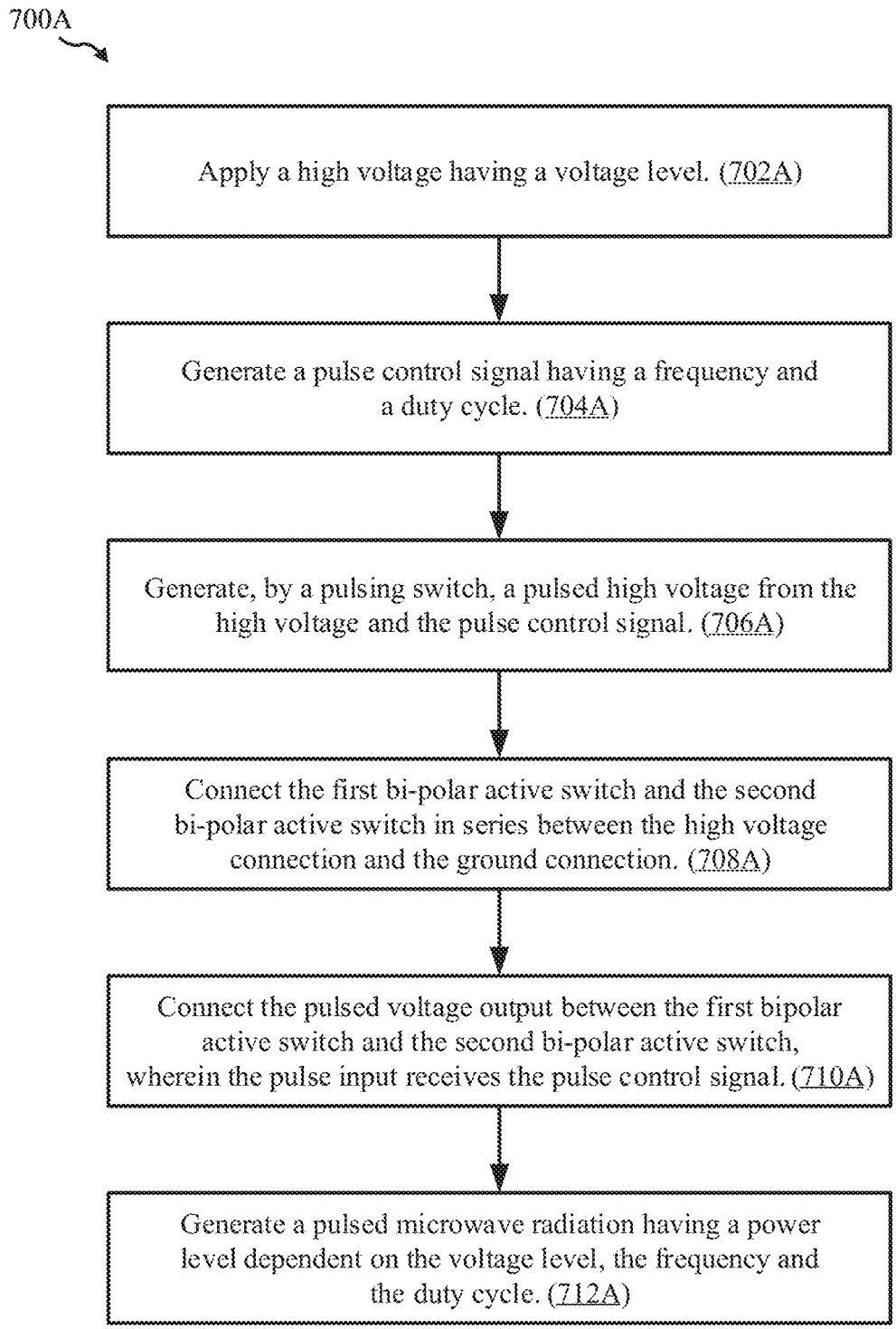
FIG. 7A is a flowchart of a method of generating a pulsed microwave radiation with a circuit, according to some implementations.

FIG. 7A shows an illustrative flowchart depicting an example operation 700A for a method of generating a pulsed microwave radiation. In some implementations, the operation 700A may be an example of one or more of operations that can be performed with any one or more of the presently disclosed circuits, such as the microwave emitter control circuit 140 is generally shown including the microwave energy source 141 presented in FIG. 5. At block 702A, the microwave emitter control circuit 140 can apply a high voltage having a voltage level. At block 704A, the microwave emitter control circuit 140 can generate a pulse control signal having a frequency and a duty cycle. At block 706A, the microwave emitter control circuit 140 can generate, by a pulsing switch, a pulsed high voltage from the high voltage and the pulse control signal. At block 708A, the microwave emitter control circuit 140 can connect the first bi-polar active switch and the second bi-polar active switch in series between the high voltage connection and the ground connection. At block 710A, the microwave emitter control circuit 140 can Connect the pulsed voltage output between the first bipolar active switch and the second bi-polar active switch, wherein the pulse input receives the pulse control signal. At block 712A, the microwave emitter control circuit 140 can generate a pulsed microwave radiation having a power level dependent on the voltage level, the frequency, and the duty cycle.

Figure 7B:
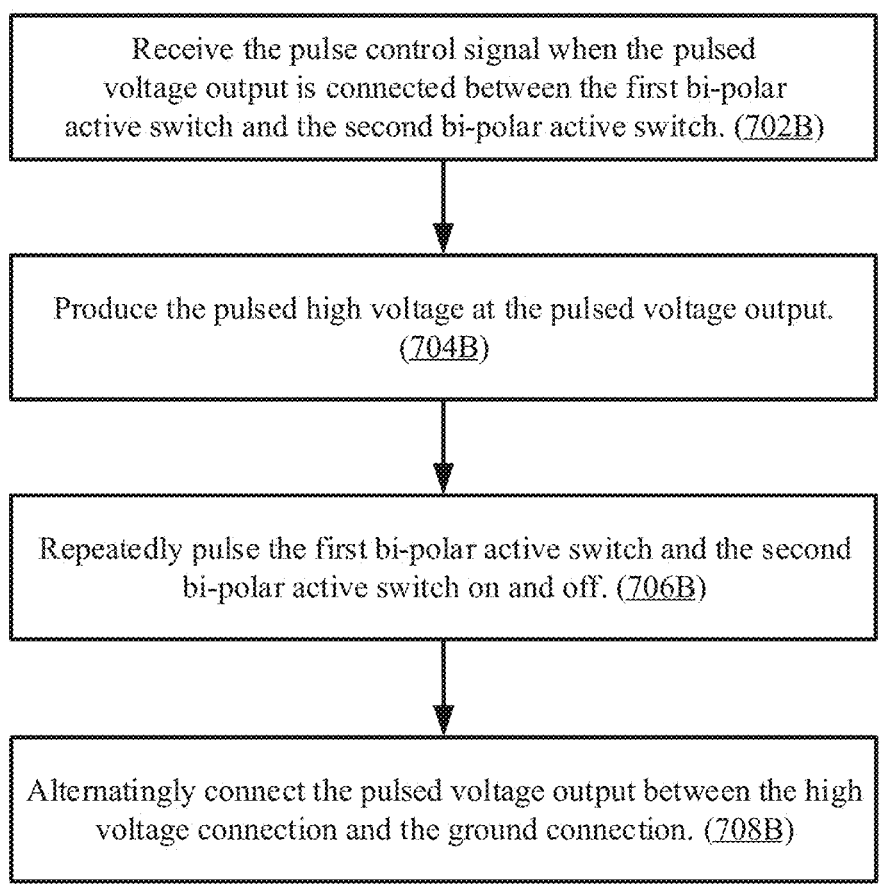
FIG. 7B is a flowchart of a method of alternatingly connecting a pulsed voltage output, according to some implementations.

FIG. 7B shows an illustrative flowchart depicting an example operation 700B for a method of alternatingly connect the pulsed voltage output between the high voltage connection and the ground connection. In some implementations, the operation 700B may a part of the operation 700A and/or be an example of one or more of operations that can be performed with any one or more of the presently disclosed circuits, such as the microwave emitter control circuit 140 is generally shown including the microwave energy source 141 presented in FIG. 5. At block 702B, the microwave emitter control circuit 140 receives the pulse control signal when the pulsed voltage output is connected between the first bi-polar active switch and the second bi-polar active switch. At block 704B, the microwave emitter control circuit 140 produces the pulsed high voltage at the pulsed voltage output. At block 706B, the microwave emitter control circuit 140 repeatedly pulses the first bi-polar active switch and the second bi-polar active switch on and off. At block 708B, the microwave emitter control circuit 140 alternatingly connects the pulsed voltage output between the high voltage connection and the ground connection.

Microwave Chemical Processing Systems

The microwave emitter control circuit 140 is generally shown including the microwave energy source 141 presented in FIG. 5 can be coupled with any one or more of the presently disclosed waveguides and/or reactor systems to control microwave energy pulsed and/or propagated throughout the waveguide to output a carbon-containing powder. Regarding the waveguides and/or the reactor systems, a microwave plasma can be generated in a supply gas and/or process material, and the energy in the plasma is sufficient to form separated components from process material molecules. A source of microwave energy is coupled to a FEWG, the plasma is generated along a plasma zone of the FEWG, and the process material is separated into components by the plasma along the reaction length in in the FEWG. The microwave energy is coupled directly into the plasma and not through a dielectric wall as in conventional methods. A microwave plasma can be generated in a supply gas and/or process material, and the energy in the plasma is sufficient to form separated components from process material molecules. A source of microwave energy is coupled to a FEWG, the plasma is generated along a plasma zone of the FEWG, and the process material is separated into components by the plasma along the reaction length in in the FEWG. The microwave energy is coupled directly into the plasma and not through a dielectric wall as in conventional methods.

Figure 8A:
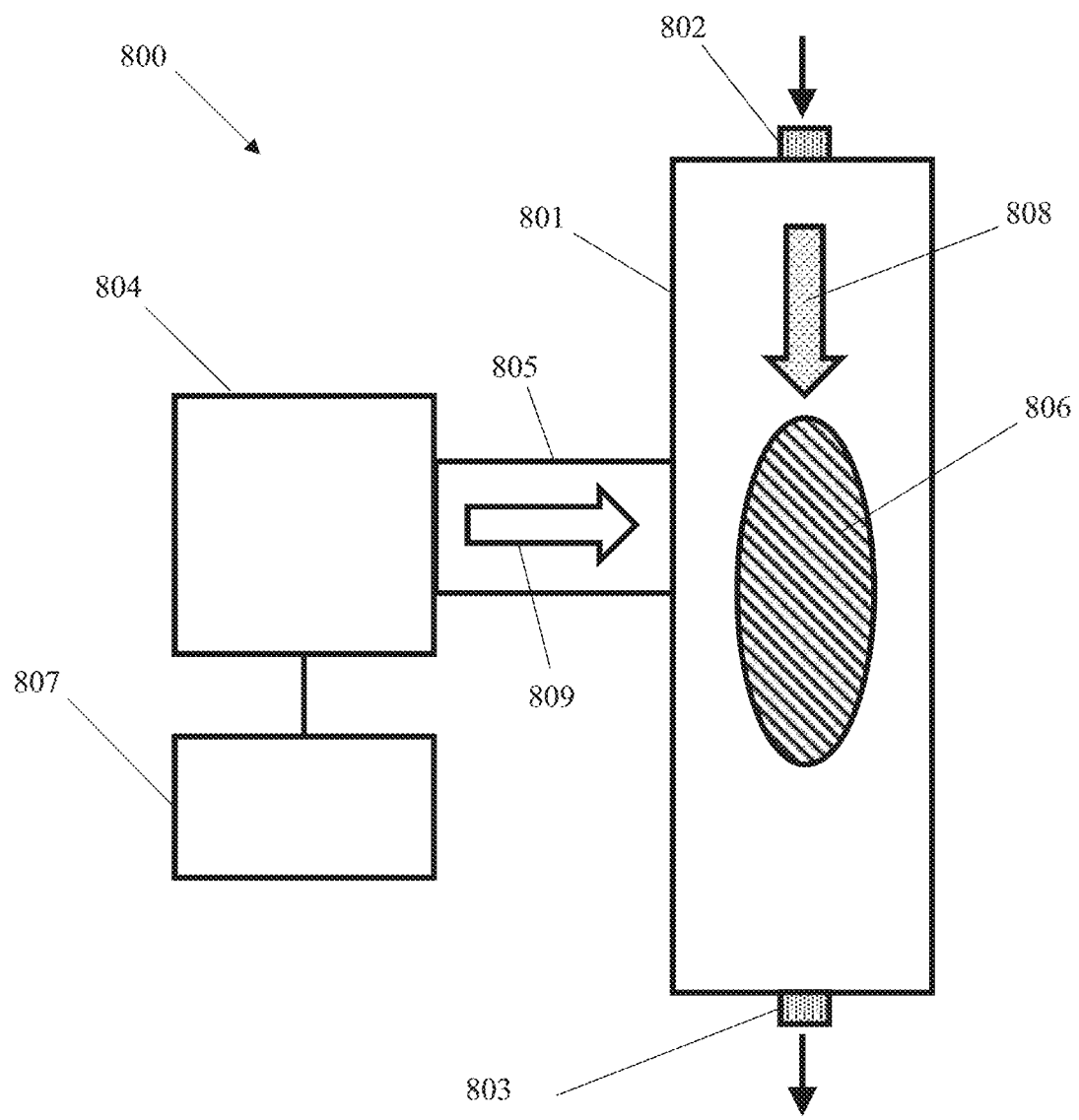
FIG. 8A shows a vertical cross-section of a conventional microwave chemical processing system, according to some implementations.

FIG. 8A illustrates a conventional microwave chemical processing system 800. As shown, the microwave chemical processing system 800 generally includes a reaction chamber 801, one or more gas inlets 802 configured to receive process material 808 flowing into the reaction chamber, one or more outlets 803 configured to collect separated products out of the reaction chamber 801, and a source of microwave energy 804 that is coupled to the reaction chamber through a waveguide 805, among other elements not shown for simplicity. The microwave energy 809 creates a microwave plasma 806 in the reaction chamber 801 and provides energy for reactions to occur. A microwave emitter circuit 807 can control the microwave energy 809 emitted from the microwave energy source 804 to be either continuous wave or pulsed. Given the right conditions, the energy in the plasma will be sufficient to form separated components from the process material molecules.

Microwave Chemical Processing Reactors with Field-Enhancing Waveguides (FEWGS)

Figure 8B:
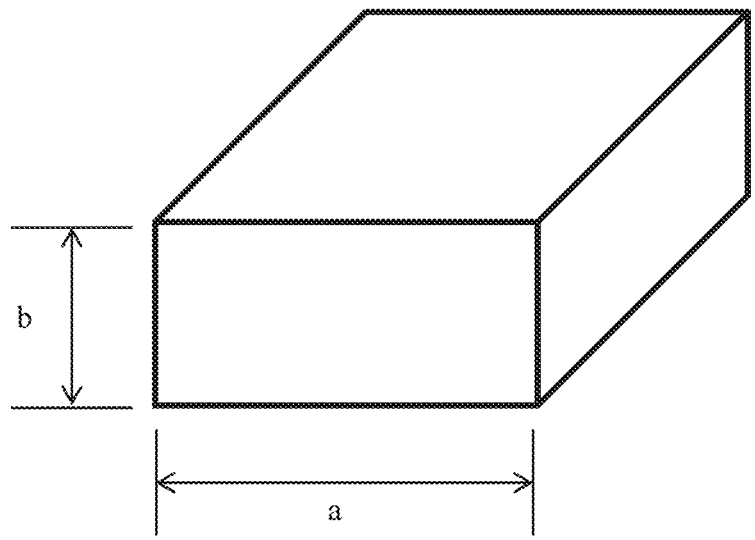
FIGS. 8B and 8C show example geometries and dimensions of waveguides (such as field-enhancing waveguides, FEWGs), according to some implementations.

As shown in FIG. 8B, the widest dimension of a waveguide is called the "a" dimension and determines the range of operating frequencies. The narrowest dimension determines the power-handling capability of the waveguide and is called the "b" dimension. The FEWGs of the present disclosure efficiently transfer microwave frequency electromagnetic energy. The FEWGs of the present disclosure are constructed from conductive material and may be rectangular, circular, or elliptical in cross-section.

Figure 8C:
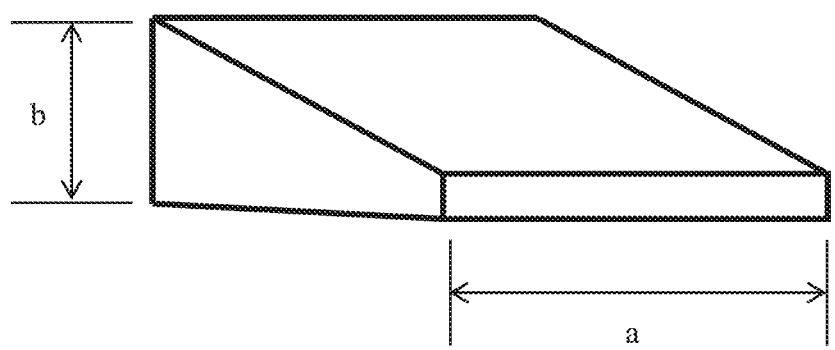

FIG. 8C shows an example of a field-enhancing region of a FEWG, where the widest dimension "a" stays constant in order to effectively transmit a selected frequency of microwave energy, and the narrower dimension "b" is reduced along the length of the FEWG in order to concentrate the microwave energy density. FIG. 8C depicts a linear decrease of dimension "b"; however, the decrease in the dimension "b" could be non-linear (such as parabolic, hyperbolic, etc.), have different rates of decrease along the length (such as different slopes of linear decrease, of linear in one section and non-linear in another section), or contain abrupt steps to decrease the length of dimension "b". Disclosed configurations or implementations can be applicable for both stationary wave systems (where the peaks remain at the same location) and traveling wave systems (where the peaks can move).

Figure 9:
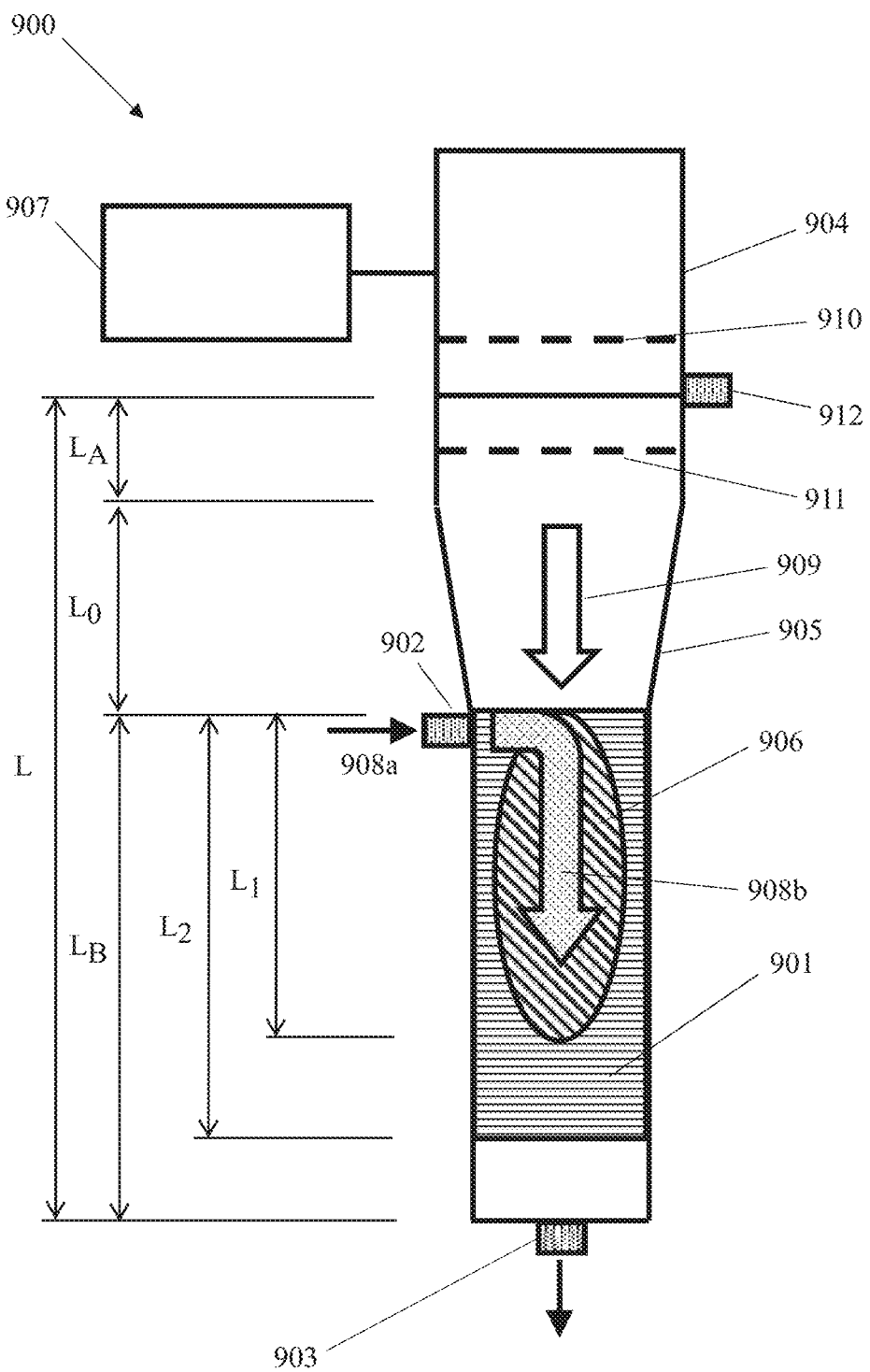
FIG. 9 shows a vertical cross-section of a reactor (such as a reactor coupled to a microwave energy source), according to some implementations.
Figure 10:
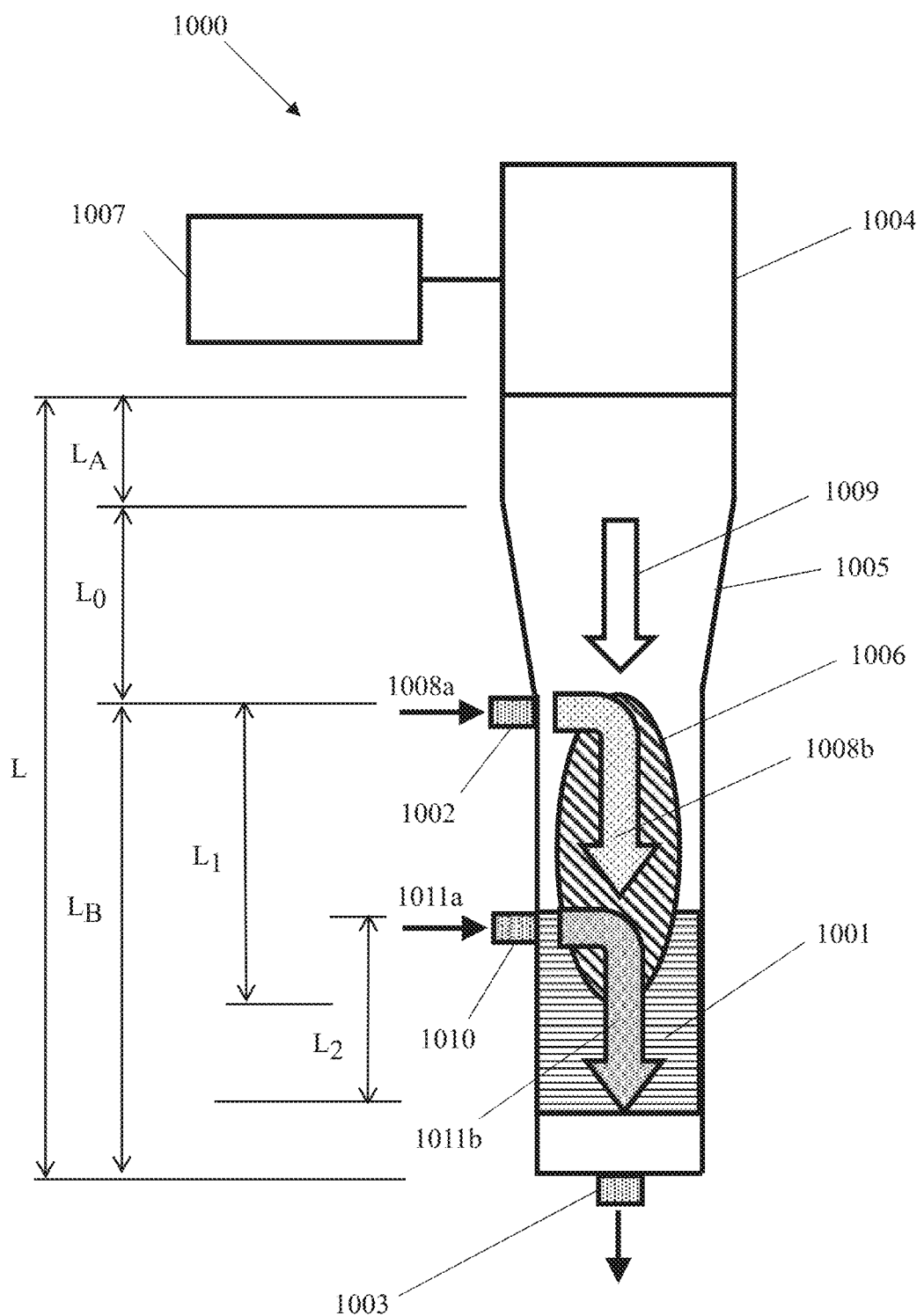
FIG. 10 shows a simplified vertical cross-section of a microwave gas processing system, according to other implementations.

FIG. 9 shows a reactor system 900 in which the FEWG is coupled to a microwave energy generator (such as a microwave energy source), the plasma is generated from a supply gas in a plasma zone of the FEWG, and the reaction length of the FEWG serves as the reaction zone to separate the process material into separate components. FIG. 10 shows another reactor system 1000 in which the FEWG is coupled to a microwave energy generator (such as a microwave energy source), the plasma is generated from a supply gas in a plasma zone of the FEWG, and the reaction length of the FEWG serves as the reaction zone to separate the process material into separate components. The reactor systems 900 and 1000 of FIG. 9 and FIG. 10, respectively, are absent of a dielectric barrier between the field-enhancing zone of the field-enhancing waveguide and the reaction zone. In contrast, the reaction zones of conventional systems, are enclosed within a dielectric barrier such as a quartz chamber as explained previously. The direction of propagation of the microwave energy is parallel to the majority of the flow of the supply gas and/or the process material, and the microwave energy enters the waveguide upstream of the portion of the FEWG where the separated components are generated.

As shown in FIG. 9, the reactor system 900 includes a FEWG 905, one or more inlets 902 configured to receive supply gas and/or process material 908a flowing into the FEWG 905, and a microwave energy source 904 that is coupled to the FEWG 905, among other elements not shown for simplicity. Microwave circuit 907, which can be equivalent or similar to the microwave emitter control circuit 140 is generally shown including the microwave energy source 141 presented in FIG. 5, controls a pulsing frequency at which microwave energy 909 from microwave energy source 904 is pulsed. The microwave energy 909 from microwave energy source 904 is continuous wave.

The FEWG 905 has a length L. The portion of the FEWG 905 with length $L_A$ (shown in FIG. 9 and FIG. 10) is closer to the microwave energy generator than the portion of the FEWG with length $L_B$ (shown in FIG. 9 and FIG. 10). Throughout this disclosure, different portions of the FEWG will be described by a capital L with a subscript denoting the certain portion of the FEWG (such as $L_A$, $L_0$, $L_B$, $L_1$, $L_2$), and synonymously, the lengths of the different portions of the FEWG will also be described by a capital L with a subscript denoting the length of a certain portion of the FEWG (such as $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$, is located between lengths $L_A$ and $L_B$ of the FEWG and has a decreasing cross-sectional area along the path of the microwave energy propagation. The cross-sectional area of the FEWG along length $L_0$ can decrease in a continuous manner. The cross-sectional area of the FEWG along length $L_0$ decreases linearly between lengths $L_A$ and $L_B$. The cross-sectional area of the FEWG along length $L_0$ can decrease non-linearly between lengths $L_A$ and $L_B$, such as decreasing parabolically, hyperbolically, exponentially, or logarithmically. The cross-sectional area of the FEWG along length $L_0$ decreases in a or an abrupt manner between lengths $L_A$ and $L_B$, such as decreasing through one or more discrete steps.

The decrease in cross-sectional area serves to concentrate the electric field, thus increasing the microwave energy density while still providing a significant amount of area in which plasma can be formed compared to conventional systems. The portion of the FEWG with length LB (shown in FIG. 9 and FIG. 10) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 905 are set according to the microwave frequency, in order to properly function as a waveguide. For example, for an elliptical waveguide the cross-sectional dimensions can be 5.02 inches by 2.83 inches for 2.1-2.7 GHz.

In conventional gas processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (such as particulate carbon) are coated on the window during processing leading to a decreased power delivery over time. This can be highly problematic if these separated components absorb microwave energy because they can prevent the microwave energy from coupling into the reaction chamber to generate the plasma.

Consequently, a rapid build-up of by-products, such as carbon particles that are produced from the gas reactions, occurs, and limits the run-time of the processing equipment. The microwave chemical processing reactor 900 can be designed without the use of a window in the reaction zone; that is, using a parallel propagation/gas flow system where the energy enters upstream from the reaction. As a result, more energy and power can be coupled into the plasma from the microwave energy source. The lack of a window and the greater volume within the waveguide, compared to limited reaction chamber volumes in conventional systems, greatly reduces the issue of particle build-up causing limited run-times, thus improving production efficiency of the microwave processing system.

The microwave energy 909 in FIG. 9 creates a microwave plasma 906 in the supply gas and/or process material within a plasma zone with length $L_1$ (shown in FIG. 9 and FIG. 10) of the length of the FEWG 905. The plasma zone with length $L_1$ is located within the portion of the FEWG $L_B$, where the cross-sectional area is smaller, and the microwave energy density is higher than in length $L_A$. A supply gas that is different from the process material is used to generate the microwave plasma 906. The supply gas may be, for example, hydrogen, helium, a noble gas such as argon, or mixtures of more than one type of gas. The supply gas can be the same as the process material, where the process material is the material from which separated components are being created.

The supply gas and/or process material inlet 902 can be located upstream from the portion of the FEWG $L_B$, or is located within the portion of the FEWG $L_0$, or is located within the portion of the FEWG $L_A$, or is located upstream of the portion of the FEWG $L_A$. The portion of the FEWG $L_1$ extends from a position along the FEWG downstream from the position where the supply gas and/or process material 908a enters the FEWG, to the end of the FEWG or to a position between the entrance of the supply gas and/or process material and the end of the FEWG 905. The portion of the FEWG $L_1$ extends from where the supply gas and/or process material 908a enters the FEWG, to the end of the FEWG or to a position between the entrance of the supply gas and/or process material and the end of the FEWG.

The generated plasma 906 provides energy for reactions to occur in process material 908b within a reaction zone 901 of the FEWG 905 having a reaction length $L_2$. Reaction zone $L_2$ extends from where the process material 908a enters the FEWG 905, to the end of the FEWG 905 or to a position between the entrance of the process material and the end of the FEWG 905. Given the right conditions, the energy in the plasma 906 will be sufficient to form separated components from the process material molecules. One or more outlets 903 are configured to collect the separated products out of the FEWG 905 downstream of the reaction zone portion of the FEWG where reactions occur in the process material 908b. In the example shown in FIG. 9, the propagation direction of the microwave energy 909 is parallel with the majority of the supply gas and/or process material flow 908b, and the microwave energy 909 enters the FEWG 905 upstream of the reaction zone 901 of the FEWG where the separated components are generated.

A pressure barrier 910 that is transparent to microwave energy can be located within the microwave energy source 904, near the outlet of the microwave energy source, or at other locations between the microwave energy source 904 and the plasma 906 produced in the FEWG. This pressure barrier 910 can serve as a safety measure to protect from potential backflow of plasma into the microwave energy source 904. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. There can be two pressure barriers 910 and 911, where one or both pressure barriers 910 and 911 are within the microwave energy source 904, near the outlet of the microwave energy source, or at other locations between the microwave energy source 904 and the plasma 906 produced in the FEWG. The pressure barrier 911 can be closer to the plasma 906 in the FEWG than the pressure barrier 910, and there is a pressure blowout port 912 between the pressure barriers 910 and 911 in case the pressure barrier 911 fails.

A plasma backstop (not shown) can be included in the system to prevent the plasma from propagating to the microwave energy source 904 or the supply gas and/or process material inlet(s) 902. The plasma backstop can be a ceramic or metallic filter with holes to allow the microwave energy to pass through the plasma backstop but preventing the majority of the plasma species from passing through. The majority of the plasma species will be unable to pass the plasma backstop because the holes will have a high aspect ratio, and the plasma species will recombine when they hit the sidewalls of the holes. The plasma backstop is located between portion $L_0$ and $L_1$, or within portion $L_0$ upstream of portion $L_1$ and downstream of the inlet(s) 902 (in an embodiment where inlet 902 is within portion $L_0$) and the microwave energy source 904.

Referring again to FIG. 10, the reactor system 1000 generally includes a FEWG 1005, one or more supply gas inlets 1002 configured to receive supply gas 1008a flowing into the FEWG 1005, one or more process material inlets 1010 configured to receive process material 1011a, and a source of microwave energy 1004 that is coupled to the FEWG 1005, among other elements not shown for simplicity. The location of process material inlet 1010 is downstream of the location of supply gas inlet 1002, where downstream is defined in a direction of the microwave energy propagation.

Microwave circuit 1007 can control a pulsing frequency at which microwave energy 1009 from microwave energy source 1004 is pulsed. The microwave energy from microwave energy source 1004 can be a continuous wave. Similar to the embodiment shown in FIG. 9, the FEWG 1005 in FIG. 10 has portions $L_A$, $L_0$, $L_B$, $L_1$, and $L_2$, where portion $L_B$ has a cross-sectional area smaller than that of $L_A$, portion $L_0$ has a decreasing cross-sectional area between portion $L_A$ and $L_B$, $L_1$ is the portion where the plasma is generated, and $L_2$ is the portion that is the reaction zone.

The microwave energy 1009 creates a microwave plasma 1006 in the supply gas 1008b within a plasma zone $L_1$ of the length L of the FEWG 1005. Portion $L_1$ can extend from a position along the FEWG 1005 downstream from the position where the supply gas 1008a enters the FEWG 1005, to the end of the FEWG 1005 or to a position between the entrance of the supply gas and the end of the FEWG 1005.

Portion $L_1$ can extend from where the supply gas 1008a enters the FEWG 1005, to the end of the FEWG 1005 or to a position between the entrance of the supply gas and the end of the FEWG 1005. One or more additional process material inlets 1010 are configured to receive process material flowing into the FEWG at a second set of locations downstream of the supply gas inlet(s) 1002. The generated plasma 1006 provides energy for reactions to occur within the reaction zone 1001 of the FEWG 1005 having a reaction length $L_2$.

Portion $L_2$ can extend from where the process material 1011a enters the FEWG 1005, to the end of the FEWG 1005 or to a position between the entrance of the process material and the end of the FEWG 1005. Given the right conditions, the energy in the plasma will be sufficient to form separated components from the process material molecules. One or more outlets 1003 are configured to collect the separated products out of the FEWG 1005 downstream of the portion 1001 where reactions occur. In the example system 1000 shown in FIG. 10, the propagation direction of the microwave energy 1009 is parallel with the majority of the supply gas flow 1008b and the process material flow 1011b, and the microwave energy 1009 enters the FEWG 1005 upstream of the reaction portion 1001 of the FEWG where the separated components are generated.

One or more pressure barriers that are transparent to microwave energy can be located within the microwave energy source 1004, near the outlet of the microwave energy source, or at other locations between the microwave energy source 1004 and the plasma 1006 produced in the FEWG (similar to what is described above and depicted in FIG. 9). There can be two pressure barriers and a pressure blowout port between the pressure barriers in case the barrier closer to the plasma 1006 in the FEWG fails.

The walls of the reaction zone $L_2$ can be configured such that the supply gas inlets and process material inlets provide the supply gas and process material to the reaction zone through the walls of the FEWG. For example, the walls can have a series of holes that serve as secondary supply gas inlets through which the supply gas and/or process material can be inserted into the FEWG, or the walls can be permeable to the supply and/or process material, or the walls can be porous. Providing the supply gas and input material to the reaction zone through the walls can mitigate the deposition of the separated components on the reaction zone walls, by forming a reactive plasma close to the wall that etches away deposited material.

There can be a plurality of supply gas and process inlets that provide the supply gas and input material to the reaction zone $L_2$ through the walls of the FEWG. There can be a plurality of supply gas and process inlets that are configured to provide controlled mass fractions of the supply gas and input material to the reaction zone $L_2$ through the FEWG walls. Having supply gas and process material introduced into the FEWG with controlled mass fractions can more effectively etch away any material that is deposited on the walls of the FEWG in the reaction zone.

As described above, the FEWG (such as 905 in FIG. 9, and 1005 in FIG. 10) has a total length L, a portion of the total length $L_A$ and a portion $L_B$ where the cross-sectional area of $L_B$ is smaller than that of $L_A$, a portion $L_1$ along which the plasma is generated, and a portion of the total length $L_2$ along which the process material is converted into the separated components. The total length L of the waveguide can be from 1 cm to 1000 cm. Length $L_0$ of the waveguide can be from 1 cm to 100 cm. Length $L_1$ of the waveguide can be from 1 cm to 100 cm. Length $L_2$ of the waveguide can be from 1 cm to 1000 cm. Length L of the waveguide can be from 30 cm to 60 cm. Length $L_0$ of the waveguide can be from 10 cm to 40 cm. Length $L_1$ of the waveguide can be from 10 cm to 30 cm. Length $L_2$ of the waveguide can be from 5 cm to 20 cm. The portion of the FEWG length $L_A$ is from, for example, 0 inches to 10 inches for a microwave frequency of 2.45 GHz, although the length can vary according to the microwave frequency used. The portion of the FEWG length $L_B$ is from, for example, 10 inches to 20 inches, which will depend on factors such as the gas flow velocity and microwave power.

For example, higher gas flow velocities will expand the reaction zone length. length $L_1$ is more than 10%, or more than 20%, or more than 30% or more than 40% or more than 50%, or more than 60%, or more than 70%, or more than 80%, or from 10% to 90%, or from 20% to 80%, or from 30% to 70% of the length of the waveguide, L length $L_2$ is more than 5%, or more than 10%, or more than 15% or more than 20%, or more than 25% or more than 30%, or more than 35%, or more than 40%, or more than 45%, or more than 50%, or more than 55%, or more than 60%, or from 1% to 90%, or from 1% to 70%, or from 1% to 50%, or from 10% to 50%, or from 10% to 40%, or from 20% to 40% of the length of the waveguide, L.

The FEWGs 905 and 1005 can be configured to maintain a pressure from 0.1 atm to 10 atm, or from 0.5 atm to 10 atm, or from 0.9 atm to 10 atm, or greater than 0.1 atm, or greater than 0.5 atm, or greater than 0.9 atm. In many conventional systems, the microwave chemical processing is operated at vacuum. However, in the present embodiments with the plasma being generated within the FEWG, operating in a positive pressure environment assists in preventing the generated plasma from feeding back into the microwave energy source, for example, as depicted in FIG. 9 and FIG. 10.

The FEWGs 905 and 1005 may have a rectangular cross-section within length $L_B$ of dimensions 0.75 inches by 3.4 inches, to correspond to a microwave energy frequency of 2.45 GHz. Other dimensions of $L_B$ are possible for other microwave frequencies, and dependent upon waveguide mode these cross-sectional dimensions can be from 3-6 inches. The FEWGs 905 and 1005 may have a rectangular cross-section within length $L_A$ of dimensions 1.7 inches by 3.4 inches, for example, to correspond to a microwave energy frequency of 2.45 GHz. Other dimensions of $L_A$ are possible for other microwave frequencies. The FEWGs 905 and 1005 may be made of any innately conductive material or a material with a sufficient conductive coated layer to propagate greater than 90% of incoming power. Some examples of FEWG materials are a metallic material, a metallic material with a conductive coating, a ceramic material, a ceramic material with a conductive coating, stainless steel, stainless steel coated with a conductive layer (such as Al, Ni, Au, or a Ni/Au alloy), stainless steel with an aluminum liner, or a ceramic material coated with a conductive layer.

Notably, the FEWGs 905 and 1005 may serve as the chamber in which the plasma is generated and the process material reactions to occur, rather than having a separate waveguide and quartz reaction chamber as in conventional systems. Having the FEWGs 905 and 1005 serve as the reactor chamber provides a much larger volume in which gas reactions can occur (such as up to 1000 L). This enables high flow rates of process material to be processed, without being limited by a build-up of carbon particulate as occurs in conventional systems. For example, process material flow rates through the inlets 902 and 1010 into respective FEWGs 905 1005 may be from 1 slm (standard liters per minute) to 1000 slm, or from 2 slm to 1000 slm, or from 5 slm to 1000 slm, or greater than 1 slm, or greater than 2 slm, or greater than 5 slm. Supply gas flow rates through the inlets 902 and 1002 into respective FEWGs 905 and 1005 may be, for example, from 1 slm to 1000 slm, or from 2 slm to 1000 slm, or from 5 slm to 1000 slm, or greater than 1 slm, or greater than 2 slm, or greater than 5 slm. Dependent upon the gas plasma properties that result in sufficient plasma density (such as secondary electron emission coefficient) the flows can be from 1 slm to 1000 slm and with pressures up to 14 atm.

The process material (alternatively referred to as raw material) can be a liquid that is provided through the process material inlet into the FEWGs 905 and 1005. Some examples of liquids that can be used as process materials are water, alkanes, alkenes, alkynes, aromatic hydrocarbons, saturated and unsaturated hydrocarbons (such as of alkanes, alkenes, alkynes, or aromatic hydrocarbons), ethanol, methanol, isopropyl alcohol (such as isopropanol), or mixtures thereof (such as a 50/50 mixture of ethanol/methanol). The liquid process materials listed above can produce carbon and hydrogen separated components. The flow rate of the liquid can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

The process material can be a colloidal dispersion (such as a mixture of solid particles suspended in a liquid or a gas) that is provided through the process material inlet into the FEWGs 905 and 1005. For example, the colloidal dispersion can include carbonaceous particles. Some examples of colloidal dispersions that can be used as process materials are solid particles from the Group 16, Group 14, Group 10, Group 9, Group 5, Group 2, Group 1, alloys thereof, and mixtures thereof, mixed with a liquid or a gas. The solid particles listed above can be mixed with liquids such as water, alkanes, alkenes, alkynes, aromatic hydrocarbons, saturated and unsaturated hydrocarbons (such as of alkanes, alkenes, alkynes, or aromatic hydrocarbons), ethanol, methanol, isopropyl alcohol, or mixtures thereof (such as a 50/50 mixture of ethanol/methanol).

Examples of gases are Group 1 and Group 15-18, as well as inorganic compounds (such as group 14 hydride). Some examples of separated components that can be produced from the colloidal dispersion process materials listed above are solid inorganic materials coated in organic materials (such as silicon coated with graphene), and composite materials with interlayers of organic/inorganic materials (such as a silicon core with a layer of carbon encapsulating the silicon, coated with an additional inorganic layer). The flow rate of the colloidal dispersion can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

The process material can be a gas. The process material can be a hydrocarbon gas, such as $C_2H_2$, $C_2H_4$, $C_2H_6$. The process material can be methane, and the separated components are hydrogen and nanoparticulate carbon. The process material can be carbon dioxide with water, and the separated components are oxygen, carbon, and water. The process material is $H_2S$ and the separated components can include hydrogen gas and sulfur. The process material does not contain carbon dioxide. The process material can be a complex gas-based material, for example $SiH_4$, trimethylaluminum (TMA), trimethylgallium (TMG), glycidyl methacrylate (GMA), $SF_6$, and other materials used in the semiconductor industry for the deposition and etching of metals and dielectrics.

One of the separated components is nanoparticulate carbon such as, but not limited to, carbon black, carbon nano-onions (CNOs), necked CNOs, carbon nanospheres, graphite, pyrolytic graphite, graphene, graphene nanoparticles, graphene platelets, fullerenes, hybrid fullerenes, single-walled nanotubes, and multi-walled nanotubes. One or more of these nanoparticulate carbons may be produced during a particular process run. The separated components can comprise nanoparticulate carbon that is in agglomerate—which may also be described as aggregate—particles. In some cases, the agglomerate or aggregate particles comprise many nanoparticulate carbon particles. The agglomerate or aggregate particles can comprise nanoparticulate carbon particles and have average diameter greater than 50 microns, or greater than 100 microns, or greater than 200 microns, or greater than 300 microns, or greater than 500 microns, or greater than 1000 microns, or from 1 to 1000 microns, or from 10 microns to 1000 microns, or from 100 microns to 1000 microns, or from 100 microns to 500 microns.

Tuning Microwave Energy in Microwave Chemical Processing Systems

Different process materials require different amounts of energy to react into different separated components. In the present disclosure, the available reaction pathways can be selected by changing the average energy of the plasma. The microwave energy coupled to the plasma can be pulsed, and the average energy of the plasma, and therefore the reaction pathways, are selected by controlling the microwave energy pulse duration and frequency, duty cycle, shape, and time-averaged output power level. Additional details of tuning microwave energy in microwave chemical processing systems are disclosed in U.S. Pat. No. 9,812,295, which is owned by the assignee of the present application and is hereby incorporated by reference in its entirety.

The average energy in the plasma can be controlled by changing the pulse period, by choosing a pulsing frequency to achieve a desired plasma energy. Additionally, the average energy of the plasma can be controlled by controlling the duty cycle. This can be understood by contemplating the situation where the time-averaged input power and the pulse period are both held constant and the duty cycle is varied. A shorter duty cycle will increase the magnitude of the power coupled into the chamber when the microwave energy is on. This is advantageous because a relatively low amount of power (such as time-averaged power) can be used to generate reaction products from reaction pathways that would be impossible to facilitate at the same power in a continuous wave.

The reaction pathways can be selected by controlling time-averaged power input into the plasma. For example, if the duty cycle and pulse frequency are held constant, and the power input into the microwave generator is increased, then the energy of the plasma will increase. By way of another example, if the duty cycle and pulse frequency are held constant, and the power is more effectively coupled into the reaction chamber, then the energy of the plasma will increase.

The reaction pathways can be selected by controlling a shape of the microwave energy pulse. The microwave pulse can be a rectangular wave, where the power is constant during the duration of the pulse period when the microwave is on. The pulse power can be not constant during the duration of the pulse period when the microwave power is on. The microwave pulse is a triangular wave, or a trapezoidal wave, or a different wave profile. The plasma can be referred to as diffuse during the time period when the high energy species exist in higher fractions (such as at the beginning of the pulse before the plasma reaches equilibrium). The microwave energy can increase over the time period where the plasma is diffuse, which increases the time average fraction of high energy species in the plasma. As described above, tuning the pulse frequency, duty cycle, and pulse shape can enable the creation of a higher fraction of higher energy species within the plasma for a given time-averaged input power. The higher energy species can enable additional reaction pathways that would otherwise not be energetically favorable.

The techniques above can be further understood by using methane ($CH_4$) as an example process material, to be separated into hydrogen and nanoparticulate carbon. Typically, 4-6 eV is needed to dissociate methane ($CH_4$); however, the plasma energy typically settles at approximately 1.5 eV after an initial ignition energy spike. By pulsing the microwave, the average plasma energy (such as time-averaged plasma energy) is maintained at the higher levels, where the frequency and duration of the pulsing controls the average plasma energy. Specifically, pulsing parameters such as frequency and duty cycle can be controlled to provide an average plasma energy of 4-6 eV to select specific dissociation reactions of the methane. Another advantage of pulsing the microwave energy is that the energy is more distributed throughout the chamber in which microwave is being input.

In conventional systems, at equilibrium the plasma forms a dense layer of ionized species in the chamber towards the location of the microwave input, which absorbs the incoming microwave energy and consequently prevents further microwave energy from penetrating deeper into the chamber. The high frequency pulsing of the present disclosure maintains the plasma in a non-equilibrium state for a greater fraction of time and the dense layer of ionized species is present for a smaller fraction of time, which allows the microwave energy to penetrate deeper into the chamber and the plasma to be generated in a larger volume within the chamber. More generally, in various embodiments of the present disclosure the average energy of the plasma over the entire duration of the pulse period may be from 0.9 eV to 20 eV, or from 0.9 to 10 eV, or from 1.5 eV to 20 eV, or from 1.5 eV to 10 eV, or greater than 0.9 eV, or greater than 1.5 eV. The specific values to which the plasma energy is tuned will depend on the type of process material being utilized.

In the microwave processing systems described above, the microwave energy source is controlled by a microwave emitter circuit (such as 907 in FIG. 9, and 1007 in FIG. 10), that can control the microwave energy emitted from the source to be either continuous wave or pulsed. The microwave emitter circuit can produce microwave energy through the use of a magnetron, such as at 915 MHz, 2.45 GHz, or 5.8 GHz. To control the pulse output power of the microwave energy, the microwave emitter circuit may pulse the magnetron at various frequencies and duty cycles. Each microwave emitter circuit is designed for a specific range of pulsing frequency, duty cycle, shape, and pulse output power level, where the selection of specific values of these parameters is used to tune the chemical reaction pathways in the process material.

The microwave control circuit can enable a pulse frequency from 500 Hz to 1000 kHz, or from 1 kHz to 1000 kHz, or from 10 kHz to 1000 kHz, or from 40 kHz to 80 kHz, or from 60 kHz to 70 kHz, or greater than 10 kHz, or greater than 50 kHz, or greater than 100 kHz. The microwave source can emit continuous wave or pulsed microwave energy with a time-average power from 1 to 100 kW, or from 1 kW to 500 kW, or from 1 kW to 1 MW, or from 10 kW to 5 MW, or greater than 10 kW, or greater than 100 kW, or greater than 500 kW, or greater than 1 MW, or greater than 2 MW. The pulse period has a first duration where the microwave power is on, and a second duration where the microwave energy is off or at a lower power than during the first duration. The second duration can be longer than the first duration. The optimal duty cycle for a given system depends on many factors including the microwave power, pulse frequency, and pulse shape. The duty cycle (such as the fraction of the pulse period where the microwave energy is on, expressed as a percentage) can be from 1% to 99%, or from 1% to 95%, or from 10% to 95%, or from 20% to 80%, or from 50% to 95%, or from 1% to 50%, or from 1% to 40%, or from 1% to 30%, or from 1% to 20%, or from 1% to 10%, or less than 99%, or less than 95%, or less than 80%, or less than 60%, or less than 50%, or less than 40%, or less than 30%, or less than 20%, or less than 10%.

Microwave Chemical Processing Reactors with Multiple Field-Enhancing Waveguides

FIG. 11A through FIG. 11D show block diagrams representing embodiments of microwave chemical processing systems of the present disclosure, in which multiple FEWGs are coupled to one or more microwave energy generators (such as a microwave energy sources). The FEWGs in these embodiments can share some or all of the features of the systems described above. The supply gas and process material inputs in these embodiments can also share some or all of the features described above. Each FEWG can have a reaction zone. A plasma can be generated from a supply gas in a plasma zone in each of the FEWGs, and a reaction length of each of the FEWGs serve as reaction zones to separate the process material into separate components. The reaction zones can be connected together, and the microwave chemical processing system has one outlet for the separated components. The reaction zones can be connected together, and the microwave chemical processing system has more than one outlet for the separated components. Each reaction zone can have its own outlet for the separated components.

Figure 11A:
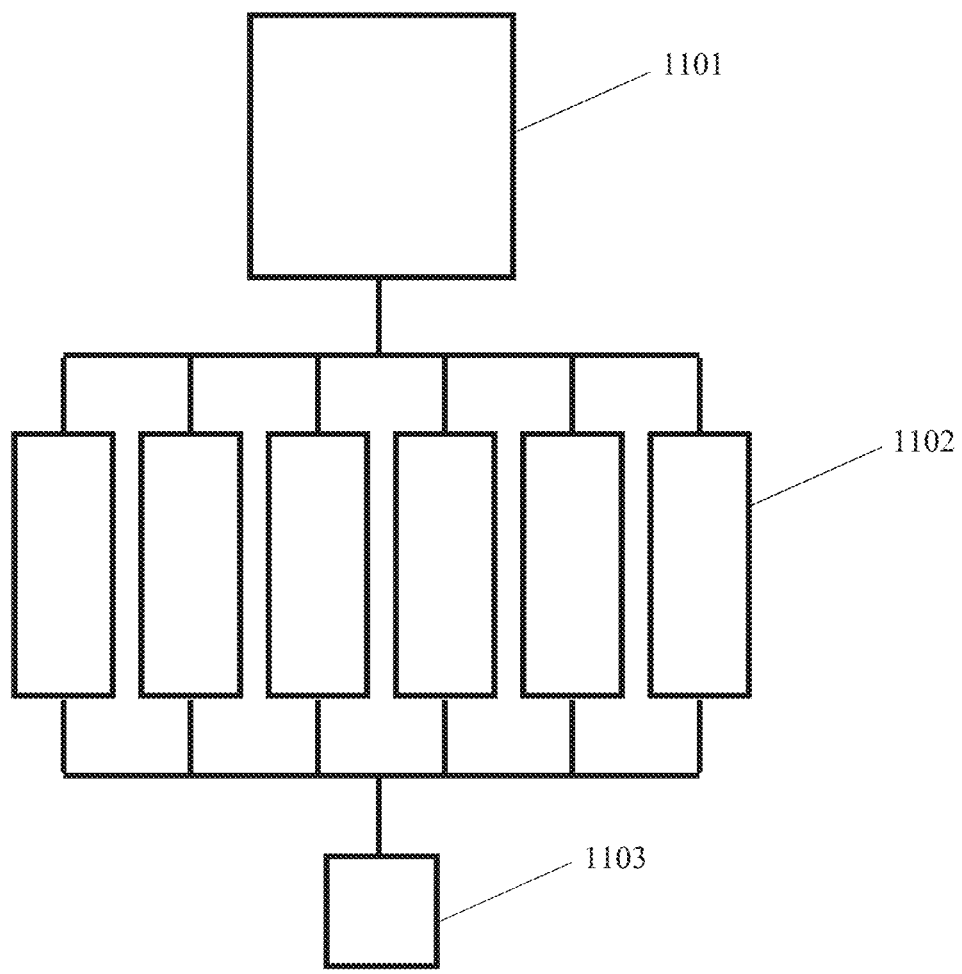
FIGS. 11A, 11B, 11C, and 11D show block diagrams of microwave chemical processing systems having multiple field-enhancing waveguides and multiple microwave energy sources, according to some implementations.
Figure 11B:
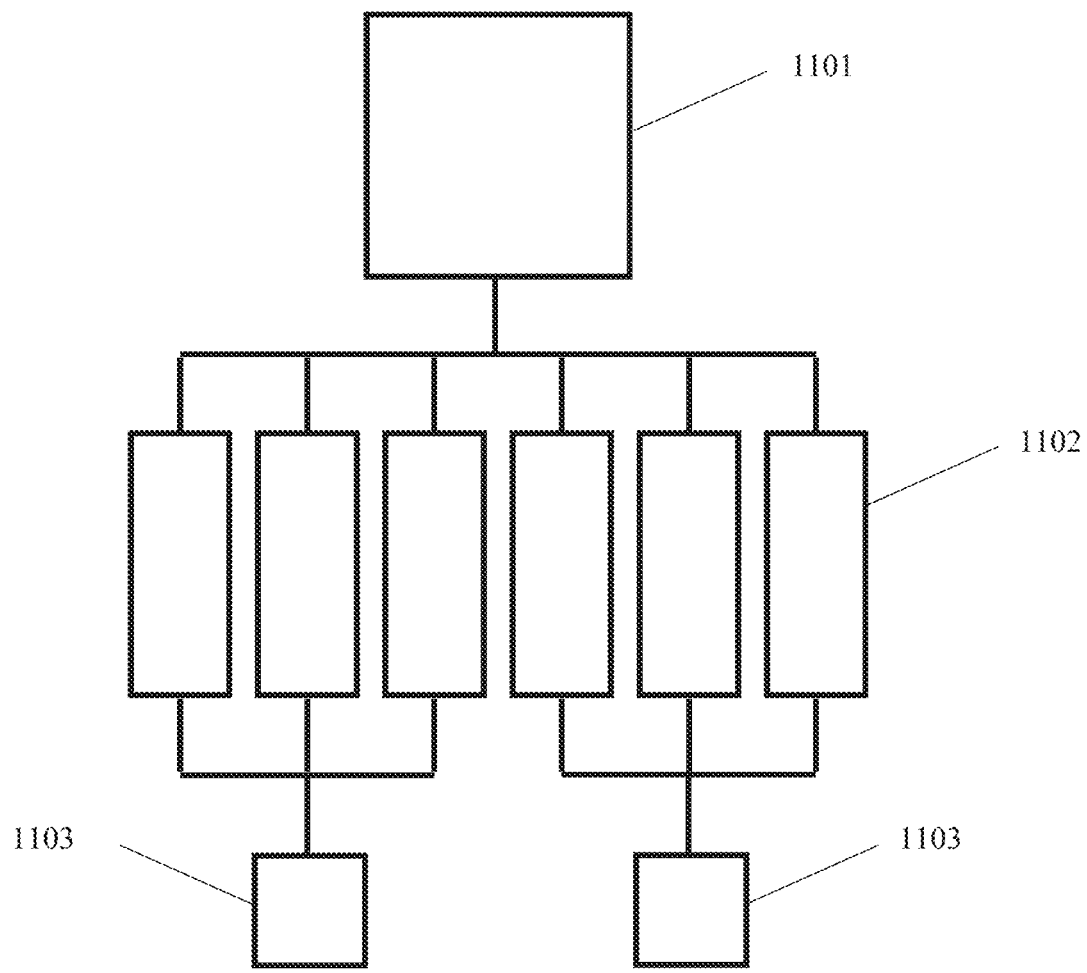
Figure 11C:
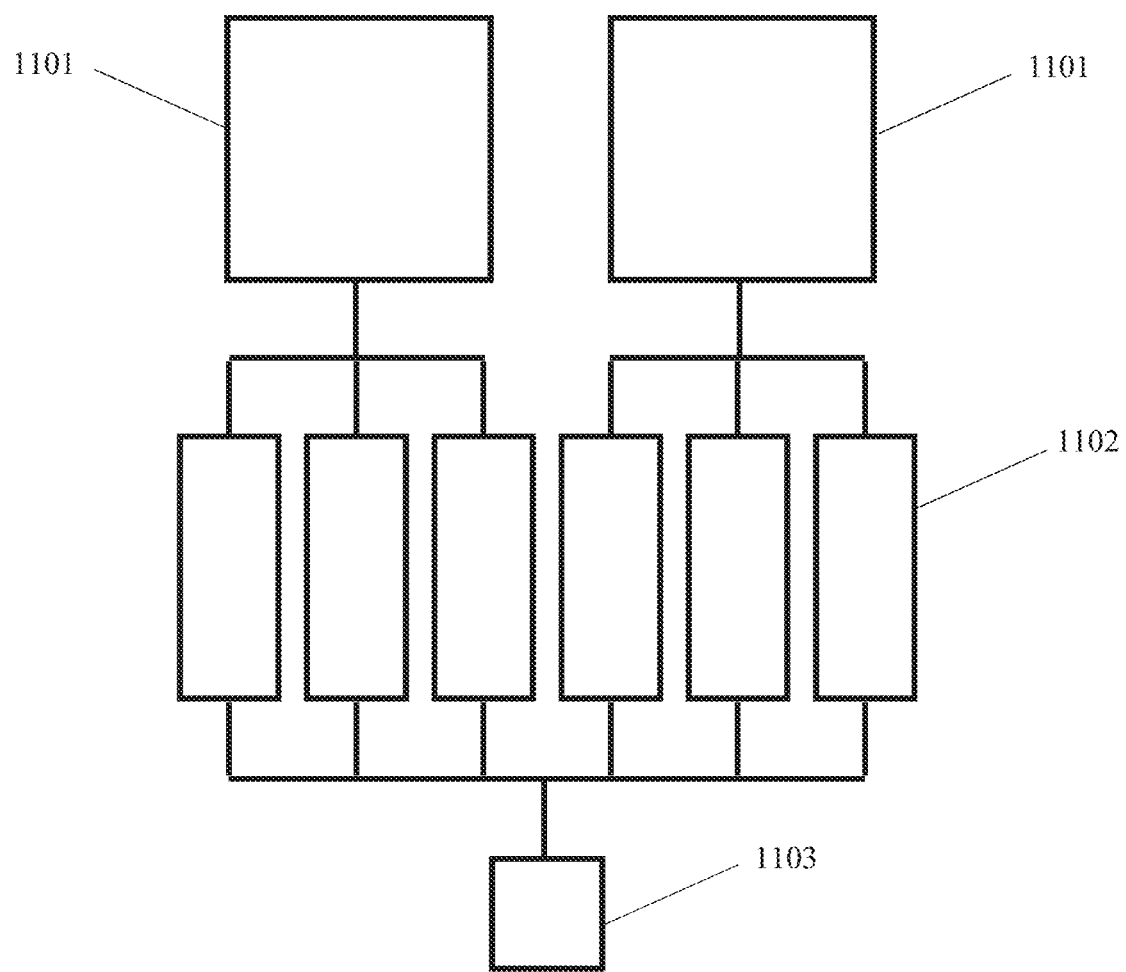
Figure 11D:
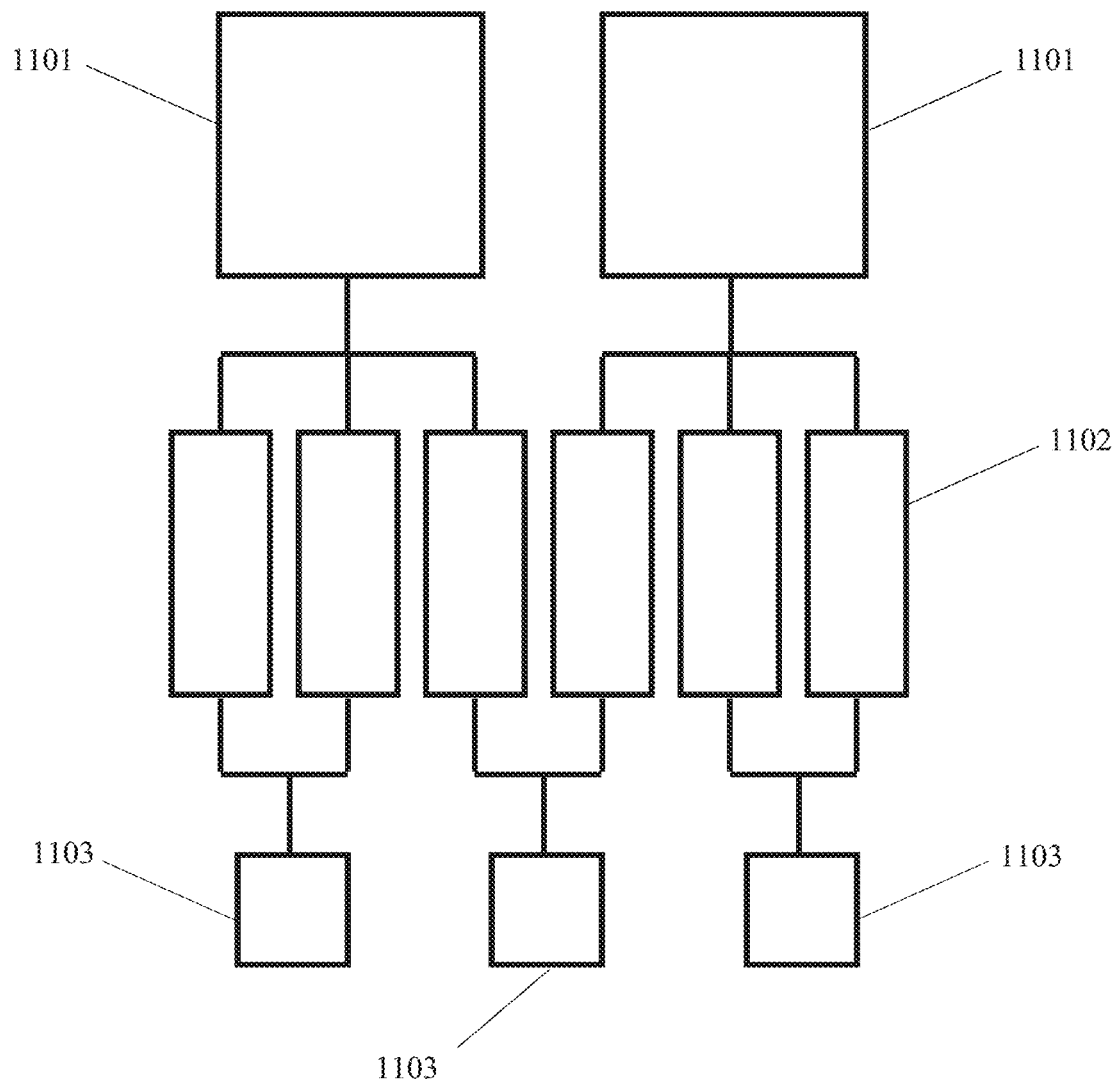

FIG. 11A shows an embodiment where there is one microwave energy generator 1101 coupled to multiple FEWGs 1102, and the reaction zones of the FEWGs are all connected together such that there is a single outlet 1103 to collect the separated components. FIG. 11B shows an embodiment where there is one microwave energy generator 1101 coupled to multiple FEWGs 1102, and the reaction zones of some the FEWGs are connected together such that there more than one outlet 1103 to collect the separated components. FIG. 11C shows an embodiment where there is more than one microwave energy generator 1101 coupled to multiple FEWGs 1102, and the reaction zones of the FEWGs are all connected together such that there is a single outlet 1103 to collect the separated components. FIG. 11D shows an embodiment where there is more than one microwave energy generator 1101 coupled to multiple FEWGs 1102, and the reaction zones of some the FEWGs are connected together such that there more than one outlet 1103 to collect the separated components.

FIG. 11A through FIG. 11D depict 6 FEWGs for illustrative purposes, but there may be fewer or greater than 6 FEWGs in actual implementations. For example, there can be from 1 to 10 FEWGs coupled to each microwave energy generator. The microwave energy from more than one microwave generator can be combined using a power combiner, and then the combined microwave energy can be coupled into more than one FEWG. The microwave energy emitted from such a power combiner can be very large and can be coupled into many FEWGs (such as more than 10). Multiplexing can be used to couple microwave energy into multiple FEWGs from a single microwave energy source.

In one example, the multiplexing is time-division multiplexing which means that the energy is coupled from a microwave energy source into one set of FEWGs at one moment in time, and a switch is used to direct the energy into a different set of FEWGs at a later moment in time. The switch can be used to cycle energy between many sets of FEWGs (such as more than 2, or more than 5, or more than 10) from a single microwave energy source over time, where each set of FEWGs can contain multiple FEWGs (such as more than 2, or more than 5, or from 1 to 10). FIG. 11B depicts two outlets and FIG. 11D depict three outlets, but there can be more than two or three outlets in other FEWG array configurations, where (for example) each FEWG can have its own outlet to collect the separated components. There are from 1 outlet to 10 outlets to collect the separated components. FIG. 11B and FIG. 11D depict 3 FEWGs connected into each outlet, but there can be fewer or greater than 3 FEWGs connected into each outlet, and each FEWG can have its own outlet to collect the separated components. FIG. 11C and FIG. 11D depict two microwave energy generators, but there are more than 2 microwave energy generators. There can be from 1 FEWG to 10 FEWGs connected together into each outlet to collect the separated components.

Figure 12A:
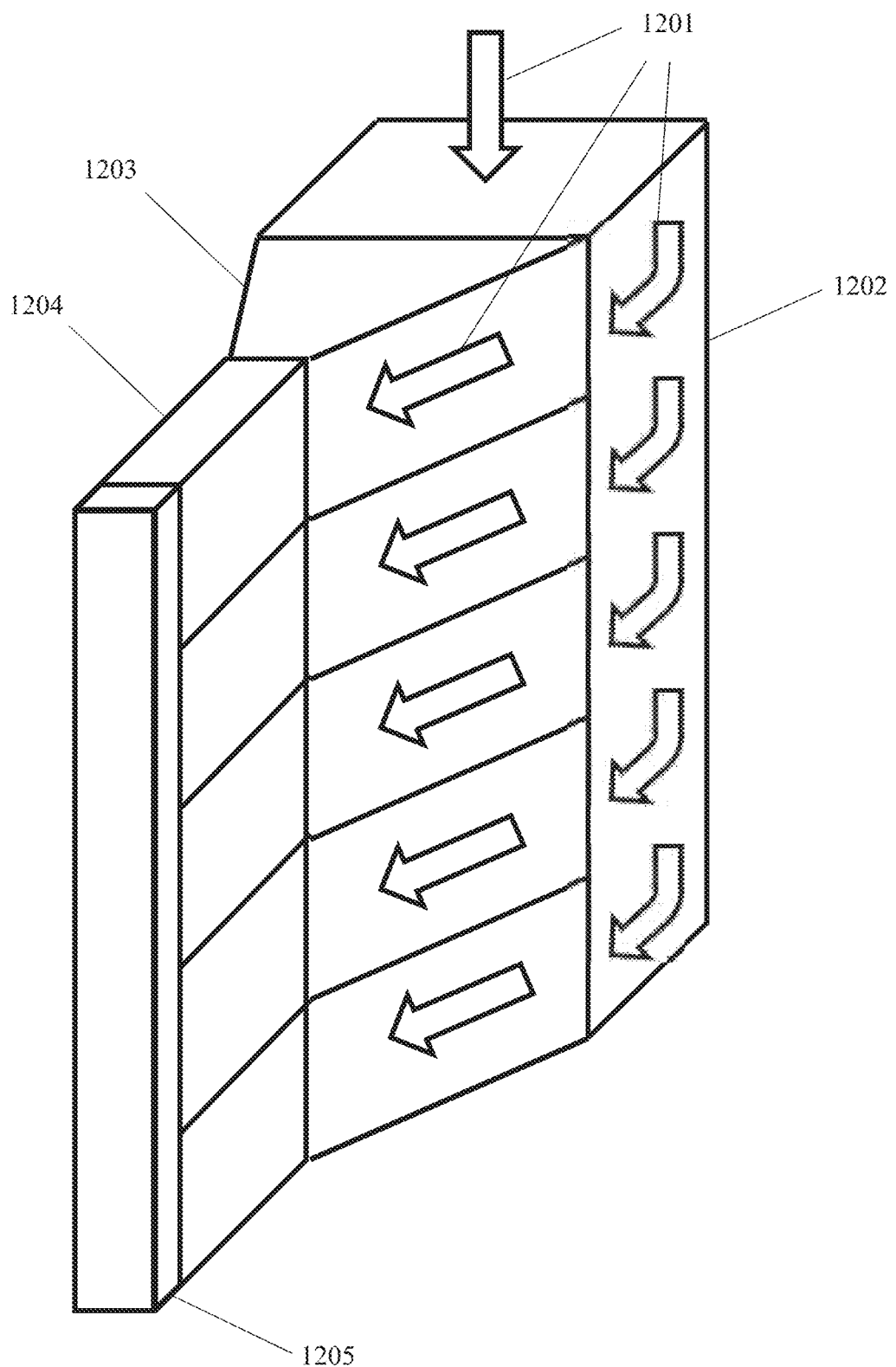
FIG. 12A and FIG. 12B show simplified diagrams of microwave chemical processing systems in which multiple field-enhancing waveguides are coupled to one microwave energy generator, according to some implementations.
Figure 12B:
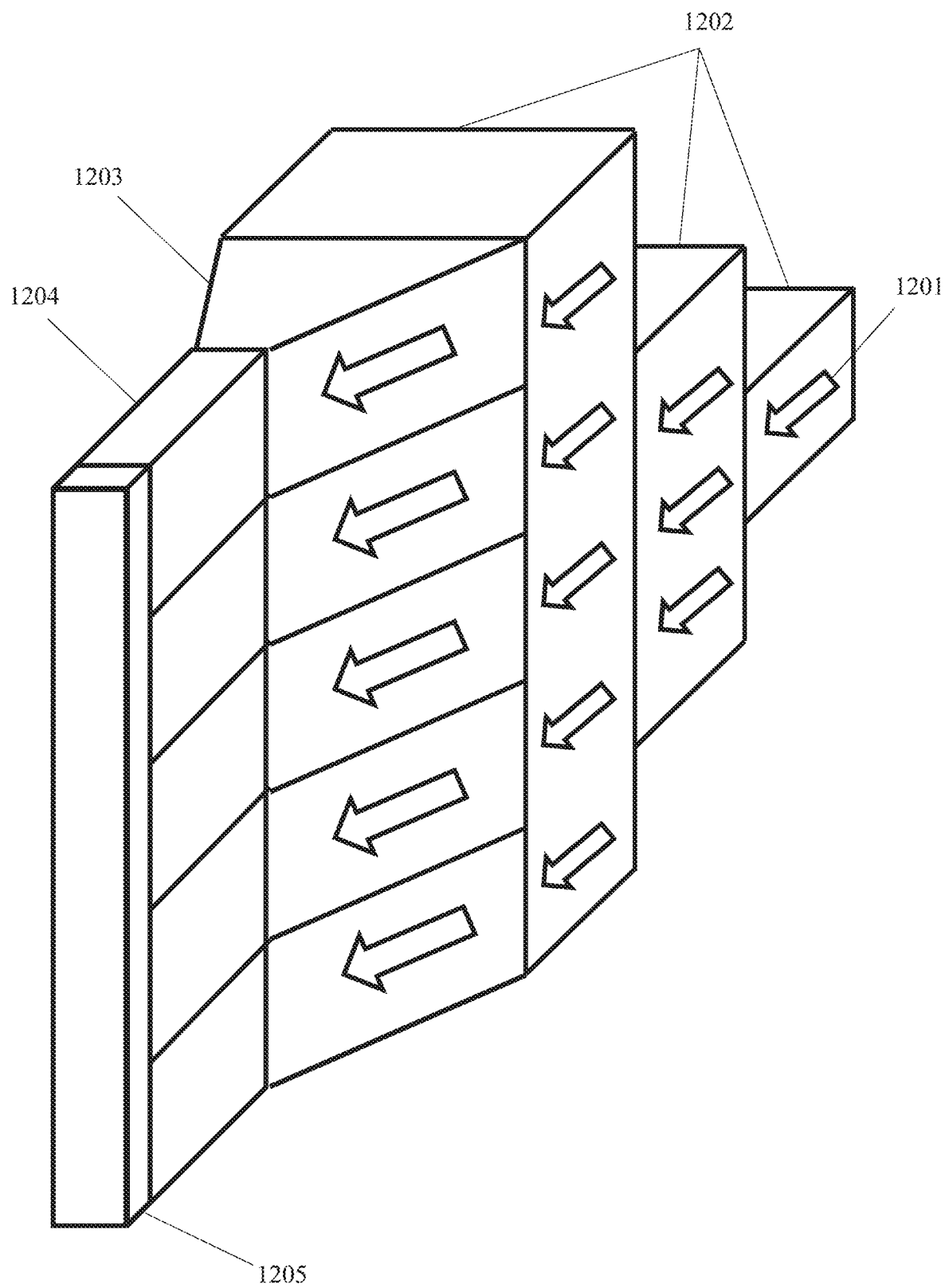

FIG. 12A and FIG. 12B show embodiments of microwave chemical processing systems of the present disclosure, in which multiple FEWGs are coupled to one microwave energy generator (such as microwave energy sources) using different geometries. The FEWGs in these embodiments can share some or all of the features of the systems described above. The supply gas and process material inputs in these embodiments can also share some or all of the features described above. Each FEWG can have a reaction zone. A plasma can be generated from a supply gas in a plasma zone in each of the FEWGs, and a reaction length of each of the FEWGs serve as reaction zones to separate the process material into separate components. The reaction zones can be connected together, and the microwave chemical processing system has one outlet for the separated components. The reaction zones can be connected together, and the microwave chemical processing system has more than one outlet for the separated components. Each reaction zone can have its own outlet for the separated components.

FIG. 12A shows a manifold geometry where there is one microwave energy generator coupled to multiple FEWGs. The microwave energy 1201 is coupled to a manifold waveguide 1202, and then is coupled into multiple FEWGs. The microwave energy enters the large cross-sectional area section of each the FEWGs, then into the field-enhancing zone of the FEWGs 1203 and is then coupled into the smaller cross-sectional area reaction zones of the FEWGs 1204. In the embodiment depicted in FIG. 12A, all of the FEWGs are all connected together such that there is a single outlet 1205 to collect the separated components.

FIG. 12B shows a network geometry where there is one microwave energy generator coupled to multiple FEWGs. The microwave energy 1201 is coupled to a network waveguide 1202, and then is coupled into multiple FEWGs. The specific network waveguide dimensions are dependent on the microwave frequency being used. The microwave energy enters the large cross-sectional area section of each the FEWGs, then into the field-enhancing zone of the FEWGs 1203 and is then coupled into the smaller cross-sectional area reaction zones of the FEWGs 1204. In the implementation depicted in FIG. 12B, all of the FEWGs are all connected together such that there is a single outlet 1205 to collect the separated components.

Although FIGS. 12A and 12B depict one microwave energy generator coupled to 5 FEWGs in a manifold or network geometry, in other implementations, there may be other suitable numbers or instances of the microwave energy generator. The microwave energy from more than one microwave generator can be combined using a power combiner, and then the combined microwave energy can be coupled into more than one FEWG in a manifold or network geometry. The microwave energy emitted from such a power combiner can be very large and can be coupled into many FEWGs (such as more than 10) in a manifold or network geometry. There can be from 1 FEWG to 10 FEWGs coupled to each microwave energy generator in a manifold or network geometry.

Similarly, although FIGS. 12A and 12B depict one outlet, in other implementations, there may be other suitable numbers or instances of outlets. There can be from 1 outlet to 10 outlets to collect the separated components from FEWGs coupled to microwave energy generators in a manifold or network geometry. Similarly, although FIGS. 12A and 12B depict one microwave energy generator coupled to multiple FEWGs, in other implementations, there may be other suitable numbers or instances microwave energy generators. There can be from 1 FEWG to 10 FEWGs connected together into each outlet to collect the separated components from FEWGs coupled to microwave energy generators in a manifold or network geometry.

In some implementations, there can be apertures between the manifold or network geometry waveguides 1202 and the field-enhancing zones of the FEWGs 1203. The dimensions of these apertures are tailored to effectively couple the microwave energy from the manifold or network geometry waveguides 1202 to the field-enhancing zones of the FEWGs 1203. The dimensions of these apertures are different sizes to balance the microwave energy transmission from the manifold or network geometry waveguides 1202 between all of the coupled field-enhancing zones of the FEWGs 1203.

In some implementations, the dimensions of the manifold or network geometry waveguides 1202 can be tailored such that they form a resonant cavity and there is (are) standing wave(s) of microwave energy within the manifold or network geometry waveguides 1202. The standing wave of microwave energy can be tuned to effectively couple microwave energy into each of the coupled field-enhancing zones of the FEWGs 1203.

In some implementations, there can be controlled leakage from the manifold or network geometry waveguides 1202 to the field-enhancing zones of the FEWGs 1203 to effectively distribute the amount of microwave energy coupled into each of the reaction zones of the FEWG 1204. Some examples of designs to control the leakage from the manifold or network geometry waveguides 1202 to the field-enhancing zones of the FEWGs 1203 and effectively distribute the amount of microwave energy coupled into each of the reaction zones of the FEWG 1204 are: changing the cross-section and/or lengths of the waveguides; using apertures between the manifold or network geometry waveguides 1202 and the field-enhancing zones of the FEWGs 1203; changing the angle of orientation between the manifold or network geometry waveguides 1202 and the field-enhancing zones of the FEWGs 1203; using filaments, point sources, electrodes and/or magnets within the manifold or network geometry waveguides or within the FEWGs (as will be discussed in further detail below); and combinations of two or more of these design features.

Additional Features in Microwave Chemical Processing Reactors with Field-Enhancing Waveguides In addition to the above features of microwave processing systems with FEWGs, further features shall now be discussed that can be used in the systems described above. FIG. 6 illustrates a microwave process system with a FEWG, where the plasma is generated in one or more precursor gases, where the precursor gases are inserted upstream from where the process material is flowed into the reaction zone of the FEWG. Precursor gases improve cracking efficiency by adding species of various ionization potentials. That is, different gases have different ionization energies, which is the amount of energy required to remove an electron from an atom or molecule is. In addition, various gases have different pair production (how many electrons per ion can be produced) and secondary electron emission properties (emission of electrons when the charged particles strike a surface). Thus, in the present disclosure the use of precursor gases can be utilized to affect the energy of the plasma.

Figure 13:
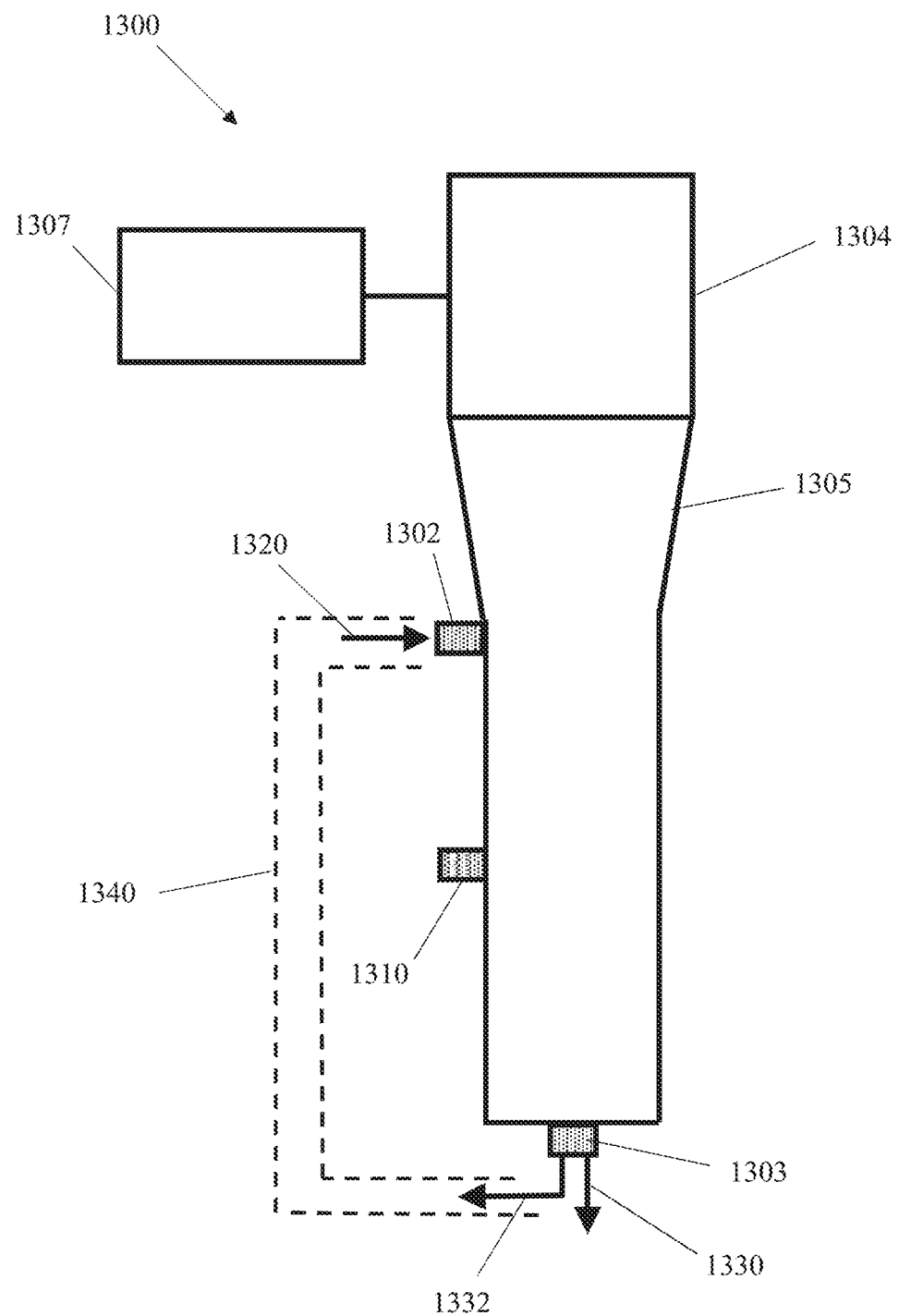
FIG. 13 shows a vertical cross-section of a microwave gas processing system with precursor gas input, according to some implementations.

FIG. 13 shows a microwave gas processing system 1300 that includes a microwave energy generator (such as microwave energy source) 1304, a FEWG 1305, and a microwave emitter circuit 1307, which can be similar or equivalent to the microwave emitter control circuit 140 is generally shown including the microwave energy source 141 presented in FIG. 5. For clarity, the diagram of FIG. 13 is a simplified drawing compared to the previous figures. A supply gas inlet 1302 receives a precursor gas 1320 which supplements the supply gas (not shown) to create the plasma in the waveguide. In various embodiments, the precursor gas 1320 may include one or more of hydrogen, argon, helium, or various noble gases. Process material inlet 1310 is configured to receive the process material that is to be reacted.

One or more of the separated components of the process material can be recycled back into the supply gas and/or process material entering the FEWG 1305. For precursor gases that are not desired output products of the system (such as argon precursor gas in processing of methane), the precursor gases are removed from the separated components 1330 and 1332 that are output from outlet 1303 in post-processing steps. As shown in FIG. 13, gas reactions in the FEWG 1305 produce separated components 1330 and 1332. For example, for methane as a process material, first separated component 1330 may be carbon and second separated component 1332 may be $H_2$ gas (which recombined from atomic hydrogen H+ before being collected at the outlet 1303).

Alternatively, first separated component 1330 may be $CH_2$ and second separated component 1332 may be hydrogen gas $H_2$. The separated component 1332 is recycled back into the FEWG 1305 through conduit 1340, back to supply gas inlet 1302. The recycled separated component 1332 thus is used as a precursor gas 1320. Although it can appear counterintuitive to return the produced separated components back into the reaction system, recycling of the components adds energy to the plasma, and can also contribute to thermal cracking of the process material since the recycled components have already been heated during the gas processing. For example, separated component 1332 can be 2 to 10 slm of $H_2$ that is recycled back into the FEWG 1305, for a process in which a total of 150 to 200 slm of $H_2$ is produced. Other amounts or portions of separated component 1332 may be recycled, as determined by factors such as the flow rate of the process material, and/or the amount of energy desired to be added to the process to initiate the targeted chemical pathways.

To initiate the foregoing chemical pathways, one or more microwave energy sources can be configured to initiate a chemical reactions within the microwave chemical processing reactor.

Some or all of the supply gas contains one or more recycled separated components of the process material. For example, the supply gas can be hydrogen, and the process material can be methane, which is reacted to form hydrogen and carbon, and at least a portion of the hydrogen that is produced from the methane can be recycled and used as the supply gas. Recycling the produced hydrogen beneficially improves the efficiency of the overall gas processing because the plasma formed from the hydrogen is highly efficient at cracking hydrocarbon bonds in the process material molecules. Additionally, the recycled $H_2$ is already at a high temperature, and thus less energy input is needed to achieve a thermal cracking energy. The supply gas is $H_2$ provided by an external source, to which recycled $H_2$ is added. The generated plasma can be a hydrogen plasma.

Figure 14:
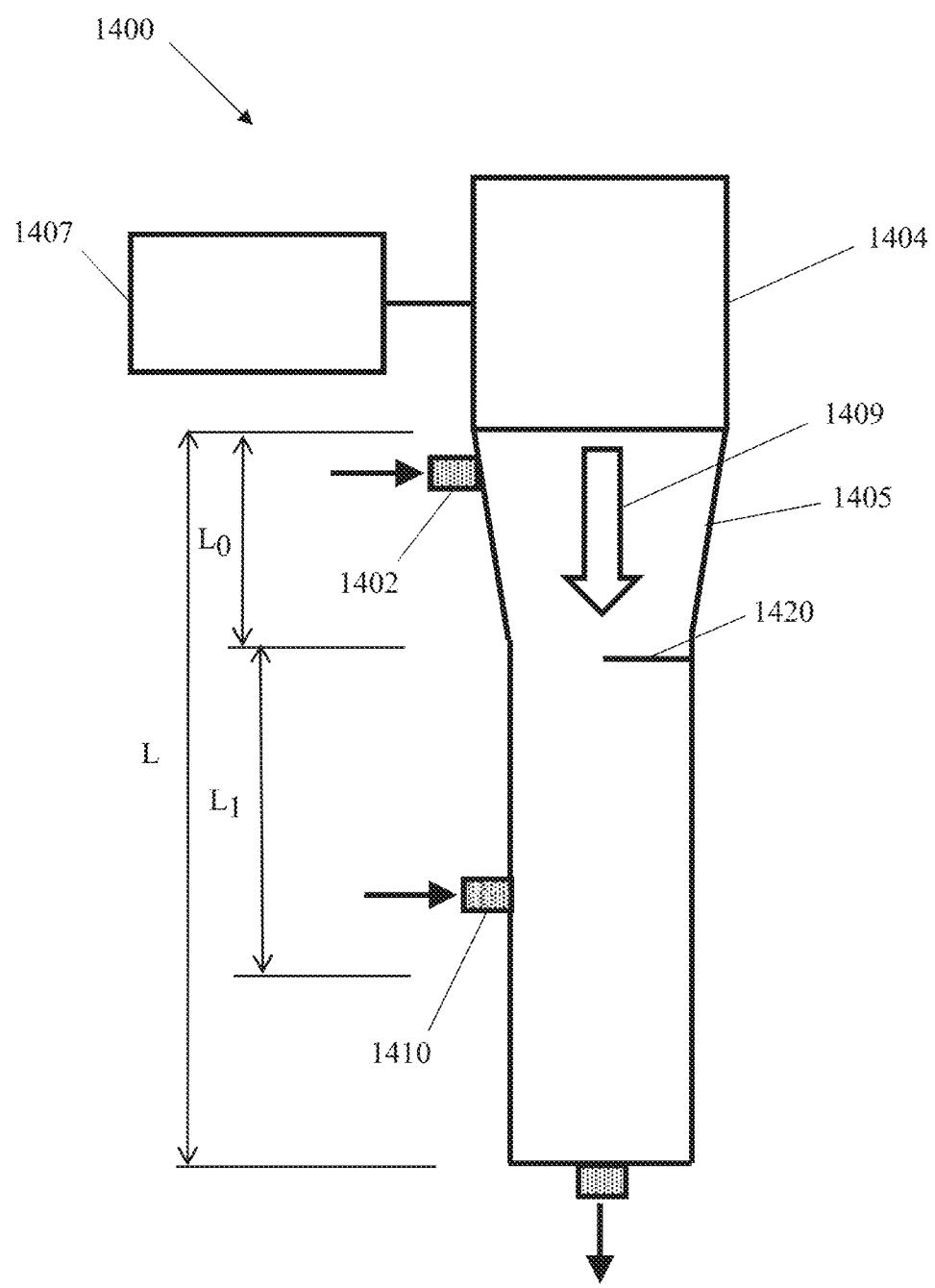
FIG. 14 shows a vertical cross-section of a reactor (such as a reactor coupled to a microwave energy source) having a filament, according to some implementations.

FIG. 14 illustrates a microwave process system 1400 with a FEWG and filaments. In some implementations, the microwave processing system 1400 includes a microwave energy generator (such as a microwave energy source) 1404, a FEWG 1405, and a microwave emitter circuit 1407. Microwave energy 1409 is supplied by the microwave energy source 1404, to propagate in a direction down the length L of the FEWG 1405. In this embodiment, supply gas inlet 1402 is placed near the entrance of the portion $L_0$, rather than at the entrance to the portion $L_1$ (such as the plasma zone). One or more metal filaments 1420 is placed within the FEWG 1405 to assist in the ignition of the plasma and/or the excitation of higher energy species within the plasma. In this implementation, metal filament 1420 is downstream of the supply gas inlet 1402, near the entrance to the plasma zone portion of the FEWG $L_1$ (with a smaller cross-sectional area than the FEWG closer to the microwave energy generator).

The filament 1420 may be located at other locations within portion $L_1$ of the overall length L of the FEWG 1405, where $L_1$ is the region in the waveguide where the plasma is formed as described in relation to previous embodiments. The filament 1420 is located within portion $L_1$ of the FEWG and upstream of the process material inlet 1410, so that it will be located outside of the portion $L_2$ (such as length $L_2$ shown in FIG. 9) where reactions are taking place, and which could coat the filament with reacted species. The presence of filament 1420 can reduce the plasma ignition voltage by providing an ignition site, by focusing the electric field of microwave energy 1409. Additionally, the filament 1420 can become heated and emit electrons through thermionic emission, which further contributes to reducing the plasma ignition voltage. Although the filament 1420 is illustrated as a single wire in this embodiment, filament 1420 may take other configurations such as a coil or multiple filaments. The filament 1420 can be tungsten. The filament may be actively energized (powered) or may be passive. The filament 1420 can be an osmium filament (such as configured as a plate, or coil, or other shape) adjacent to a heater coil. The filament 1420 can be a ferrous material in the field of an inductive coil. The filament 1420 is actively heated where the active components (such as heating source components) are located outside of the FEWG 1405 and the filament material that is being heated is inside of the FEWG 1405.

Figure 15:
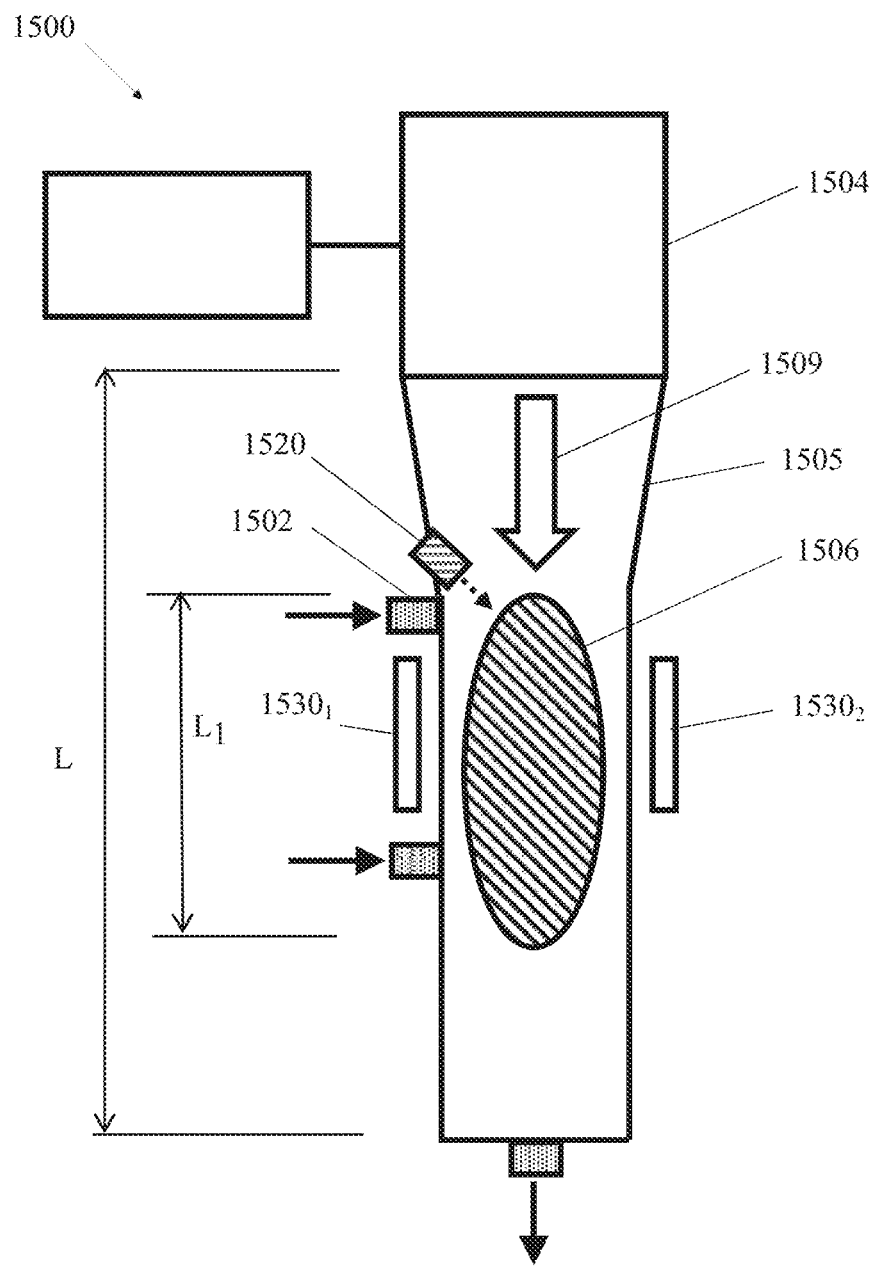
FIG. 15 shows a vertical cross-section of a reactor (such as a reactor coupled to a microwave energy source) including any one or more of an electron source and a pair of electrodes, according to some implementations.

FIG. 15 shows a reactor system 1500 in which an energy source 1530 extends substantially alongside the FEWG 1505 and/or may be similarly positioned with any one or more of the FEWGs disclosed herein. In some implementations, the energy source 1530 can be embodied as one or more electrodes, or one or pairs of co-planar electrodes oriented along a common vertical axis extending lengthwise through a center of the FEWG 1505. Each pair of electrodes can comprise a positive electrode (referred to as a "cathode") and a negative electrode (referred to as an "anode"). "Electrode", as generally understood and as referred to herein, implies an electrical conductor used to contact with a nonmetallic part of a circuit. In alternative, or in addition to, configurations of the energy source 1530 incorporating one or more electrodes, the energy source can be embodied as (or otherwise incorporate), an electron gun, referring an electrical component in some vacuum tubes that produces a narrow, collimated electron beam that has a precise kinetic energy. Such an electron gun configuration can include several constituent parts, such as a hot cathode, which is heated to create a stream of electrons via thermionic emission, electrodes generating an electric field to focus the electron beam (such as a Wehnelt cylinder), and one or more anode electrodes which accelerate and further focus the beam.

Further, the energy source can be configured, in addition or alternative to the configurations discussed, as a flow heater and/or reactor providing for the transfer of thermal energy (as heat) for ultra-fast heating of liquid and viscous fluid materials (such as the supply gas provided by the supply gas inlets 1502 and/or process input materials, which can also be flowed through, in some implementations, the supply gas inlets 1502). In some implementations, the energy source 1530 may be used independently of, or in any combination with the recycled precursor gases 1320 of FIG. 13, the filaments 1420 of FIG. 14, or the electron source 1520 of FIG. 15. The system 1500 can include one or more sets of energy sources 1530, where any one or more of the energy sources 1530 can be configured to supply energy (such as in the form of thermal and/or electromagnetic energy, among other forms of energy) to the plasma 1506. The energy sources 1530, when embodied as a pair of oppositely charged co planar electrodes flanking the FEWG 1505 (such as that shown in FIG. 15) can be configured to generate an electric field within the portion $L_1$ of the overall length L of the FEWG 1505. $L_1$ refers the region in the FEWG where the plasma is formed as described above. The energy source 1530 (when embodied as a pair of oppositely charged co planar electrodes flanking the FEWG 1505) can be energized to a particular voltage to accelerate a gaseous and/or plasma-based species (that becomes charged upon receiving energy from the energy source 1530) within the plasma 1506 to a desired extent, thus permitting of the precise control of an energy level (measured as a temperature, or some other type of energy measurement) of the plasma 1506.

The energy source 1530 of this implementation can be configured to function with continuous wave microwave energy input (as provided by, for example, the microwave processing system 1500) and is also effective when used in combination with a pulsed microwave input. For example, in conventional systems that have electrodes and use continuously provided microwave energy, the plasma 1506 located between the energy sources 1530 will tend to localize there at equilibrium. The plasma 1506 can screen (referring to at least partially blocking or otherwise impeding) exposure to an electric field generated by the energy sources 1530 (such as when embodied as a pair of co-planar electrodes), which can in turn limit the ability of the energy sources 1530 to add energy to the plasma 1506. In contrast, when supplied microwaves are pulsed, the plasma 1506 can exist in a non-equilibrium state (referring to a plasma which is not in thermodynamic equilibrium, because the electron temperature is much hotter than the temperature of heavy species such as ions and neutrals) for a larger portion of an overall processing time. As a result, the plasma 1506 can exist in an equilibrium state for the balance of the overall processing time and will thus screen the electric field generated by the energy sources 1530 for a smaller fraction of the overall processing time.

As shown in FIG. 15, the energy source 1530 may be used independently of, or in combination with, the recycled precursor gases 1320 of FIG. 13, the filaments 1420 of FIG. 14, or the electron source 1520 of FIG. 15. The system 1500 contains one or more sets of electrodes 1530 to add energy to the plasma. The electrodes are configured to generate an electric field within the portion $L_1$ of the overall length L of the FEWG 1505, where $L_1$ is the region in the FEWG where the plasma is formed as described above. Energy source 1530 is shown in FIG. 15 as a pair of coplanar electrodes of opposite charges, that are on the exterior of and on opposite sides of the portion of the FEWG 1505 where the plasma 1506 is generated, although other energy source types are possible (such as thermal energy sources including heaters). The electrodes can be energized to a particular voltage to accelerate the charged species within the plasma to a desired degree, thus controlling the plasma energy. The electrodes of this embodiment can be used with continuous wave microwave energy (such as that applied in a general direction 1509 from a microwave energy generator 1504) and are particularly effective in combination with a pulsed microwave input. In conventional systems with electrodes and continuous microwave energy, the plasma between electrodes will localize (such as near the electrodes) at equilibrium and screen the electric field from the electrodes, which limits the ability of the electrodes to add energy to the plasma. However, when the microwaves are pulsed, the plasma will exist in the non-equilibrium state for a larger fraction of time and will screen the electric field of the electrodes for a smaller fraction of time.

The microwave processing systems of the present disclosure will include magnets (not shown) to confine the plasma in the reaction zone and reduce the ignition voltage for generating the plasma. The magnets are permanent or are electromagnets. The magnets can be positioned so the plasma density distribution can be controlled. The magnets will increase the plasma density in the portion L1, which will improve the efficiency by which the process material is separated by the plasma. The local impedance within the FEWG is tailored using filaments, point sources, electrodes and/or magnets. Filaments, point sources, electrodes and/or magnets are used to increase the density plasma within the reaction zone of the FEWG.

As previously described, microwave energy generators coupled to FEWGs containing reaction zones with the combination of pulsed microwave energy, high gas flows (such as greater than 5 slm), large volumes of plasma (such as up to 1000 L), high pressures (such as greater than 0.1 atm or greater than 0.9 atm, or greater than 2 atm), either filaments or electron sources to assist in plasma ignition at the start of each pulse, and/or electrodes to further add energy to the plasma can enable cost-effective high-productivity chemical gas processing systems, with low energy input requirements.

The microwave processing systems with the above features are configured in such a way that the plasma is generated and the process material is separated into components within the FEWG itself, such as the examples depicted in FIG. 9, FIG. 10, FIG. 11A through FIG. 11D, FIG. 12A and FIG. 12B, FIG. 13, FIG. 14, and FIG. 15. In such systems, microwave energy enters the system upstream of the reaction generating the separated components, and therefore the problem of the separated components building up on a microwave entry window of a reactor and absorbing the microwave energy before it can generate the plasma is alleviated. The portion of the FEWG where the separated components are generated acts as a reaction chamber, and the supply gas flow and/or the process material flow through the reaction chamber is parallel to the propagation direction of the microwave energy in the FEWG. The microwave energy enters the FEWG upstream of the portion of the FEWG acting as a reaction chamber where the separated components are generated.

Gas recycling, filaments, and electron sources can be used in microwave gas processing systems with FEWGs utilizing continuous wave (CW) microwave energy. In configurations with CW microwave energy, gas recycling, filaments, and electron sources would still be advantageous to improve the gas processing efficiency of the system, reduce the ignition voltage of the plasma, and control the density distribution of the plasma. The separated components can adhere to the walls of the FEWG downstream of the reaction generating the separated components, despite the large volume of the reaction zone in the FEWG. Although this does not prevent the plasma from being generated, it still represents a loss of production and a source of contamination in the system. Therefore, the gas flow of the supply gas and the process material can be designed to generate a plasma near the areas of deposition to remove the separated products that are deposited on the waveguide walls (or reaction chamber walls). In some implementations, additional inlets of supply gas and/or process material can be configured to direct the gases to the areas of deposition to remove the separated products that are deposited on the waveguide walls (or reaction chamber walls).

Methods of Microwave Gas Processing

Figure 16:
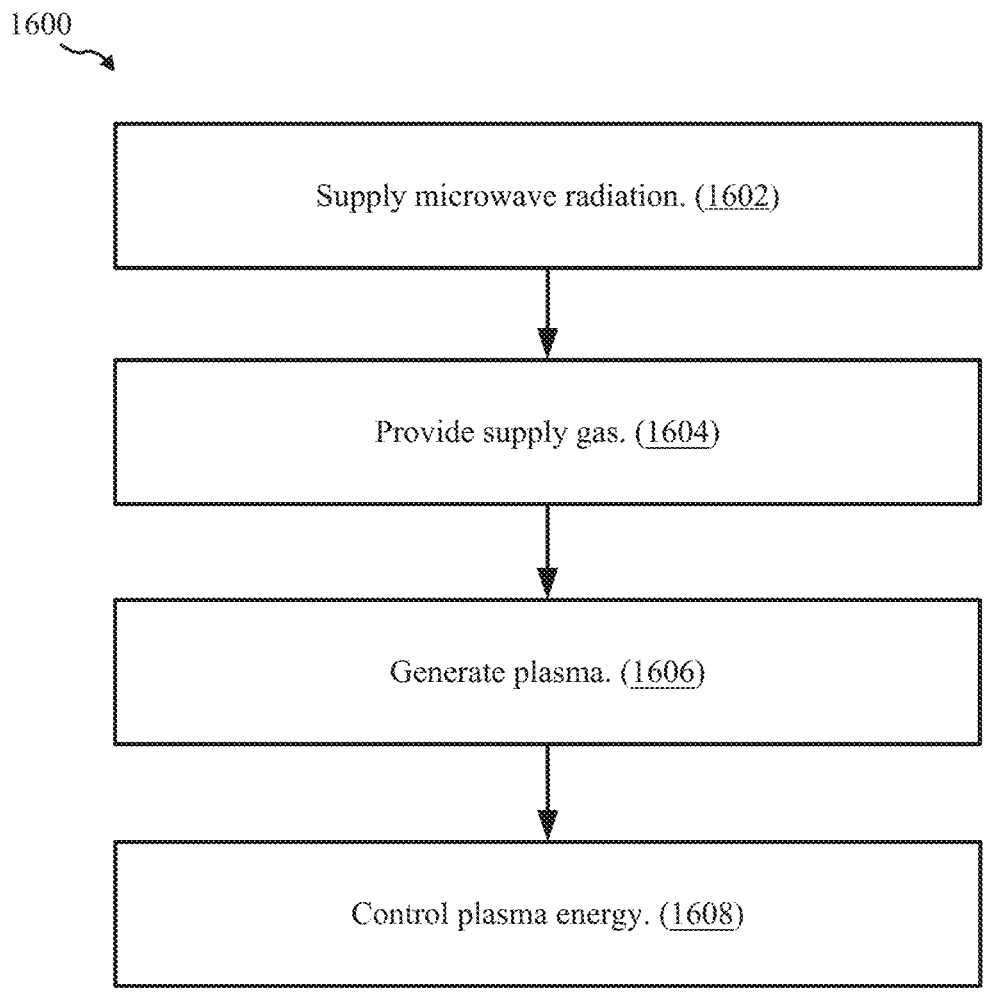
FIG. 16 shows an example flow chart of an example method for supplying microwave radiation (such as microwave energy) to energize and/or excite a supply gas and generate a plasma based on the excited supply gas, according to some implementations.

FIG. 16 is an example flow chart 1600 representing methods for microwave processing of gas, using chemistry control in high efficiency gas reactions with FEWGs. In block 1602, microwave energy is supplied through a FEWG having a length, where the microwave energy propagates in a direction along the FEWG. The microwave energy may be pulsed or continuous wave. The microwave energy is supplied into the FEWG with a time-average power less than 100 kW, or from 1 kW to 100 kW, or from 1 kW to 500 kW, or from 1 kW to 1 MW, or from 10 kW to 5 MW, or greater than 10 kW, or greater than 100 kW, or greater than 500 kW, or greater than 1 MW, or greater than 2 MW. A pressure within the FEWG is at least 0.1 atmosphere, such as from 0.9 atm to 10 atm. In block 1604, a supply gas is provided into the FEWG at a first location along the length of the FEWG, where a majority of the supply gas is flowing in the direction of the microwave energy propagation. In block 1606, a plasma is generated in the supply gas in at least a portion of the length of the FEWG. A process material can be added into the FEWG at a second location downstream from the first location. A majority of the process material can flow in the direction of the microwave propagation at a flow rate of greater than 5 slm.

Optionally in block 1608, an average energy of the plasma is controlled to convert the process material into separated components. The average energy may be, for example, 0.8 eV to 20 eV. The pulsing frequency can be controlled, where the pulsing frequency is greater than 500 Hz. For example, the pulsing frequency of the microwave energy may be from 500 Hz to 1000 kHz. The duty cycle of the pulsed microwave energy can be controlled in addition to or instead of the pulsing frequency, where the duty cycle is less than 50%.

Note that the operations of FIG. 16 may be performed in sequences other than what is shown. For example, process gas can be added at the same point as the block 1604; that is, prior to the block of generating a plasma in block 1604. In another example, controlling of the plasma energy in block 1608 can be performed in conjunction with the generation of plasma in block 1606. The conditions in the afterglow can be controlled with different forms of energy input. As one specific example, the afterglow conditions can be controlled with microwave energy. This microwave energy can be directly used to either expand the plasma plume or heat the particles in the region. This feature expands the plasma, thereby accommodates tuning of the time the particles spend in the plasma. This feature further facilitates control on the gas phase chemistry, particle charging, and particle heating processes of the particles throughout this region. Control of these parameters lead to control over particle morphology. Alternatively, the energy source in this region can be chosen such that the plasma is not formed and instead the particles are heated, leading to direct control of the particle temperature. This in turn allows for controlling the growth kinetics and therefore the morphology of the particles. One implementation of the juxtaposition and use of energy sources positioned along the length of the FEWG is shown and discussed as pertains to FIG. 15.

Figure 17E:
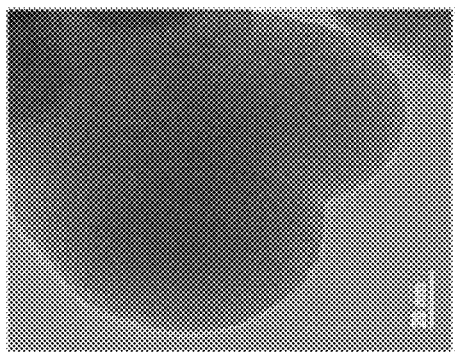
FIG. 17A through FIG. 17Y depict structured carbons, various carbon nanoparticles, various carbon-based aggregates, and various three-dimensional carbon-containing assemblies that are grown over other materials, according to some implementations.
Figure 17D:
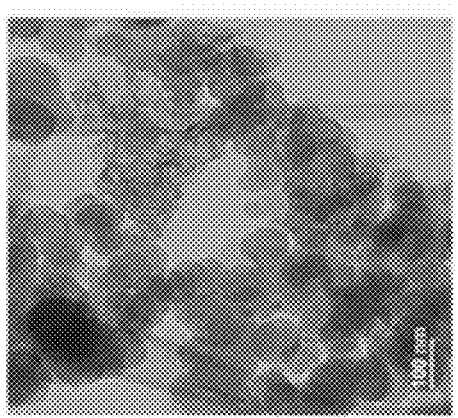
Figure 17F:
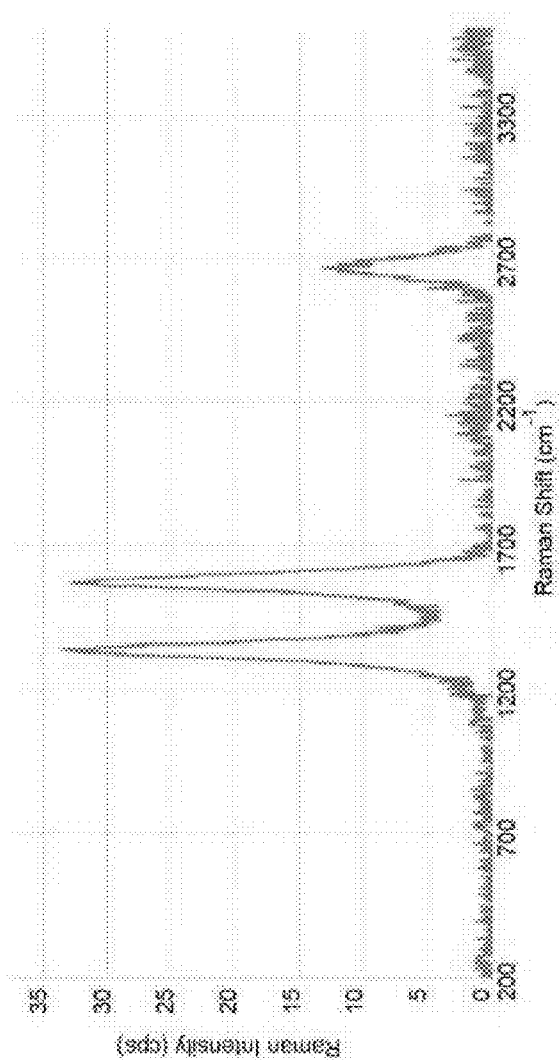
Figure 17K:
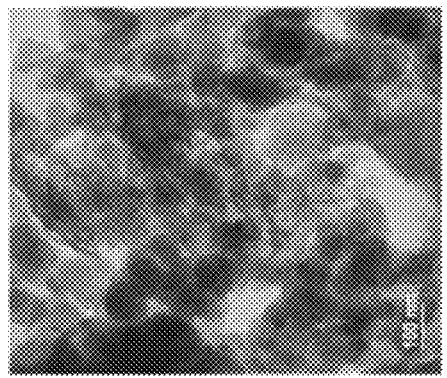
Figure 17L:
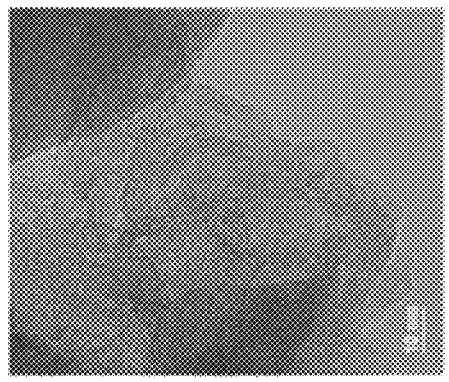
Figure 17M:
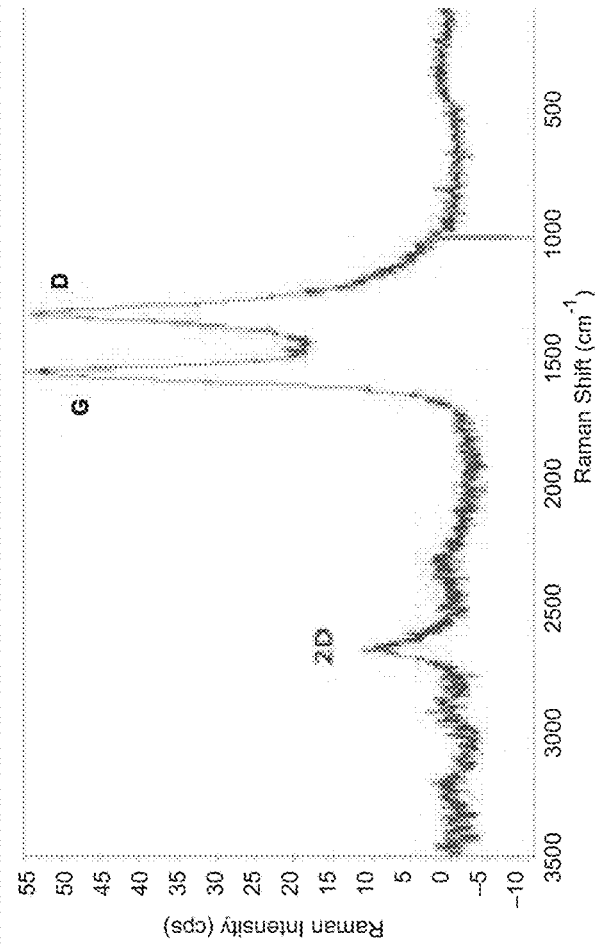
Figure 17O:
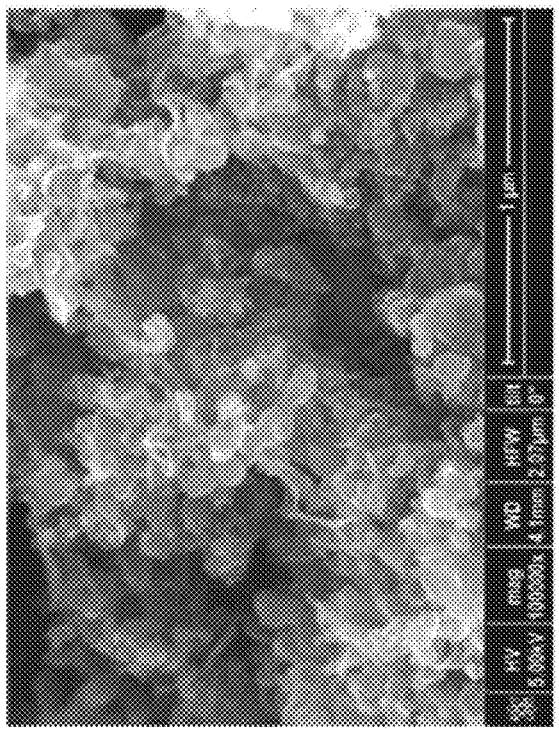
Figure 17N:
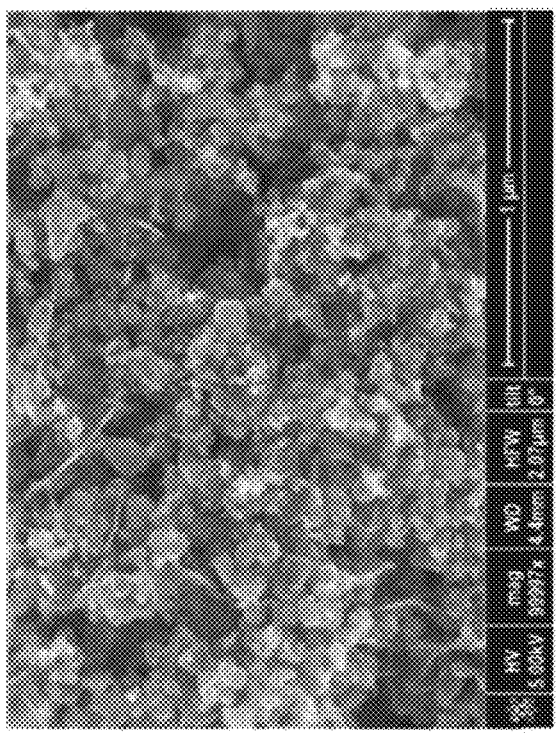
Figure 17P:
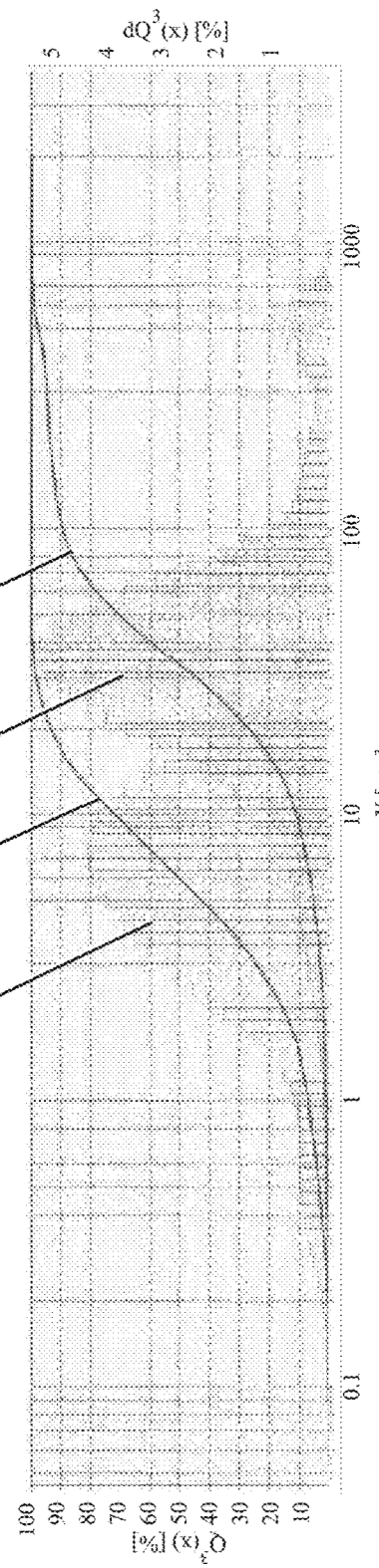
Figure 17Q:
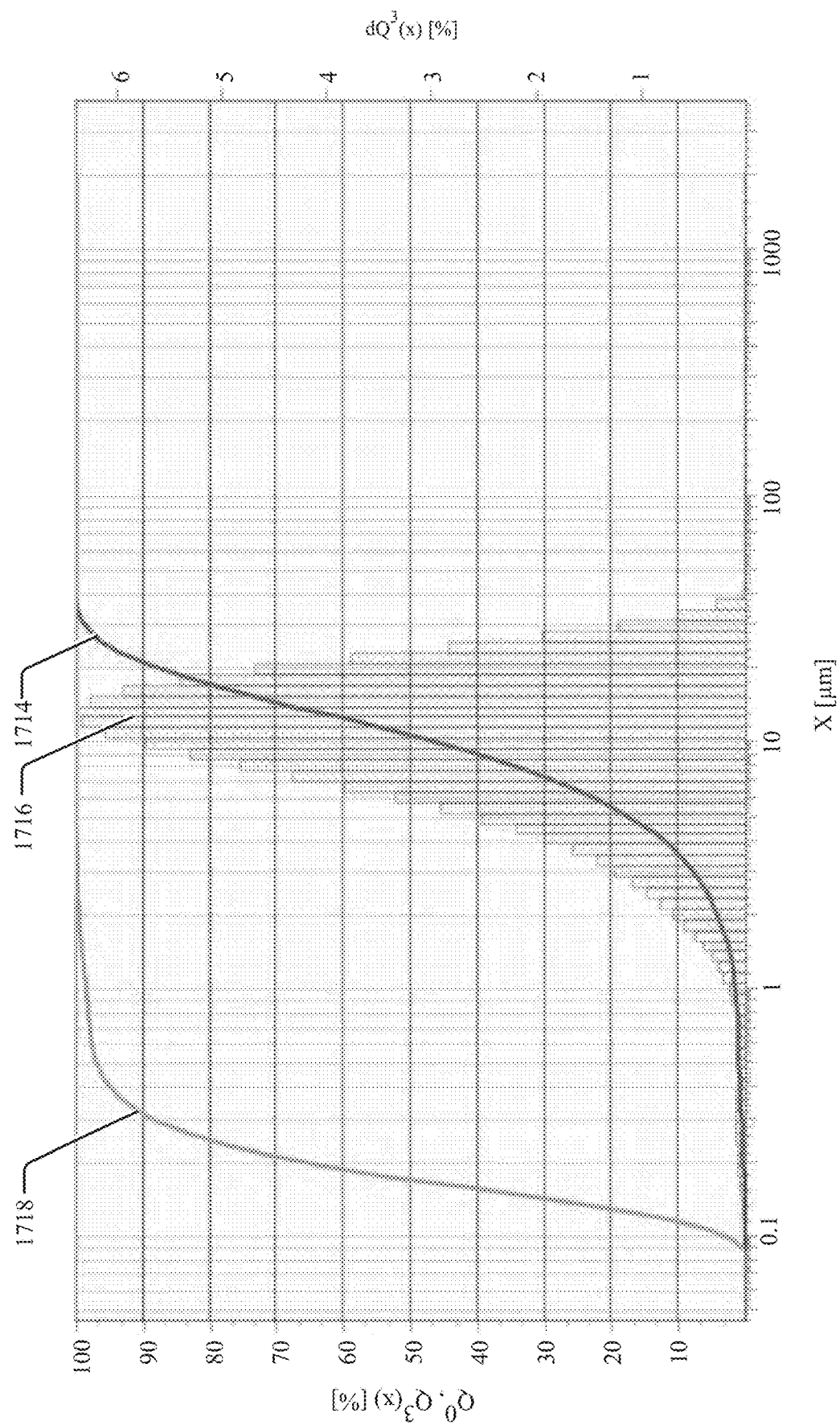
Figure 17R:
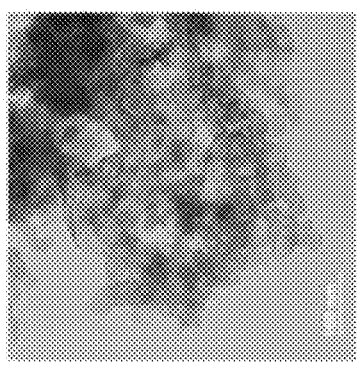
Figure 17S:
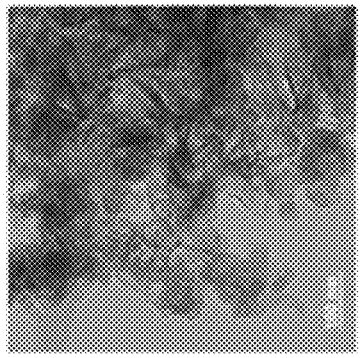
Figure 17T:
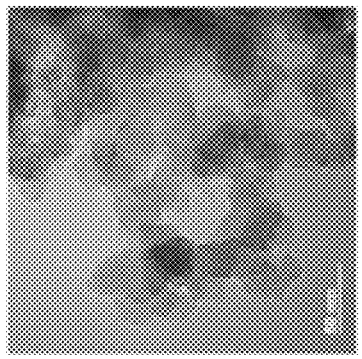
Figure 17U:
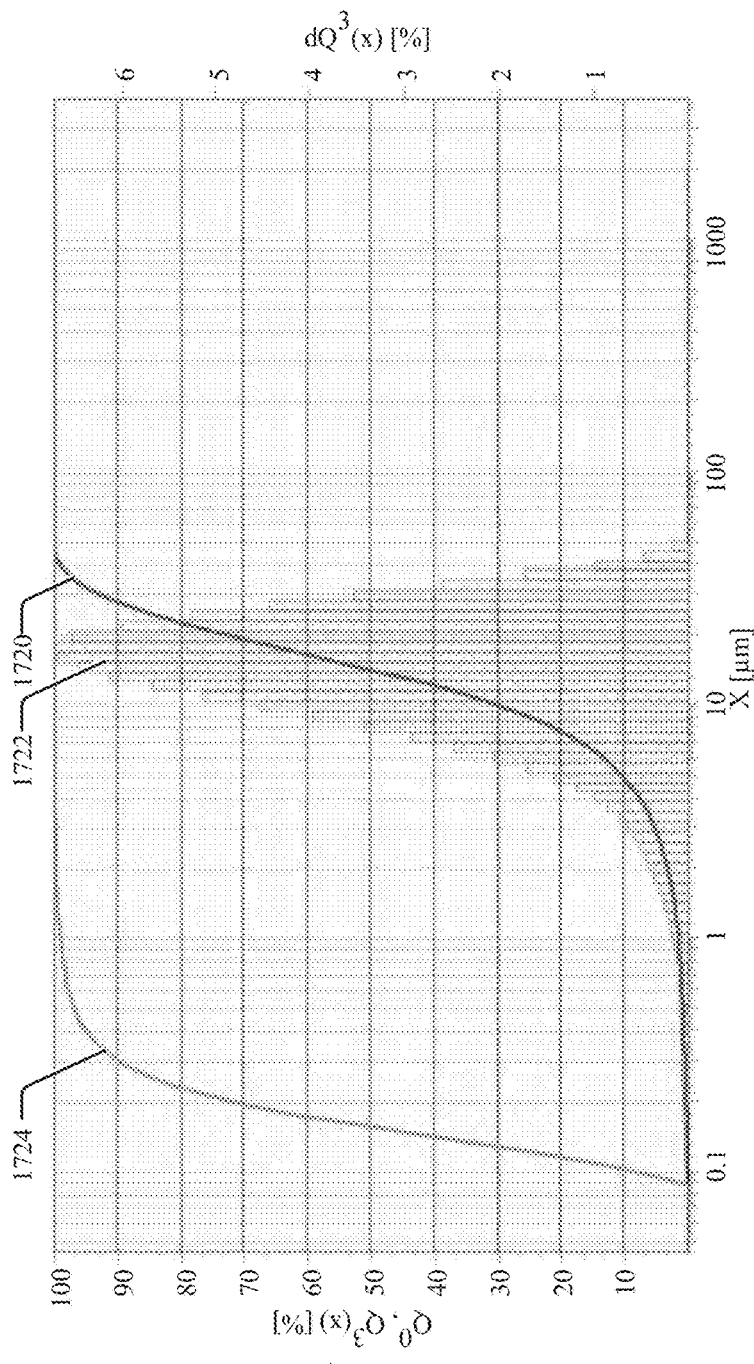
Figure 17V:
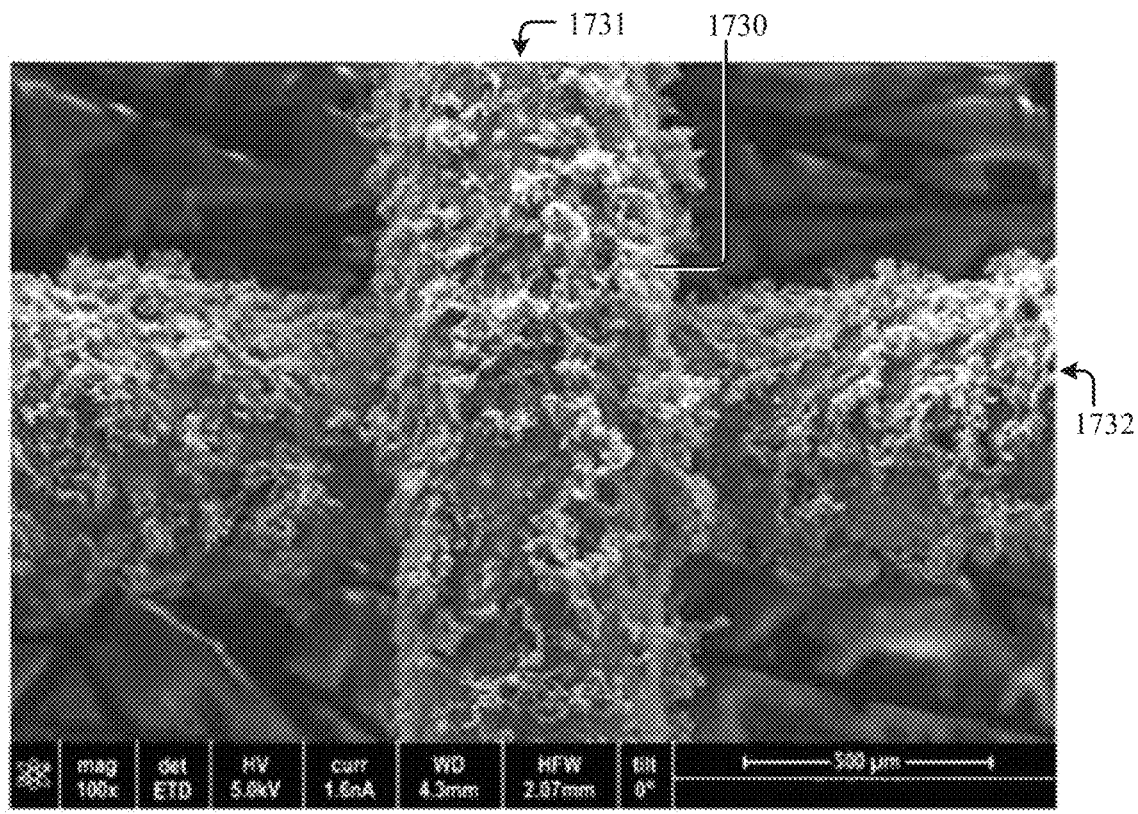
Figure 17W:
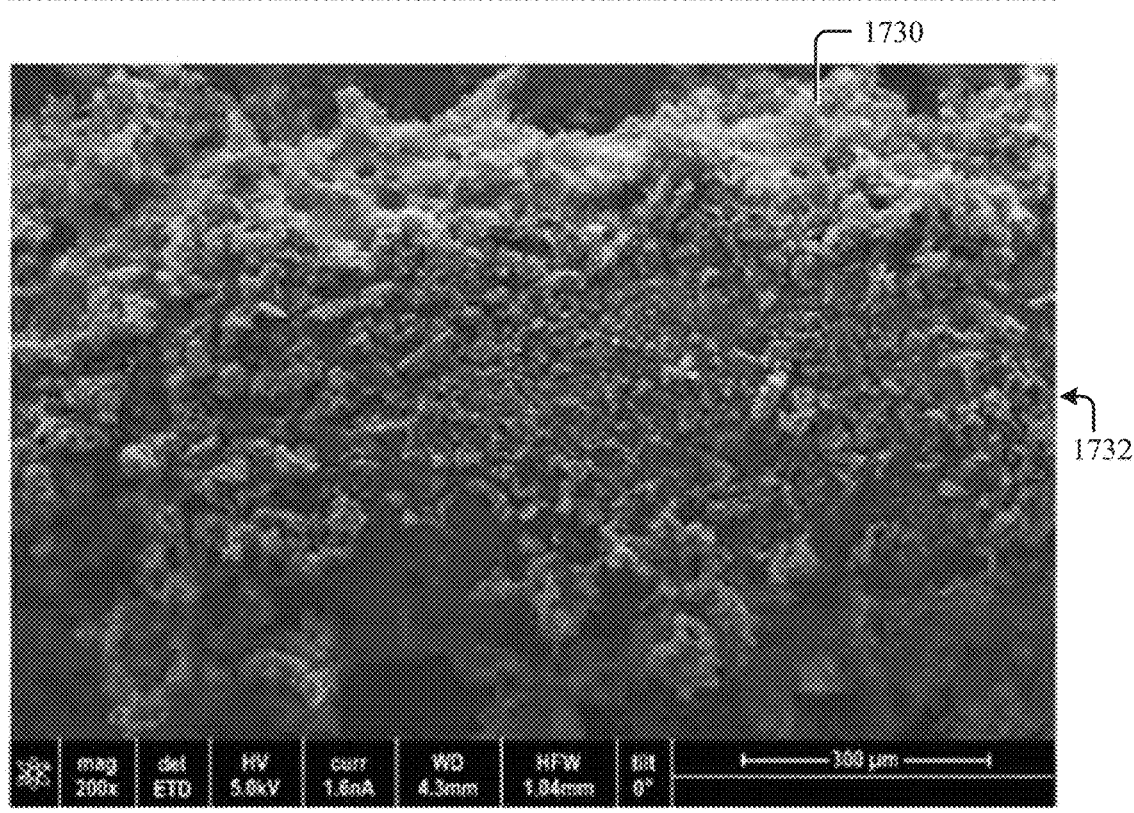
Figure 17X:
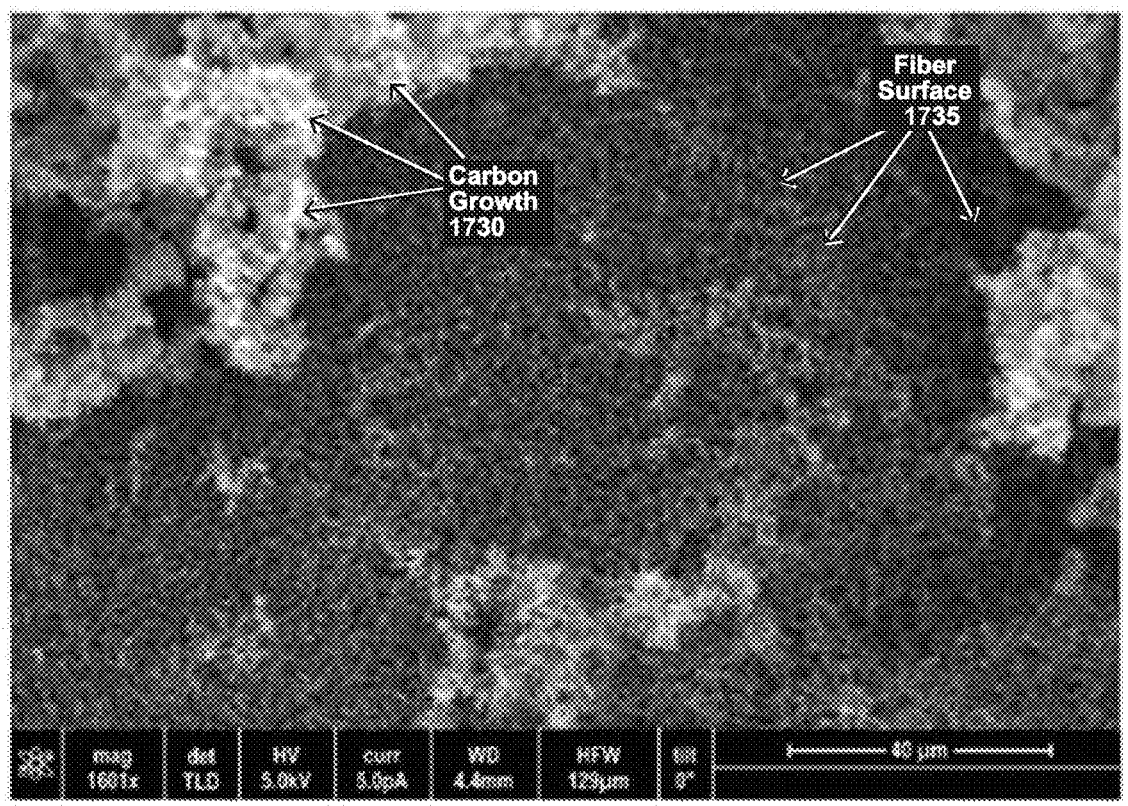
Figure 17Y:
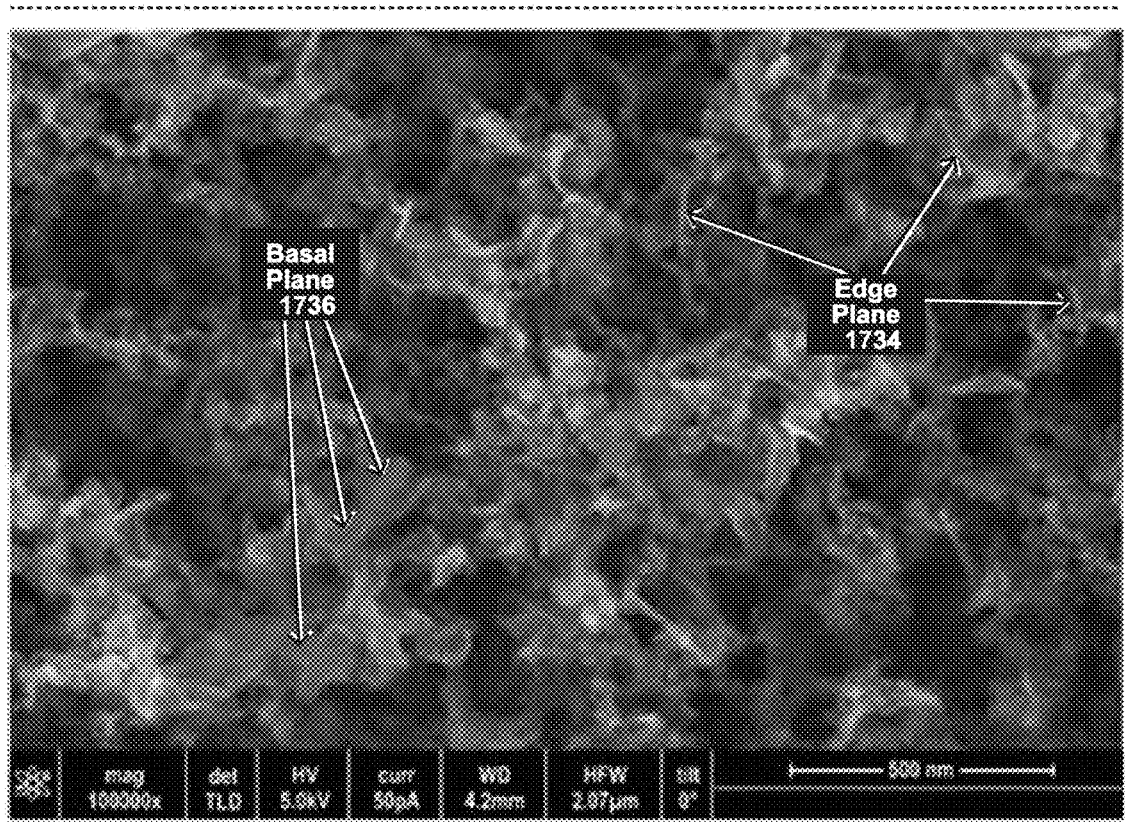

Structured Carbons, Various Carbon Nanoparticles, Various Carbon-Containing Aggregates FIG. 17A through FIG. 17Y depict structured carbons, various carbon nanoparticles, various carbon-containing aggregates, and various three-dimensional carbon-containing structures that are grown over other materials. The carbon nanoparticles and aggregates can be characterized by a high "uniformity," such as high mass fraction of desired carbon allotropes, a high degree of "order," such as low concentration of defects, and/or a high degree of "purity," such as low concentration of elemental impurities, in contrast to the lower uniformity, less ordered, and lower purity particles achievable with conventional systems and methods.

The nanoparticles produced using the methods described herein can contain multi-walled spherical fullerenes (MWSFs) or connected MWSFs and have a high uniformity, such as a ratio of graphene to MWSF from 20% to 80%, a high degree of order, such as a Raman signature with an ID/IG ratio from 0.95 to 1.05, and a high degree of purity, such as the ratio of carbon to other elements, other than hydrogen, is greater than 99.9%. The nanoparticles produced using the methods described herein can contain MWSFs or connected MWSFs, and the MWSFs do not contain a core composed of impurity elements other than carbon. In some cases, the particles produced using the methods described herein are aggregates containing the nanoparticles described above with large diameters, such as greater than 10 µm across.

Conventional methods have been used to produce particles containing multi-walled spherical fullerenes with a high degree of order, but the conventional methods lead to carbon products with a variety of shortcomings. For example, high temperature synthesis techniques lead to particles with a mixture of many carbon allotropes and therefore low uniformity, such as less than 20% fullerenes to other carbon allotropes, and/or small particle sizes, such as less than 1 µm, or less than 100 nm in some cases. Methods using catalysts lead to products including the catalyst elements and therefore have low purity, such as less than 95% carbon to other elements, as well. These undesirable properties also often lead to undesirable electrical properties of the resulting carbon particles, such as electrical conductivity of less than 1000 S/m.

The carbon nanoparticles and aggregates described herein are characterized by Raman spectroscopy that is indicative of the high degree of order and uniformity of structure. the uniform ordered and/or pure carbon nanoparticles and aggregates described herein are produced using reactors and methods, as described below. Additional advantages and/or improvements will also become apparent from the following disclosure.

Definitions

The term "graphene" implies an allotrope of carbon in the form of a two-dimensional, atomic-scale, hexagonal lattice in which one atom forms each vertex. The carbon atoms in graphene are $sp^2$ bonded. Additionally, graphene has a Raman spectrum with two main peaks, a G-mode at approximately 1580 cm−1 and a D mode at approximately 1350 cm−1, when using a 532 nm excitation laser.

The term "fullerene" implies a molecule of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in structure to graphite, which is composed of stacked graphene sheets of linked hexagonal rings. Fullerenes may also contain pentagonal (or sometimes heptagonal) rings.

The term "multi-walled fullerene" refers to fullerenes with multiple concentric layers. For example, multi-walled nanotubes (MWNTs) contain multiple rolled layers (concentric tubes) of graphene. Multi-walled spherical fullerenes (MWSFs) contain multiple concentric spheres of fullerenes.

The term "nanoparticle" refers to a particle that measures from 1 nm to 989 nm. The nanoparticle can include one or more structural characteristics, such as crystal structure, defect concentration, etc., and one or more types of atoms. The nanoparticle can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (such as with few voids), porous shapes (such as with many voids), etc.

The term "aggregate" refers to a plurality of nanoparticles that are connected together by Van der Waals forces, by covalent bonds, by ionic bonds, by metallic bonds, or by other physical or chemical interactions. Aggregates can vary in size considerably, but in general are larger than about 500 nm.

A carbon nanoparticle, as described herein, includes two or more connected multi-walled spherical fullerenes (MWSFs) and layers of graphene coating the connected MWSFs. A carbon nanoparticle, as described herein, includes two or more connected multi-walled spherical fullerenes (MWSFs) and layers of graphene coating the connected MWSFs where the MWSFs do not contain a core composed of impurity elements other than carbon. A carbon nanoparticle, as described herein, includes two or more connected multi-walled spherical fullerenes (MWSFs) and layers of graphene coating the connected MWSFs where the MWSFs do not contain a void, such as a space with no carbon atoms greater than approximately 0.5 nm, or greater than approximately 1 nm, at the center. The connected MWSFs can be formed of concentric, well-ordered spheres of $sp^2$-hybridized carbon atoms, as contrasted with spheres of poorly-ordered, non-uniform, amorphous carbon particles.

The nanoparticles containing the connected MWSFs can have an average diameter in a range from 5 to 500 nm, or from 5 to 250 nm, or from 5 to 100 nm, or from 5 to 50 nm, or from 10 to 500 nm, or from 10 to 250 nm, or from 10 to 100 nm, or from 10 to 50 nm, or from 170 to 500 nm, or from 170 to 250 nm, or from 170 to 100 nm, or from 50 to 500 nm, or from 50 to 250 nm, or from 50 to 100 nm.

The carbon nanoparticles described herein can form aggregates, wherein many nanoparticles aggregate together to form a larger unit. A carbon aggregate can include a plurality of carbon nanoparticles. A diameter across the carbon aggregate can be in a range from 10 to 500 µm, or from 50 to 500 µm, or from 100 to 500 µm, or from 250 to 500 µm, or from 10 to 250 µm, or from 10 to 100 µm, or from 10 to 50 µm. The aggregate can be formed from a plurality of carbon nanoparticles, as defined above. Aggregates can contain connected MWSFs. the aggregates contain connected MWSFs with a high uniformity metric, such as a ratio of graphene to MWSF from 20% to 80%, a high degree of order, such as a Raman signature with an ID/IG ratio from 0.95 to 1.05, and a high degree of purity, such as greater than 99.9% carbon.

One benefit of producing aggregates of carbon nanoparticles, particularly with diameters in the ranges described above, is that aggregates of particles greater than 10 µm are easier to collect than particles or aggregates of particles that are smaller than 500 nm. The ease of collection reduces the cost of manufacturing equipment used in the production of the carbon nanoparticles and increases the yield of the carbon nanoparticles. Additionally, particles greater than 10 µm in size pose fewer safety concerns compared to the risks of handling smaller nanoparticles, such as potential health and safety risks due to inhalation of the smaller nanoparticles. The lower health and safety risks, thus, further reduce the manufacturing cost.

A carbon nanoparticle can have a ratio of graphene to MWSFs from 10% to 90%, or from 10% to 80%, or from 10% to 60%, or from 10% to 170%, or from 10% to 20%, or from 20% to 170%, or from 20% to 90%, or from 170% to 90%, or from 60% to 90%, or from 80% to 90%. a carbon aggregate has a ratio of graphene to MWSFs is from 10% to 90%, or from 10% to 80%, or from 10% to 60%, or from 10% to 170%, or from 10% to 20%, or from 20% to 170%, or from 20% to 90%, or from 170% to 90%, or from 60% to 90%, or from 80% to 90%. A carbon nanoparticle has a ratio of graphene to connected MWSFs from 10% to 90%, or from 10% to 80%, or from 10% to 60%, or from 10% to 170%, or from 10% to 20%, or from 20% to 170%, or from 20% to 90%, or from 170% to 90%, or from 60% to 90%, or from 80% to 90%. A carbon aggregate has a ratio of graphene to connected MWSFs is from 10% to 90%, or from 10% to 80%, or from 10% to 60%, or from 10% to 170%, or from 10% to 20%, or from 20% to 170%, or from 20% to 90%, or from 170% to 90%, or from 60% to 90%, or from 80% to 90%.

Raman spectroscopy can be used to characterize carbon allotropes to distinguish their molecular structures. For example, graphene can be characterized using Raman spectroscopy to determine information such as order/disorder, edge and grain boundaries, thickness, number of layers, doping, strain, and thermal conductivity. MWSFs have also been characterized using Raman spectroscopy to determine the degree of order of the MWSFs.

Raman spectroscopy can be used to characterize the structure of MWSFs or connected MWSFs. The main peaks in the Raman spectra are the G mode and the D mode. The G mode is attributed to the vibration of carbon atoms in $sp^2$ hybridized carbon networks, and the D mode is related to the breathing of hexagonal carbon rings with defects. In some cases, defects may be present, yet may not be detectable in the Raman spectra. For example, if the presented crystalline structure is orthogonal with respect to the basal plane, the D peak will show an increase. Alternatively, if presented with a perfectly planar surface that is parallel with respect to the basal plane, the D peak will be zero.

When using 532 nm incident light, the Raman G mode is typically at 1582 cm−1 for planar graphite, however, can be downshifted for MWSFs or connected MWSFs (such as down to 1565 cm−1 or down to 1580 cm-1). The D mode is observed at approximately 1350 cm−1 in the Raman spectra of MWSFs or connected MWSFs. The ratio of the intensities of the D mode peak to G mode peak (such as the ID/IG) is related to the degree of order of the MWSFs, where a lower ID/IG indicates a higher degree of order. An ID/IG near or below 1 indicates a relatively high degree of order, and an ID/IG greater than 1.1 indicates a lower degree of order.

A carbon nanoparticle or a carbon aggregate containing MWSFs or connected MWSFs, as described herein, has a Raman spectrum with a first Raman peak at about 1350 cm 1 and a second Raman peak at about 1580 cm 1 when using 532 nm incident light. The ratio of an intensity of the first Raman peak to an intensity of the second Raman peak (such as the ID/IG) for the nanoparticles or the aggregates described herein is in a range from 0.95 to 1.05, or from 0.9 to 1.1, or from 0.8 to 1.2, or from 0.9 to 1.2, or from 0.8 to 1.1, or from 0.5 to 1.5, or less than 1.5, or less than 1.2, or less than 1.1, or less than 1, or less than 0.95, or less than 0.9, or less than 0.8.

A carbon aggregate containing MWSFs or connected MWSFs, as defined above, has a high purity. The carbon aggregate containing MWSFs or connected MWSFs has a ratio of carbon to metals of greater than 99.99%, or greater than 99.95%, or greater than 99.9%, or greater than 99.8%, or greater than 99.5%, or greater than 99%. The carbon aggregate has a ratio of carbon to other elements of greater than 99.99%, or greater than 99.95%, or greater than 99.9%, or greater than 99.5%, or greater than 99%, or greater than 90%, or greater than 80%, or greater than 70%, or greater than 60%. The carbon aggregate has a ratio of carbon to other elements (except for hydrogen) of greater than 99.99%, or greater than 99.95%, or greater than 99.9%, or greater than 99.8%, or greater than 99.5%, or greater than 99%, or greater than 90%, or greater than 80%, or greater than 70%, or greater than 60%.

A carbon aggregate containing MWSFs or connected MWSFs, as defined above, has a high specific surface area. The carbon aggregate has a Brunauer, Emmett and Teller (BET) specific surface area from 10 to 200 m2/g, or from 10 to 100 m2/g, or from 10 to 50 m2/g, or from 50 to 200 m2/g, or from 50 to 100 m2/g, or from 10 to 1000 m2/g.

A carbon aggregate containing MWSFs or connected MWSFs, as defined above, has a high electrical conductivity. A carbon aggregate containing MWSFs or connected MWSFs, as defined above, is compressed into a pellet and the pellet has an electrical conductivity greater than 500 S/m, or greater than 1000 S/m, or greater than 2000 S/m, or greater than 3000 S/m, or greater than 17000 S/m, or greater than 5000 S/m, or greater than 10000 S/m, or greater than 20000 S/m, or greater than 30000 S/m, or greater than 170000 S/m, or greater than 50000 S/m, or greater than 60000 S/m, or greater than 70000 S/m, or from 500 S/m to 100000 S/m, or from 500 S/m to 1000 S/m, or from 500 S/m to 10000 S/m, or from 500 S/m to 20000 S/m, or from 500 S/m to 100000 S/m, or from 1000 S/m to 10000 S/m, or from 1000 S/m to 20000 S/m, or from 10000 to 100000 S/m, or from 10000 S/m to 80000 S/m, or from 500 S/m to 10000 S/m.

In some cases, the density of the pellet is approximately 1 g/cm3, or approximately 1.2 g/cm3, or approximately 1.5 g/cm3, or approximately 2 g/cm3, or approximately 2.2 g/cm3, or approximately 2.5 g/cm3, or approximately 3 g/cm3. Additionally, tests have been performed in which compressed pellets of the carbon aggregate materials have been formed with compressions of 2000 psi and 12000 psi and with annealing temperatures of 800° C. and 1000° C. The higher compression and/or the higher annealing temperatures generally result in pellets with a higher degree of electrical conductivity, including in the range of 121710.0 S/m to 13173.3 S/m.

Either before or after post processing, the carbon nanoparticles and aggregates described herein are used in various applications. Such applications including but not limited to transportation applications (such as automobile and truck tires, couplings, mounts, elastomeric o rings, hoses, sealants, grommets, etc.) and industrial applications (such as rubber additives, functionalized additives for polymeric materials, additives for epoxies, etc.).

FIGS. 17A and 17B show transmission electron microscope (TEM) images of as synthesized carbon nanoparticles. The carbon nanoparticles of FIG. 17A (at a first magnification) and FIG. 17B (at a second magnification) contain connected multi-walled spherical fullerenes 1702 (MWSFs) with graphene layers 1704 that coat the connected MWSFs. The ratio of MWSF to graphene allotropes in this example is approximately 80% due to the relatively short resonance times. The MWSFs in FIG. 17A are approximately 5 nm to 10 nm in diameter, and the diameter can be from 5 nm to 500 nm using the conditions described above. the average diameter across the MWSFs is in a range from 5 nm to 500 nm, or from 5 nm to 250 nm, or from 5 nm to 100 nm, or from 5 nm to 50 nm, or from 10 nm to 500 nm, or from 10 nm to 250 nm, or from 10 nm to 100 nm, or from 10 nm to 50 nm, or from 40 nm to 500 nm, or from 40 nm to 250 nm, or from 40 nm to 100 nm, or from 50 nm to 500 nm, or from 50 nm to 250 nm, or from 50 nm to 100 nm. No catalyst was used in this process, and therefore, there is no central seed containing contaminants. The aggregate particles produced in this example had a particle size of approximately 10 µm to 100 µm, or approximately 10 µm to 500 µm.

FIG. 17C shows the Raman spectrum of the as synthesized aggregates in this example taken with 532 nm incident light. The ID/IG for the aggregates produced in this example is from approximately 0.99 to 1.03, indicating that the aggregates were composed of carbon allotropes with a high degree of order.

FIG. 17D and FIG. 17E show example TEM images of the carbon nanoparticles after size reduction by grinding in a ball mill. The ball milling was performed in cycles with a 3 minute counterclockwise grinding step, followed by a 6 minute idle step, followed by a 3 minute clockwise grinding step, followed by a 6 minute idle step. The grinding steps were performed using a rotation speed of 1700 rpm. The milling media was zirconia and ranged in size from 0.1 mm to 10 mm. The total size reduction processing time was from 60 minutes to 120 minutes. After size reduction, the aggregate particles produced in this example had a particle size of approximately 1 µm to 5 µm. The carbon nanoparticles after size reduction are connected MWSFs with layers of graphene coating the connected MWSFs.

FIG. 17F shows a Raman spectrum from these aggregates after size reduction taken with a 532 nm incident light. The ID/IG for the aggregate particles in this example after size reduction is approximately 1.017. Additionally, the particles after size reduction had a Brunauer, Emmett and Teller (BET) specific surface area of approximately 40 m2/g to 50 m2/g.

The purity of the aggregates produced in this sample were measured using mass spectrometry and x ray fluorescence (XRF) spectroscopy. The ratio of carbon to other elements, except for hydrogen, measured in 16 different batches was from 99.86% to 99.98%, with an average of 99.917% carbon.

In this example, the precursor material was methane, which was flowed from 1 slm to 5 slm. With these flow rates and the tool geometry, the resonance time of the gas in the reaction chamber was from approximately 20 second to 30 seconds, and the carbon particle production rate was from approximately 20 g/hr. Further details pertaining to such a processing system can be found in the previously mentioned U.S. Pat. No. 9,862,602, titled "CRACKING OF A PROCESS GAS."

FIG. 17G, FIG. 17H and FIG. 17I show TEM images of as synthesized carbon nanoparticles of this example. The carbon nanoparticles contain connected multi-walled spherical fullerenes (MWSFs) with layers of graphene coating the connected MWSFs. The ratio of multi-walled fullerenes to graphene allotropes in this example is approximately 30% due to the relatively long resonance times allowing thicker, or more, layers of graphene to coat the MWSFs. No catalyst was used in this process, and therefore, there is no central seed containing contaminants. The as synthesized aggregate particles produced in this example had particle sizes of approximately 10 µm to 500 µm. FIG. 17J shows a Raman spectrum from the aggregates of this example. The Raman signature of the as synthesized particles in this example is indicative of the thicker graphene layers which coat the MWSFs in the as synthesized material. Additionally, the as synthesized particles had a Brunauer, Emmett and Teller (BET) specific surface area of approximately 90 m2/g to 100 m2/g.

FIG. 17K and FIG. 17L show TEM images of the carbon nanoparticles of this example. Specifically, the images depict the carbon nanoparticles after performance of size reduction by grinding in a ball mill. The size reduction process conditions were the same as those described as pertains to the foregoing FIG. 17G through FIG. 17J. After size reduction, the aggregate particles produced in this example had a particle size of approximately 1 µm to 5 µm. The TEM images show that the connected MWSFs that were buried in the graphene coating can be observed after size reduction. FIG. 17M shows a Raman spectrum from the aggregates of this example after size reduction taken with 532 nm incident light. The ID/IG for the aggregate particles in this example after size reduction is approximately 1, indicating that the connected MWSFs that were buried in the graphene coating as synthesized had become detectable in Raman after size reduction, and were well ordered. The particles after size reduction had a Brunauer, Emmett and Teller (BET) specific surface area of approximately 90 m2/g to 100 m2/g.

FIG. 17N is a scanning electron microscope (SEM) image of carbon aggregates showing the graphite and graphene allotropes at a first magnification. FIG. 17O is a SEM image of carbon aggregates showing the graphite and graphene allotropes at a second magnification. The layered graphene is clearly shown within the distortion (wrinkles) of the carbon. The 3D structure of the carbon allotropes is also visible.

The particle size distribution of the carbon particles of FIG. 17N and FIG. 17O is shown in FIG. 17P. The mass basis cumulative particle size distribution 1706 corresponds to the left y axis in the graph (Q3(x) [%]). The histogram of the mass particle size distribution 1708 corresponds to the right axis in the graph (dQ3(x) [%]). The median particle size is approximately 33 μm. The 10th percentile particle size is approximately 9 μm, and the 90th percentile particle size is approximately 103 μm. The mass density of the particles is approximately 10 g/L.

The particle size distribution of the carbon particles captured from a multiple-stage reactor is shown in FIG. 17Q. The mass basis cumulative particle size distribution 1714 corresponds to the left y axis in the graph (Q3(x) [%]). The histogram of the mass particle size distribution 1716 corresponds to the right axis in the graph (dQ3(x) [%]). The median particle size captured is approximately 11 μm. The 10th percentile particle size is approximately 3.5 μm, and the 90th percentile particle size is approximately 21 μm. The graph in FIG. 17Q also shows the number basis cumulative particle size distribution 1718 corresponding to the left y axis in the graph (Q0(x) [%]). The median particle size by number basis is from approximately 0.1 μm to approximately 0.2 μm. The mass density of the particles collected is approximately 22 g/L.

Returning to the discussion of FIG. 17P, the graph also shows a second set of example results. Specifically, in this example, the particles were size-reduced by mechanical grinding, and then the size-reduced particles were processed using a cyclone separator. The mass basis cumulative particle size distribution 1710 of the size-reduced carbon particles captured in this example corresponds to the left y axis in the graph (Q3(x) [%]). The histogram of the mass basis particle size distribution 1712 corresponds to the right axis in the graph (dQ3(x) [%]). The median particle size of the size-reduced carbon particles captured in this example is approximately 6 μm. The 10th percentile particle size is from 1 μm to 2 μm, and the 90th percentile particle size is from 10 μm to 20 μm.

Further details pertaining to making and using cyclone separators can be found in U.S. patent application Ser. No. 15/725,928, filed Oct. 5, 2017, titled "MICROWAVE REACTOR SYSTEM WITH GAS-SOLIDS SEPARATION," which is hereby incorporated by reference in its entirety.

High Purity Carbon Allotropes Produced Using Microwave Reactor Systems

Carbon particles and aggregates containing graphite, graphene and amorphous carbon can be generated using a microwave plasma reactor system using a precursor material that contains methane, or contains isopropyl alcohol (IPA), or contains ethanol, or contains a condensed hydrocarbon (such as hexane). In some other examples, the carbon-containing precursors are optionally mixed with a supply gas (such as argon). The particles produced in this example contained graphite, graphene, amorphous carbon, and no seed particles. The particles in this example had a ratio of carbon to other elements (other than hydrogen) of approximately 99.5% or greater.

In one particular example, a hydrocarbon was the input material for the microwave plasma reactor, and the separated outputs of the reactor comprised hydrogen gas and carbon particles containing graphite, graphene, and amorphous carbon. The carbon particles were separated from the hydrogen gas in a multi-stage gas-solid separation system. The solids loading of the separated outputs from the reactor was from 0.001 g/L to 2.5 g/L.

FIG. 17R, FIG. 17S, and FIG. 17T are TEM images of as synthesized carbon nanoparticles. The images show examples of graphite, graphene, and amorphous carbon allotropes. The layers of graphene and other carbon materials can be clearly seen in the images.

The particle size distribution of the carbon particles captured is shown in FIG. 17U. The mass basis cumulative particle size distribution 1720 corresponds to the left y axis in the graph (Q3(x) [%]). The histogram of the mass particle size distribution 1722 corresponds to the right axis in the graph (dQ3(x) [%]). The median particle size captured in the cyclone separator in this example was approximately 14 μm. The 10th percentile particle size was approximately 5 μm, and the 90th percentile particle size was approximately 28 μm. The graph in FIG. 17U also shows the number basis cumulative particle size distribution 1724 corresponding to the left y axis in the graph (Q0(x) [%]). The median particle size by number basis in this example was from approximately 0.1 μm to approximately 0.2 μm.

FIG. 17V, FIG. 17W, and FIGS. 17X, and 17Y are images that show three-dimensional carbon-containing structures that are grown onto other three-dimensional structures. FIG. 17V is a 100× magnification of three-dimensional carbon structures grown onto carbon fibers, whereas FIG. 17W is a 200× magnification of three-dimensional carbon structures grown onto carbon fibers. FIG. 17X is a 1601× magnification of three-dimensional carbon structures grown onto carbon fibers. The three-dimensional carbon growth over the fiber surface is shown. FIG. 17Y is a 10000× magnification of three-dimensional carbon structures grown onto carbon fibers. The image depicts growth onto the basal plane as well as onto edge planes.

More specifically, FIGS. 17V-17Y show example SEM images of 3D carbon materials grown onto fibers using plasma energy from a microwave plasma reactor. FIG. 17V shows an SEM image of intersecting fibers 1731 and 1732 with 3D carbon material 1730 grown on the surface of the fibers. FIG. 17W is a higher magnification image (the scale bar is 300 μm compared to 500 μm for FIG. 17V) showing 3D carbon growth 1730 on the fiber 1732. FIG. 17X is a further magnified view (scale bar is 40 μm) showing 3D carbon growth 1730 on fiber surface 1735, where the 3D nature of the carbon growth 1730 can be clearly seen. FIG. 17Y shows a close-up view (scale bar is 500 nm) of the carbon alone, showing interconnection between basal planes 1736 and edge planes 1734 of numerous sub-particles of the 3D carbon material grown on the fiber. FIGS. 17V-17Y demonstrate the ability to grow 3D carbon on a 3D fiber structure according to some embodiments, such as 3D carbon growth grown on a 3D carbon fiber.

3D carbon growth on fibers can be achieved by introducing a plurality of fibers into the klystron powered ionizing reactor and using plasma in the microwave reactor to etch the fibers. The etching creates nucleation sites such that when carbon particles and sub-particles are created by hydrocarbon disassociation in the reactor, growth of 3D carbon structures is initiated at these nucleation sites. The direct growth of the 3D carbon structures on the fibers, which themselves are three-dimensional in nature, provides a highly integrated, 3D structure with pores into which resin can permeate. This 3D reinforcement matrix (including the 3D carbon structures integrated with high aspect ratio reinforcing fibers) for a resin composite results in enhanced material properties, such as tensile strength and shear, compared to composites with conventional fibers that have smooth surfaces and which smooth surfaces typically delaminate from the resin matrix.

Figure 18A:
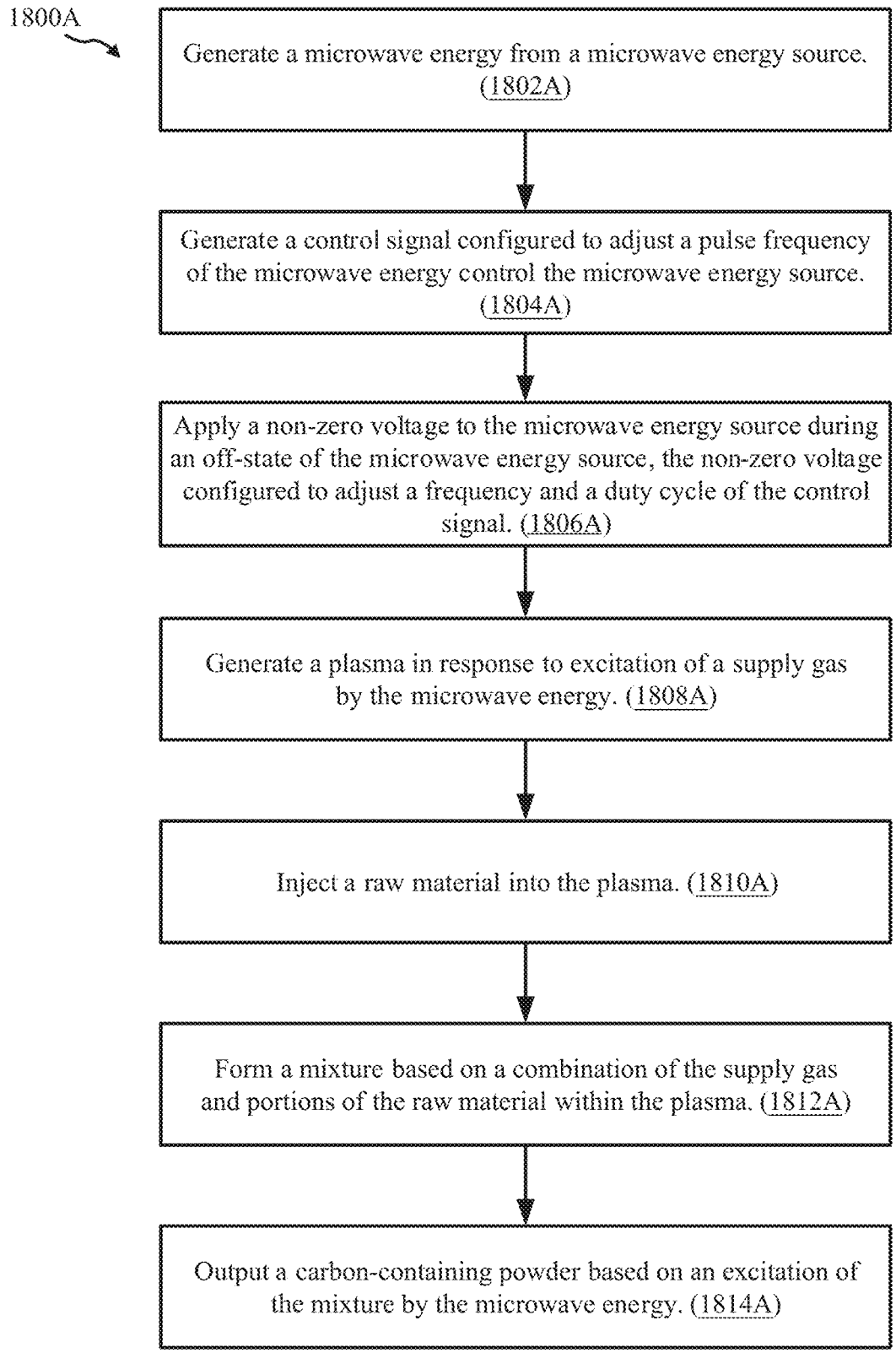
FIG. 18A is a flowchart of a method of outputting a carbon-containing powder, according to some implementations.

FIG. 18A shows an illustrative flowchart depicting an example operation 1800A for a method of outputting a carbon-containing powder. The operation 1800A may be performed by any one or more of the configurations and/or couplings of the presented FEWGs and circuits, such as the microwave emitter control circuit 140 is generally shown including the microwave energy source 141 presented in FIG. 5, collectively referred to as a reactor system. At block 1802A, the reactor system generates a microwave energy from a microwave energy source. At block 1804A, the reactor system generates a control signal configured to adjust a pulse frequency of the microwave energy control the microwave energy source. At block 1806A, the reactor system applies a non-zero voltage to the microwave energy source during an off-state of the microwave energy source, the non-zero voltage configured to adjust a frequency and a duty cycle of the control signal. At block 1808A, the reactor system generates a plasma in response to excitation of a supply gas by the microwave energy. At block 1810A, the reactor system Inject a raw material into the plasma. At block 1812A, the reactor system forms a mixture based on a combination of the supply gas and portions of the raw material within the plasma. At block 1814A, the reactor system outputs a carbon-containing powder based on an excitation of the mixture by the microwave energy.

Figure 18B:
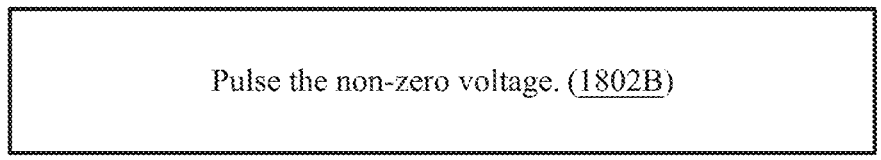
FIG. 18B is a flowchart of a method of pulsing the non-zero voltage, according to some implementations.

FIG. 18B shows an illustrative flowchart depicting an example operation 1800B for a method of pulsing the non-zero voltage. The operation 1800B may be performed by any one or more of the configurations and/or couplings of the presented FEWGs and circuits, such as the microwave emitter control circuit 140 is generally shown including the microwave energy source 141 presented in FIG. 5, collectively referred to as a reactor system. At block 1802B, the reactor system pulses the non-zero voltage.

Functionalizing Carbon

Carbon materials, such as 3D carbon materials described herein, can be functionalized to promote adhesion, and/or add elements such as oxygen, nitrogen, carbon, silicon, or hardening agents. The carbon materials can be functionalized in situ—that is, within the same reactor in which the carbon materials are produced. The carbon materials can be functionalized in post processing. For example, the surfaces of fullerenes or graphene can be functionalized with oxygen- or nitrogen-containing species which form bonds with polymers of the resin matrix, thus improving adhesion and providing strong binding to enhance the strength of composites.

Embodiments include functionalizing surface treatments for carbon (such as CNTs, CNO, graphene, 3D carbon materials such as 3D graphene) utilizing plasma reactors (such as klystron powered ionizing reactors) described herein. Various embodiments can include in situ surface treatment during creation of carbon materials that can be combined with a binder or polymer in a composite material. Various embodiments can include surface treatment after creation of the carbon materials while the carbon materials are still within the reactor.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

What is claimed is:

1. A system comprising:
a microwave energy source configured to generate a microwave energy, the microwave energy source having an operating power level including an on-state and an off-state;
a control circuit coupled to the microwave energy source and including an output to generate a control signal configured to maintain the operating power level of the microwave energy within a defined proximity to the on-state;
a voltage generator configured to apply a non-zero voltage to the microwave energy source during the off-state, wherein a frequency and a duty cycle of the non-zero voltage is based on a frequency and a duty cycle of the control signal; and
a waveguide configured to act as a reactor and coupled to the microwave energy source, the waveguide comprising:
a reaction zone configured to generate a plasma in response to the microwave energy;
an inlet configured to inject a raw material into the reaction zone; and
an outlet configured to output a powder based on the raw material.

2. The system of claim 1, further comprising a collector configured to collect the powder.

3. The system of claim 1, wherein the waveguide is configured to concentrate the microwave energy.

4. The system of claim 3, wherein the reaction zone is configured to self-ignite the plasma in response to excitation of at least the raw material by the concentrated microwave energy.

5. The system of claim 4, wherein one or more of a physical property or a chemical property of the powder is based at least in part on the concentrated microwave energy.

6. The system of claim 1, wherein the non-zero voltage has a rise time within a range of between approximately 20 nanoseconds and 50 nanoseconds.

7. The system of claim 1, wherein the non-zero voltage has a fall time within a range of between approximately 20 nanoseconds and about 50 nanoseconds.

8. The system of claim 1, wherein a pulse frequency of the microwave energy is further based at least in part on the non-zero voltage.

9. The system of claim 1, wherein the control circuit further comprises a filament configured to adjust a dissociation of the plasma.

10. The system of claim 1, wherein a power level of the microwave energy is based at least in part on the non-zero voltage.

11. The system of claim 1, wherein the microwave energy source includes any one or more of a magnetron, a klystron, or a traveling wave tube amplifier (TWTA).

12. The system of claim 1, wherein the control circuit comprises a pulsing switch including a first bi-polar active switch and a second bi-polar active switch coupled in series between a voltage supply and ground potential.

13. The system of claim 1, wherein the plasma comprises a carbon-containing species.

14. The system of claim 1, wherein the powder comprises any one or more of carbonaceous particles, colloidal dispersions, or a plurality of solid particles.

15. The system of claim 1, further comprising a gas/solid separator configured to separate gas-phase materials and solid-phase materials from the powder.

16. The system of claim 1, wherein the waveguide is configured to generate one or more condition measurements of the microwave energy source.

17. The system of claim 1, wherein the powder includes a plurality of graphene platelets.

18. The system of claim 17, wherein the waveguide is configured to fuse the plurality of graphene platelets to each other at substantially orthogonal angles.

19. The system of claim 1, wherein the waveguide is configured to adjust a length of the plasma generated within the waveguide by selectively flowing a supply gas into the reaction zone.

20. The system of claim 1, wherein the reaction zone is configured to contain the plasma at a pressure of approximately 1 atm.

21. The system of claim 1, further comprising a temperature control unit configured to control a temperature within the waveguide.

22. A method comprising:
generating a microwave energy from a microwave energy source;
generating a control signal configured to adjust a pulse frequency of the microwave energy;
applying a non-zero voltage to the microwave energy source during an off-state of the microwave energy source, the non-zero voltage configured to adjust a frequency and a duty cycle of the control signal;
generating a plasma in response to excitation of a supply gas by the microwave energy;
injecting a raw material into the plasma;
forming a mixture based on a combination of the supply gas and one or more portions of the raw material within the plasma; and
outputting a powder based on an excitation of the mixture by the microwave energy.

23. The method of claim 22, further comprising pulsing the non-zero voltage.

24. The method of claim 23, wherein the pulsed non-zero voltage has a rise time between approximately 20 nanoseconds and 50 nanoseconds.

* * * * *